United States Patent [19]
Ozaki et al.

[11] Patent Number: 5,331,275
[45] Date of Patent: Jul. 19, 1994

[54] PROBING DEVICE AND SYSTEM FOR TESTING AN INTEGRATED CIRCUIT

[75] Inventors: Kazuyuki Ozaki; Shinichi Wakana; Yoshiro Goto; Akio Ito; Kazuo Okubo; Soichi Hama; Akira Fujii; Yoko Sato, all of Kawasaki, Japan

[73] Assignee: Fujitsu Limited, Kanagawa, Japan

[21] Appl. No.: 987,959

[22] Filed: Dec. 9, 1992

[30] Foreign Application Priority Data

Dec. 9, 1991 [JP] Japan .................. 3-324696
Sep. 18, 1992 [JP] Japan .................. 4-250261
Dec. 7, 1992 [JP] Japan .................. 4-327011

[51] Int. Cl.$^5$ .................. G01R 1/073; G01R 31/02
[52] U.S. Cl. .................. 324/757; 324/96; 324/762
[58] Field of Search .......... 324/158 P, 158 F, 72.5, 324/96, 158 R

[56] References Cited

U.S. PATENT DOCUMENTS

| | | | |
|---|---|---|---|
| 4,219,771 | 8/1980 | Reid et al. | 324/158 P |
| 4,603,293 | 7/1986 | Mourou et al. | 324/96 |
| 4,749,942 | 7/1988 | Sang et al. | 324/158 P |
| 4,875,006 | 10/1989 | Henley et al. | 324/96 |
| 4,888,550 | 12/1989 | Reid | 324/158 P |
| 4,891,580 | 1/1990 | Valdmanis | 324/96 |

Primary Examiner—Ernest F. Karlsen
Attorney, Agent, or Firm—Nikaido, Marmelstein, Murray & Oram

[57] ABSTRACT

A probing device includes a minute probe in which at least an end portion is formed by conductive material, a cantilever having one end to which the probe is attached, and another end fixed to a moving member movable relatively to a sample in each direction of X, Y and Z, a unit for moving the moving member relatively to the sample, a transducing unit for generating information of voltage or current by means of light, a connecting unit having a low electric resistance, for connecting the transducing unit and the end portion of the probe, a detecting unit for detecting a change in a physical amount occurring in the cantilever by a force caused between the probe and the sample by a relative proximity of the moving member to the sample, and a voltage measuring unit for measuring a voltage at a measurement point on the sample, which is determined based on an output of the detecting unit, by way of the transducing unit when the probe is contacted with the measurement point. By the constitution, it is possible to realize a voltage measurement with both an enhanced space resolution and an enhanced time resolution. Also, by using the probing device in an integrated circuit testing apparatus or system, it is possible to realize a stable probing to a minute wiring without increasing an electrical load with respect to the minute wiring and thus contribute to an improvement in the precision of a voltage measurement.

51 Claims, 79 Drawing Sheets

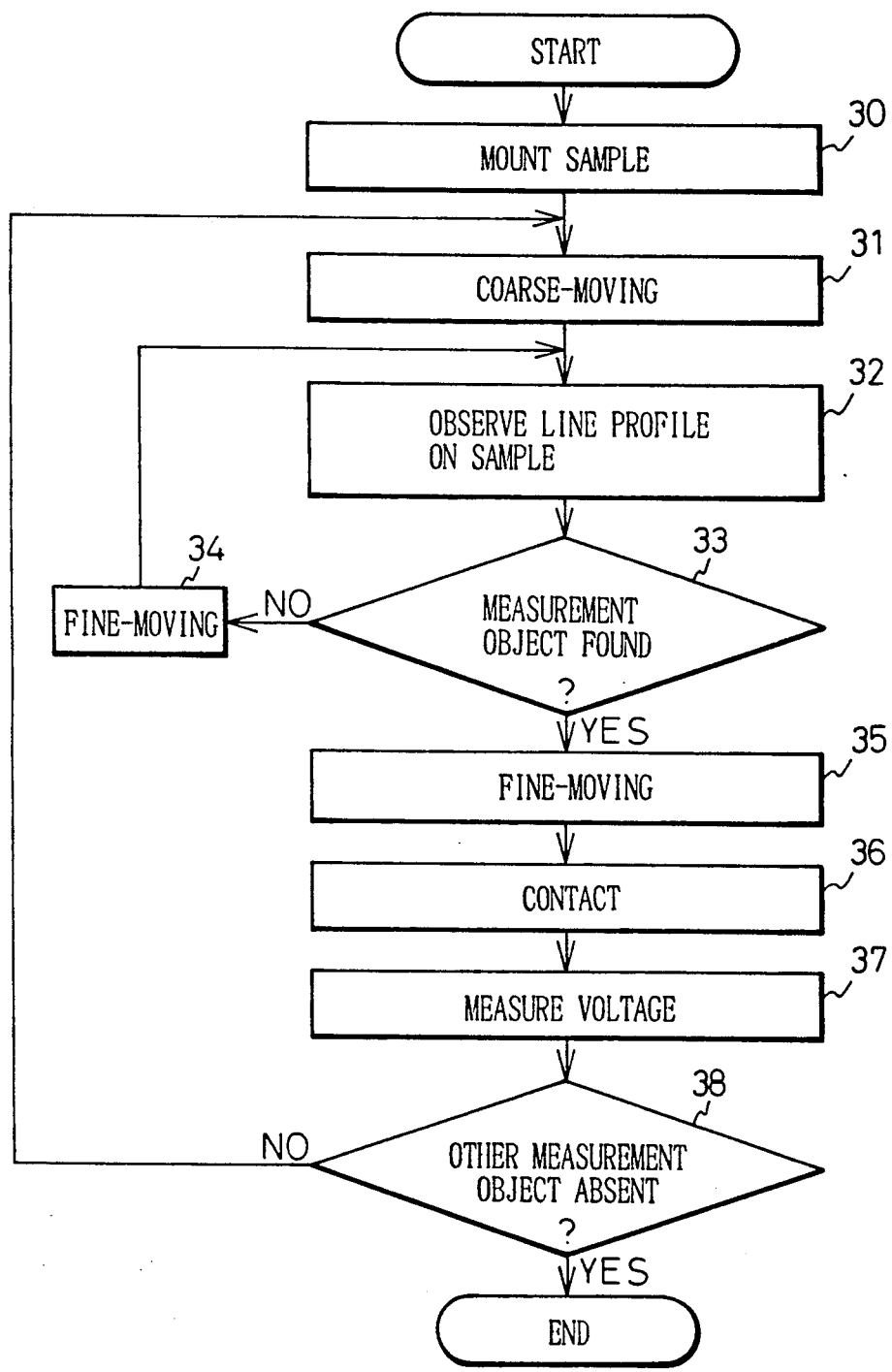

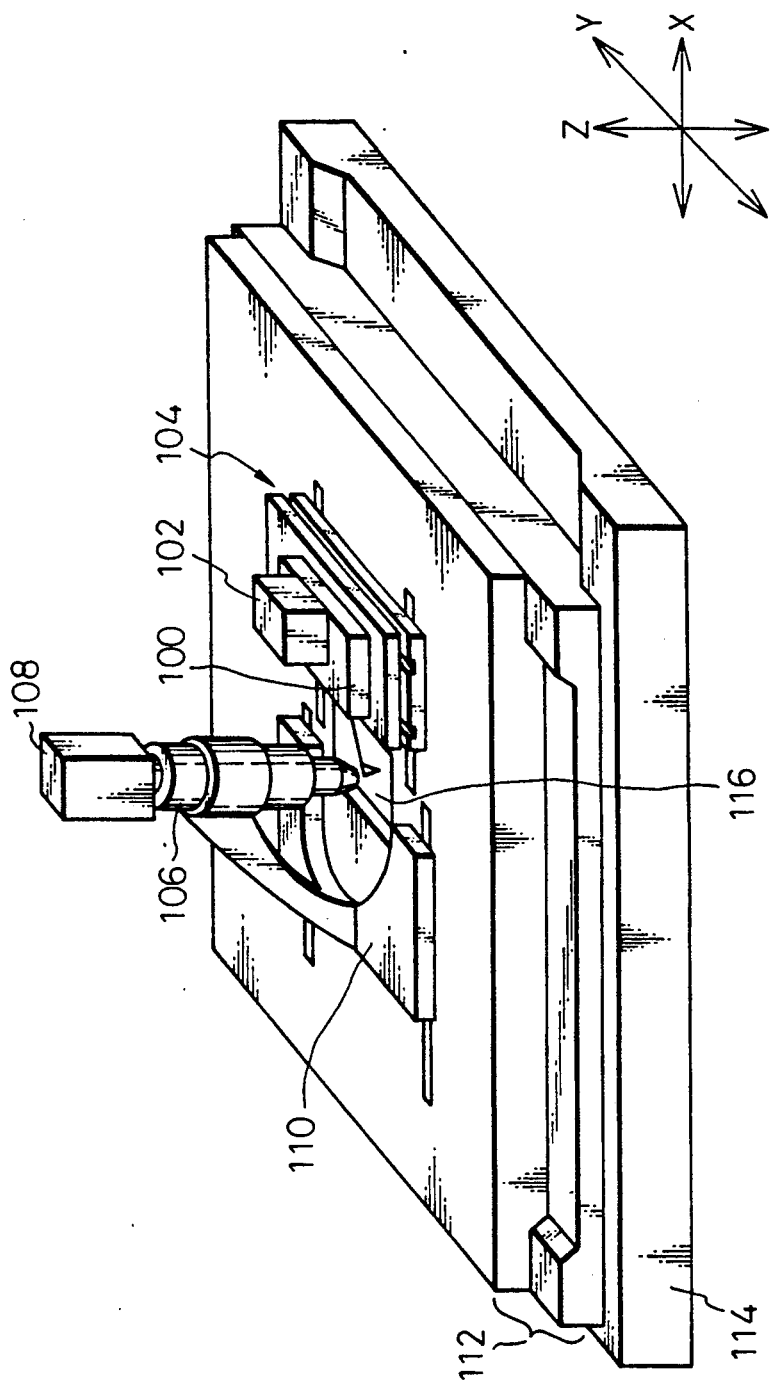

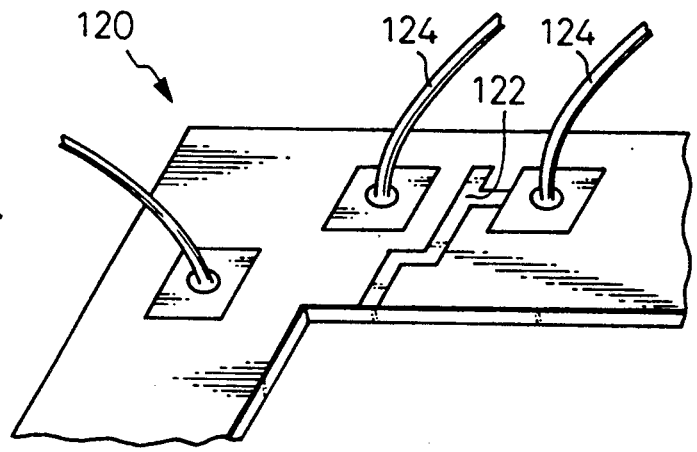
Fig.20a
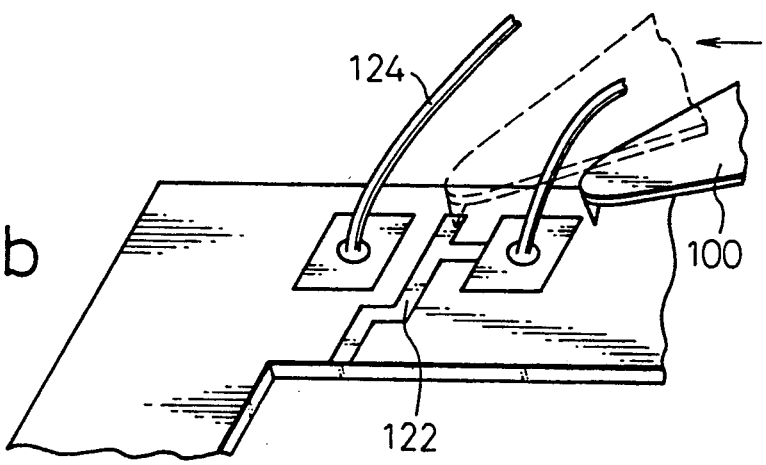
Fig.20b
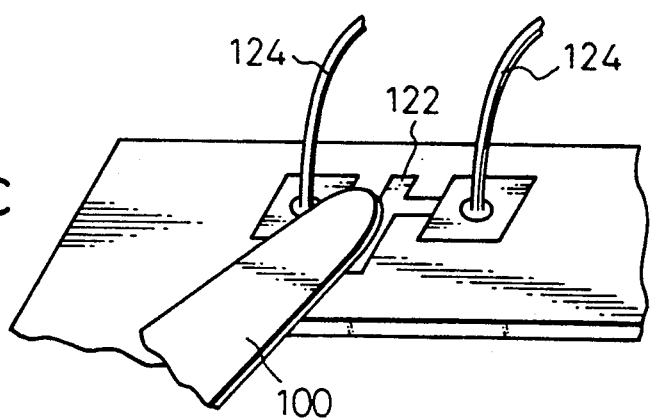
Fig.20.c

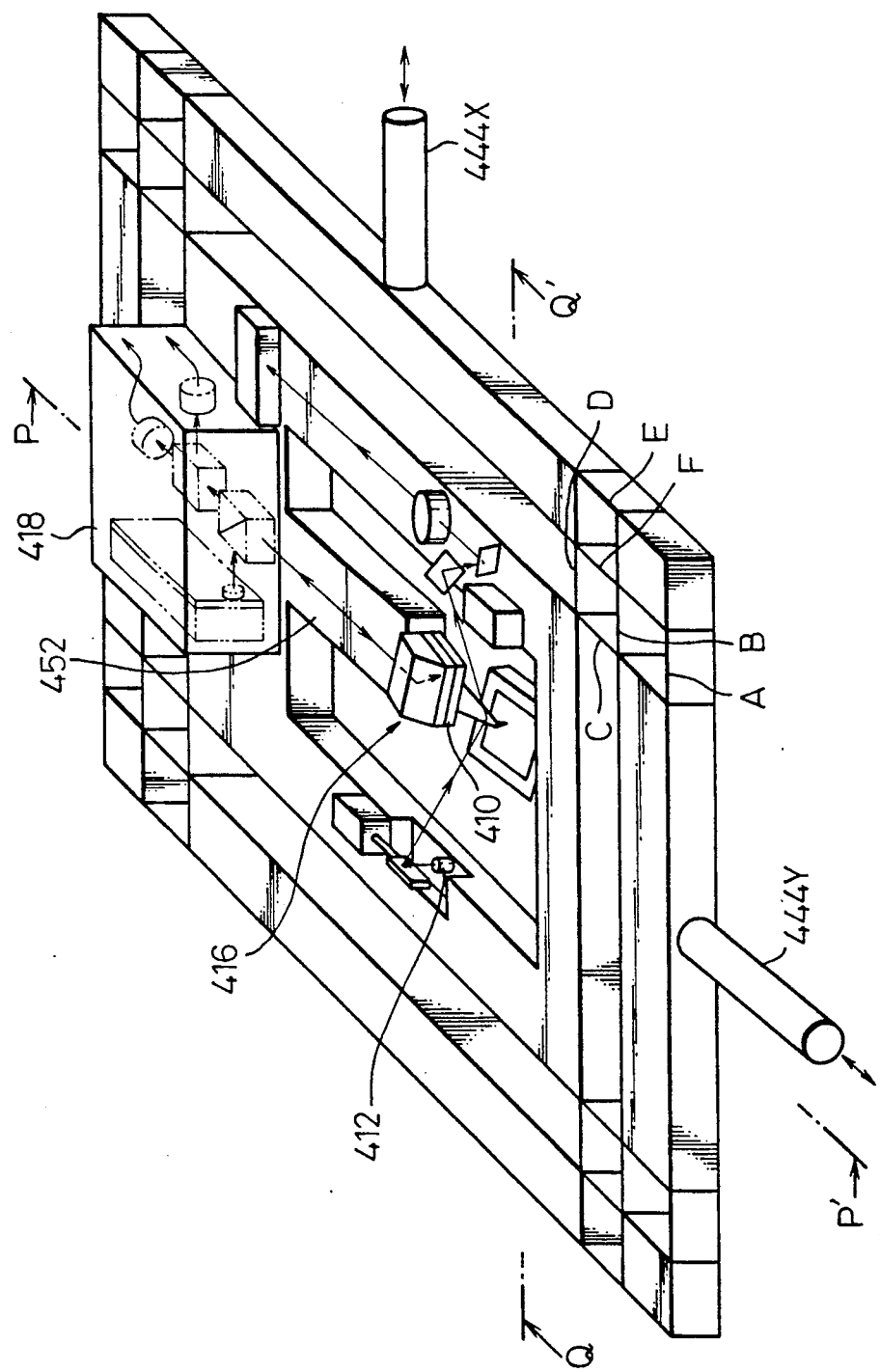

SIGNAL AT ①

SIGNAL AT ②

SIGNAL AT ③

V. M. POS.

AFM IMAGE

HARDNESS IMAGE

V. AMPLITUDE IMAGE

PROBING DEVICE AND SYSTEM FOR TESTING AN INTEGRATED CIRCUIT

BACKGROUND OF THE INVENTION

1. Field of the Invention

The present invention relates to a technique of testing an electric circuit in its operating state. More particularly, it relates to a constitution of an apparatus or system which uses a novel probe suitable for effecting diagnosis and analysis of the operation of an integrated circuit such as an LSI including minute wirings and effects a voltage measurement to thereby be adapted for testing the integrated circuit.

In development and manufacture of semiconductor integrated circuits (LSIs), it is essential to test a semiconductor element and, where a malfunction of the element is found, check the cause (i.e., effect a fault analysis). With a recent high degree of integration of LSIs and a multiplication of input/output (I/O) pins, however, it has been difficult to effect an exact design verification and a fault analysis only by measuring signals at the I/O pins by means of an LSI tester or the like. Accordingly, it becomes necessary to effect a voltage measurement of a minute wiring in the LSI, an internal diagnosis and an analysis such as a measurement of operational waveforms. For example, there is known a method of contacting a probe having a pointed end portion directly to a measurement point, amplifying a signal detected by the probe and measuring the signal by means of an oscilloscope or the like. The method is simple and a basic approach. However, it is very difficult to measure a voltage at a much minuter internal wiring or internal electrode than the size of the probe. Also, the precision of measurement is not sufficient and there is a possibility of a secondary trouble such as a short circuit between wirings. Thus, the approach possesses a limitation in itself. In view of this, it is demanded to develop a novel measurement method or approach.

2. Description of the Related Art

As an apparatus suitable for a wiring voltage measurement of a minute pattern, there is known an apparatus using an electron beam or a light beam.

In an apparatus using an electron beam, the wiring voltage measurement is carried out by applying the electron beam to a minute wiring (measurement point) in a semiconductor integrated circuit and detecting the amount of secondary electrons emitted from the measurement point. Namely, the measurement using an electron beam utilizes the fact that the amount of secondary electrons to be detected correlates with the voltage at the measurement point.

On the other hand, as an apparatus using a light beam, for example, an apparatus utilizing an electro-optic effect is known. In the apparatus, the wiring voltage measurement is carried out by applying the light beam to a certain crystal arranged near the measurement point and detecting the amount of polarization of a light beam transmitted through or reflected from the crystal. Namely, the measurement using a light beam utilizes the fact that, when an external electric field (i.e., wiring voltage) is applied to a crystal, the refractive index of the crystal is changed. The principle of the electro-optic effect is disclosed, for example, in the publication: Valdmanis J. A., Electron. Lett. 23, 1308–1310, 1987. In this connection, the measurement of a change of a short time (e.g., below 1 [ns]) in voltage is carried out by means of a so-called sampling method which effects a voltage measurement by a pulsed beam, not a continuous beam.

Also, as another apparatus using a light beam, an apparatus utilizing a photoconductive gate is known. A photoconductive gate has characteristics in which the conductive index is very small (gate OFF state) when light is not applied thereto, and in which the conductive index is increased for a short time (gate ON state) when light is applied thereto. Therefore, it is possible to measure a voltage applied to the gate, i.e., wiring voltage by detecting a current in the photoconductive gate by means of the above characteristics.

According to the above apparatus using an electron beam, it becomes necessary to make the cross section of the electron beam small in accordance with the size of a minute measurement point. In this case, since the number of electrons contained in the beam is decreased and accordingly the number of secondary electrons is also decreased, a problem occurs in that the signal to noise (S/N) ratio is deteriorated. To cope with this, it is effective to increase the number of shots of a pulsed electron beam on a measurement point. In this case, however, another problem occurs in that time required for the measurement is prolonged. Also, the like problem is posed where a time width of an electron beam pulse is shortened for the purpose of an improvement in "time resolution" of the measurement. In this connection, considering the transit time effect of second electrons (fluctuation of the measurement timing occurring due to a slow transit speed of second electrons), an upper limit of the time resolution is approximately 5 [ps] at present and thus the realization of a higher time resolution than that value is very difficult in principle.

On the other hand, according to the apparatus using a light beam utilizing an electro-optic effect, a very high time resolution exceeding 0.5 [ps] is realized and a voltage resolution corresponding to the S/N ratio is also excellent compared with the above apparatus using an electron beam. However, since the space. resolution is determined depending on the wavelength of light, a problem occurs in that it is very difficult to measure a wiring voltage of a very minute pattern. In this connection, although it is at present possible to effect a voltage measurement with respect to a minute pattern of approximately 1 μm or more, it is very difficult to effect a voltage measurement with respect to a minuter pattern than that value. Namely, the apparatus using an electron beam is excellent in respect of "space resolution" although it is insufficient in respect of "measurement time" and "time resolution", while the apparatus using a light beam is excellent in respect of "measurement time" and "time resolution" although it is insufficient in respect of "space resolution". Namely, both types have advantages and defects contrary to each other.

Also, according to the apparatus using a light beam utilizing a photoconductive gate, it is possible to obtain a voltage measurement sensitivity ten times or more compared with the apparatus using an electro-optic effect. However, a few problems are posed. For example, where a photoconductive gate is formed by applying a radiation damage to an SOS (Silicon on Sapphier), there is a disadvantage in that the photoconductive gate must be formed in advance on a LSI chip under test. Although there is a case that a photoconductive gate need not be formed in advance on a LSI chip under test, in this case, a problem occurs in that it is impossible to effect a probing to a minute wiring because the size of an electrode pad to be electrically contacted is relatively large. Also, even if the size of the contact electrode can be made small, it is very difficult to effect a precise probing to the contact electrode with respect to a minute wiring of submicron width.

SUMMARY OF THE INVENTION

An object of the present invention is to provide a probing device which can realize a voltage measurement with both an enhanced space resolution and an enhanced time resolution.

Another object of the present invention is to provide an LSI testing apparatus or system which can realize a stable probing to a minute wiring without increasing an electrical load with respect to the minute wiring and thus contribute to an improvement in the precision of a voltage measurement.

A still another object of the present invention is to provide various improvements of the apparatus or system suitable for effecting diagnosis and analysis of the operation of an integrated circuit such as an LSI including minute wirings.

According to a fundamental aspect of the present invention, there is provided a probing device including: a minute probe in which at least an end portion is formed by conductive material; a cantilever having one end to which the probe is attached, and another end fixed to a moving member movable relatively to a sample in each direction of X, Y and Z; means for moving the moving member relatively to the sample; a transducing means for generating information of voltage or current by means of light; a connecting means having a low electric resistance, for connecting the transducing means and the end portion of the probe; a detecting means for detecting a change in a physical amount occurring in the cantilever by a force caused between the probe and the sample by a relative proximity of the moving member to the sample; and a voltage measuring means for measuring a voltage at a measurement point on the sample, which is determined based on an output of the detecting means, by way of the transducing means when the probe is contacted with the measurement point.

In a preferable aspect of the present invention, the transducing means comprises a crystal capable of inducing an electro-optic effect, and the voltage measuring means utilizes the electro-optic effect induced in the crystal when the probe is contacted with the measurement point on the sample, to thereby measure a voltage at the measurement point.

In another preferable aspect of the present invention, the transducing means comprises a photoconductor film constituting a photoconductive gate portion, a first conductor contacted with a portion of the photoconductor film and connected to the end portion of the probe, and a second conductor contacted with a portion of the photoconductor film, and the voltage measuring means measures a voltage at the measurement point on the sample based on a current led to the second conductor by an electric conduction of the photoconductive gate portion using a light when the probe is contacted with the measurement point.

Also, according to another aspect of the present invention, there are provided various forms of an apparatus or system suitable for effecting diagnosis and analysis of an operation of an integrated circuit such as an LSI including minute wirings.

BRIEF DESCRIPTION OF THE DRAWINGS

Other objects and features of the present invention will be described hereinafter in detail by way of preferred embodiments with reference to the accompanying drawings, in which:

FIG. 6 is a flowchart representing a voltage measurement processing executed by the system of FIG. 2;

FIG. 19 is a perspective view showing a constitution of an embodiment of the LSI testing apparatus according to the present invention;

FIGS. 20a to 20c are views illustrating the manner of probing to the wirings near the bonding wires, carried out by the apparatus of FIG. 19;

FIG. 49 is a perspective view schematically showing a constitution of the fine-moving stage and the mountings thereof;

DESCRIPTION OF THE PREFERRED EMBODIMENTS

Throughout the description, identical references used in connection with the drawings indicate like constituent elements and thus the repetition of explanation thereof is omitted.

Figure 1:
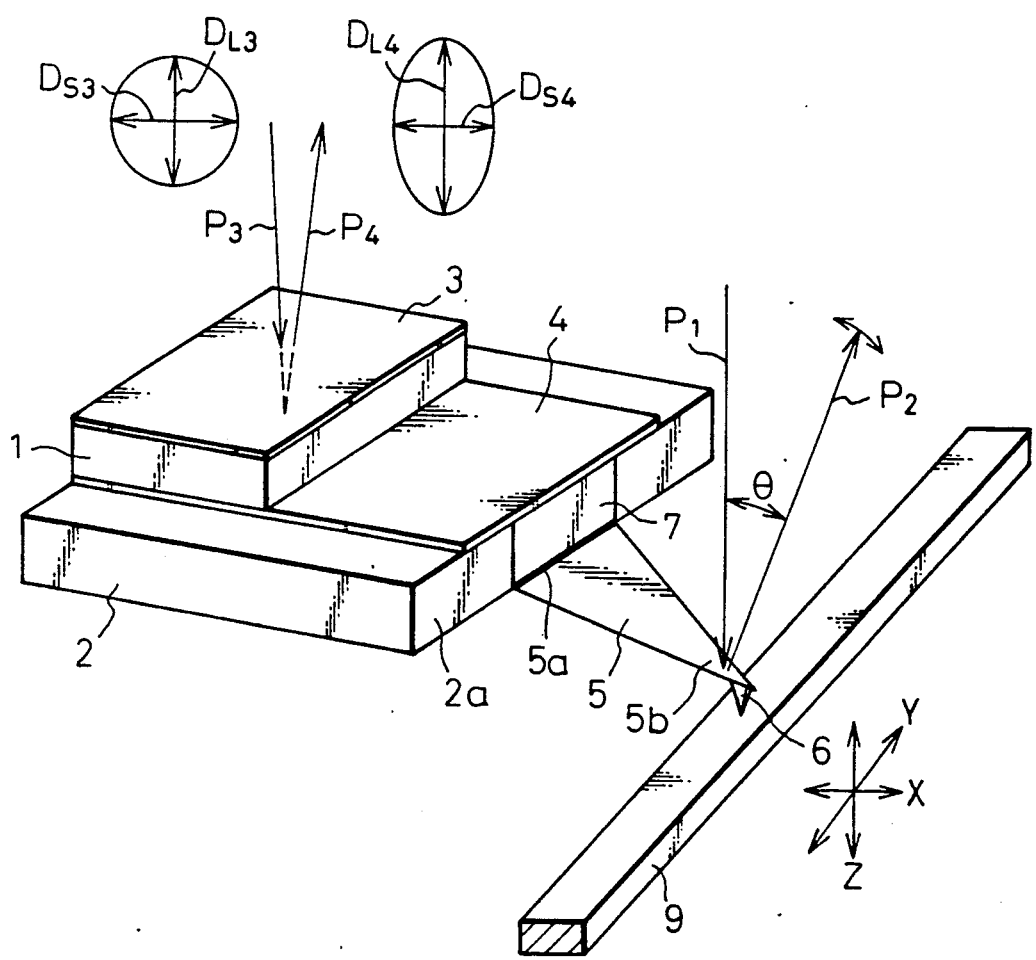
FIG. 1 is a perspective view showing a constitution of an embodiment of the probing device according to the present invention.

FIG. 1 shows a constitution of an embodiment of the probing device according to the present invention.

In the illustration, reference 1 denotes a crystal as a predetermined crystal capable of inducing an electro-optic effect, e.g., BSO ($Bi_{12}SiO_{20}$) crystal, and reference 2 denotes a transparent probe substrate. The BSO crystal 1 has a transparent electrode (first electrode 3) such as ITO $In_2O_3$—$SnO_2$) electrode or the like provided on the top surface thereof, and a metal electrode (second electrode 4) for reflecting light provided on the bottom surface thereof. The second electrode 4 is provided on one surface of the probe substrate 2.

Reference 5 denotes a cantilever of which a base end 5a is fixed to one end surface 2a of the probe substrate 2. Reference 6 denotes a minute probe which is attached to a free end 5b of the cantilever 5. The cantilever 5 is formed by a very flexible and light mass material (e.g., silicon nitride with a spring constant of approximately 1 to 10 N/m and a mass of approximately $10^{-7}$ to $10^{-11}$N), and one surface thereof is made in the form of a mirror. Also, the height of the probe 6 is approximately 3 $\mu$m, the length of the cantilever 5 is approximately 0.2 mm, and the size of the probe substrate 2 is approximately 1 mm×2 mm.

Note, the cantilever 5 and the probe 6 are formed by the like constituent elements as those contained in a known scanning type probe microscope, e.g., atomic force microscope (AFM). However, the present device is different from such an AFM in the following three points: ① at least an end portion of the probe 6 is coated by conductive material such as a metal film; ② one surface of the cantilever 5 is coated by conductive material such as a metal film of gold (Au) or the like; and ③ the end portion of the probe 6 and the cantilever 5 are electrically connected to each other. The above AFM can be referred to, for example, in the publication: G. Binnig, C. F. Quate, C. Gerber; Phys. Rev. Lett. 56, 930, 1986.

The base end 5a of the cantilever 5 and the second electrode 4 are electrically connected by a wiring 7. The electrode 4 together with the wiring 7 and the cantilever 5 constitute the connecting means which has a low electric resistance and connects the BSO crystal 1 to the end portion of the probe 6.

In the above constitution, when the probe 6 attached to the tip of the cantilever 5 is brought close to a minute wiring 9 consisting of metal material, a so-called interatomic force is exerted between atoms constituting the minute wiring 9 and atoms constituting the probe 6 and thus the cantilever 5 is deformed with an amount of deflection corresponding to the magnitude of the working force. For example, when the probe 6 is brought with the order of nanometers close to the surface of the minute wiring 9, a repulsive force acts on the probe 6 and thus the cantilever 5 is slightly deflected to the direction remote from the minute wiring 9.

The amount of deflection of the cantilever 5 can be detected by applying a laser beam $P_1$ onto one surface (in the illustration, surface on the opposite side to the probe 6) of the cantilever 5 and measuring the reflection angle ($\theta/2$ with respect to the direction of the normal) of a reflected laser beam $P_2$.

Therefore, by variously changing the relationship of relative positions between the probe 6 and the minute wiring 9 (i.e., scanning) and plotting a change in the reflection angle relative to the horizontal position of the probe 6, it is possible to measure the height (H), width (W) and length (L) of the minute wiring 9 and thus observe the three-dimensional spatial shape in each direction of X, Y and Z. Also, the three-dimensional shape of the surface of the sample (9) can be observed by regulating the height of the moving member (probe substrate 2) relative to the minute wiring (sample) 9, scanning the probe 6 with respect to the minute wiring 9 and plotting the height of the moving member 2 with respect to the horizontal position of the probe 6.

Furthermore, it is possible to determine a "space resolution" with a very minute order corresponding to the size of an atom and thus obtain a much higher space resolution than that in a prior art apparatus utilizing a light beam. Note, in principle, a conventional AFM can realize a space resolution of the order of an atom. Considering that a recent wiring width of wiring patterns is in the order of submicron, however, it is possible to attain a satisfactory measurement precision even by a resolution of approximately several nanometers as in the present embodiment.

Where a voltage of the minute wiring 9 is measured after the detection of the position of the wiring 9, the probe 6 is first positioned just above the measurement point on the wiring 9 and then the probe substrate 2 together with the BSO crystal 1 is moved downwards (or inversely, the sample 9 is moved upwards) to thereby contact the probe 6 with the wiring 9.

The voltage of the measurement point on the minute wiring 9 is fed via the cantilever 5 and the wiring 7 to the second electrode 4 and applied to one surface of the BSO crystal 1. On the other hand, the potential at the first electrode 3 (ground potential or a predetermined bias potential) is applied to another surface of the BSO crystal 1. As a result, the BSO crystal 1 receives the effect by an electric field corresponding to the potential difference between both surfaces and thus changes its refractive index (electro-optic effect). Therefore, by applying a polarized laser beam $P_3$ to the BSO crystal 1 and measuring a change in the polarization of a reflected laser beam $P_4$, it is possible to detect the magnitude of a voltage at the measurement point on the minute wiring 9. For example, where a circle-polarized laser beam $P_3$ with its minor axis $D_{S3}$ and major axis $D_{L3}$ equal to each other is applied to the crystal as illustrated, a laser beam $P_4$ is observed which is ellipse-polarized according to the magnitude of the measurement voltage. Thus, it is possible to detect the magnitude of the measurement voltage from the relationship between the minor axis $D_{S4}$ and major axis $D_{L4}$ of the ellipse.

Figure 2:
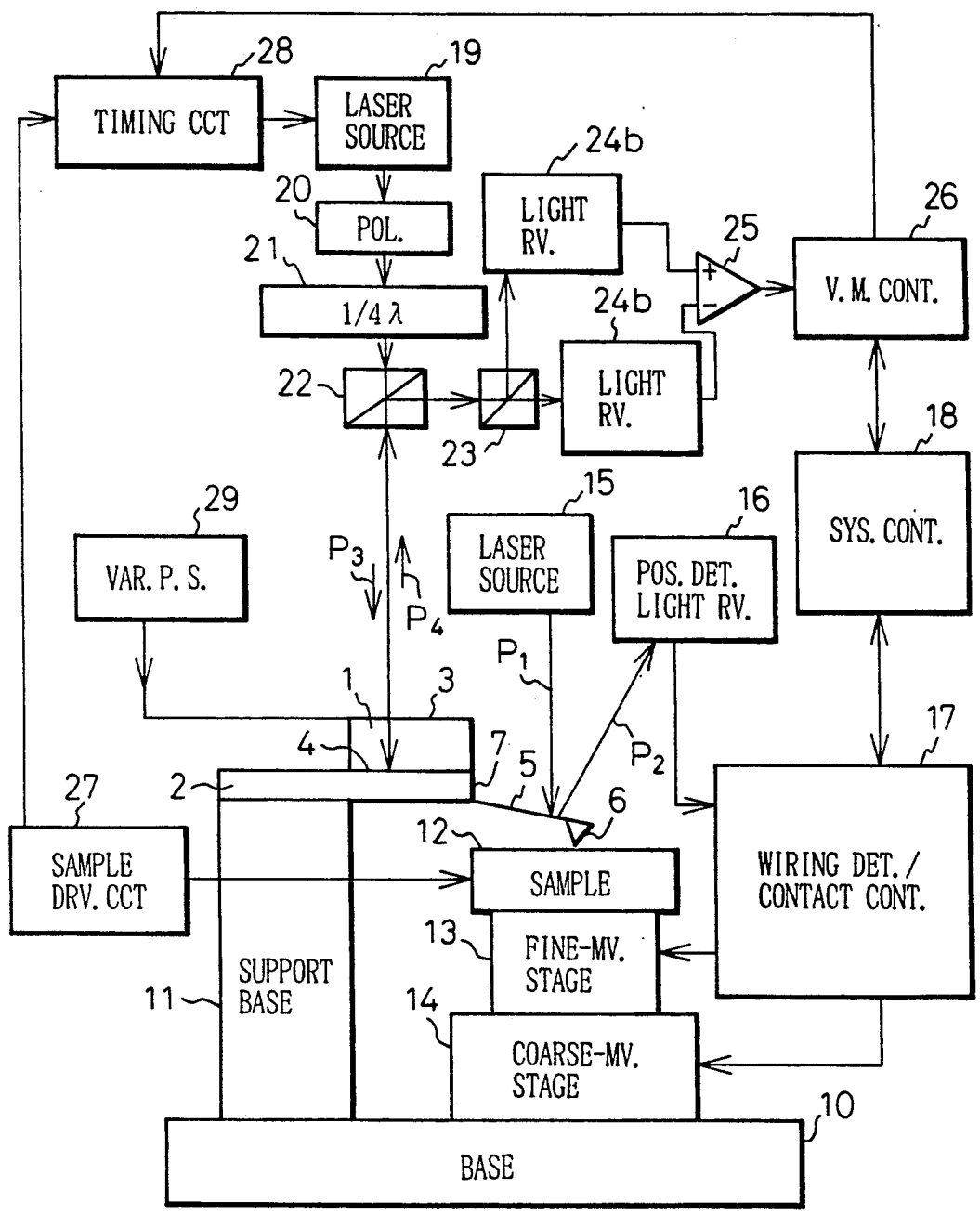
FIG. 2 is a diagram showing a constitution of the entire system including the device of FIG. 1.

FIG. 2 illustrates a constitution of the entire system including the device of FIG. 1.

In the illustration, the device of FIG. 1, i.e., the probing device including the BSO crystal 1, the probe substrate 2, the cantilever 5 and the probe 6, is mounted on a support base 11 fixed to a base 10. Below the probe 6, an arbitrary sample containing minute wirings (e.g., semiconductor integrated circuit chip) 12 is arranged, which is supported fine-movably in the three-dimensional directions by means of an XYZ stage 13 using a piezoactuator. The stage 13 is supported coarse-movably in the three-dimensional directions by means of an XYZ stage 14 which is fixed to the base 10. The sample 12 is fine-movable and coarse-movable in each direction of X, Y and Z including the direction of deflection (Z) of the cantilever 5 based on the interatomic force. These movements are relative ones between the sample 12 and the probing device. Accordingly, the probe substrate 2, which is one of the constituent elements of the device and fixes the base end 5a of the cantilever 5 thereto, functions as the "moving member" described in the gist of the invention. Note, the manner of movement is not restrictive to the above example. For example, the probe substrate 2 may be moved with the sample 12 being stationary, or the substrate 2 and the sample 12 may be moved relatively to each other.

The laser beam $P_1$ emitted from a first laser source 15 is applied to one surface of the cantilever 5 and the laser beam $P_2$ reflected from the cantilever 5 is received at a position detective light receiver 16 (e.g., PSD: Position Sensitive Detector), where the reflection angle of the laser beam $P_2$ is measured. Reference 17 denotes a wiring detection/contact control unit which, based on the above measured result, reproduces three-dimensional information (line profile) of the surface of the sample 12. The wiring detection/contact control unit 17 is operated under control of a system control unit 18 for controlling the entire LSI testing system.

Figure 3A:
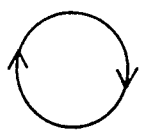
FIGS. 3a to 3e are diagrams showing an example of the polarization in the sampling optical system.
Figure 3B:
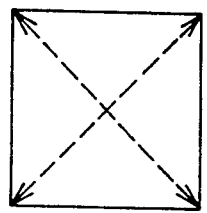
Figure 3C:
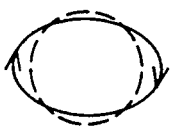
Figure 3D:
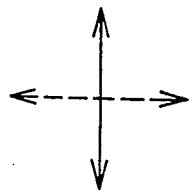
Figure 3E:
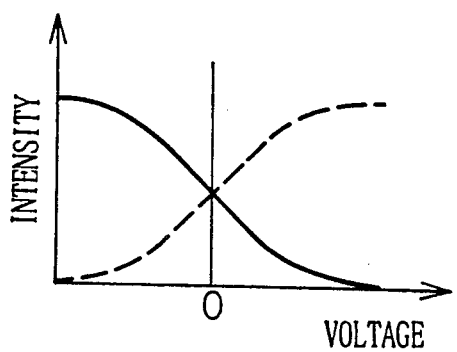
Figure 4A:
FIGS. 4a to 4e are diagrams showing another example of the polarization in the sampling optical system.
Figure 4B:
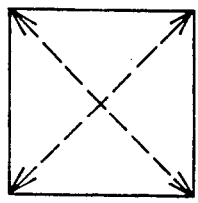
Figure 4C:
Figure 4D:
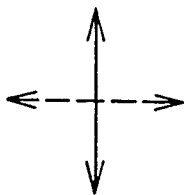
Figure 4E:
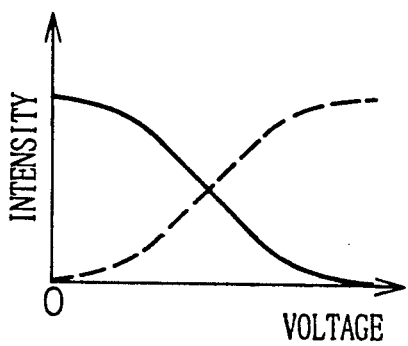

The laser beam $P_3$ emitted from a second laser source 19 receives a predetermined polarization (see (FIG. 3a) through a polarizer 20 and a ¼ wavelength shifter 21 and applied via a polarization beam splitter 22 to the BSO crystal 1 (see FIG. 3b). The laser beam $P_4$ reflected from the BSO crystal 1 (see FIG. 3c) is splitted into two beams through the polarization beam splitter 22 and a further polarization beam splitter 23, and the two beams are led to light receivers 24a and 24b, respectively. Outputs of the light receivers 24a, 24b is input via a differential amplifier 25 to a voltage measurement control unit 26. The voltage measurement control unit 26 receives information of the position of the measurement wiring detected by the wiring detection/contact control unit 17, via the system control unit 18. The polarization beam splitter 23 together with the polarizer 20 constitutes a Nicol prism and thus selectively transmits a predetermined polarized beam. In the constitution of FIG. 2, one of the laser beams split by the polarization beam splitter 23 corresponds to a light transmitted through a parallel type Nicol prism, and the other thereof corresponds to a light transmitted through a cross type Nicol prism. These relationships are shown in FIGS. 3d and 3e. In this connection, FIGS. 4a to 4e show another example of the polarization corresponding to FIGS. 3a to 3e.

The amount of light detected by the light receivers 24a, 24b responds to the magnitude of the electric field in the BSO crystal 1, i.e., the magnitude of a voltage at an arbitrary measurement point on the sample 12. The amount of light is decreased in the case of parallel type Nicol prism and increased in the case of cross type Nicol prism. Accordingly, by measuring the relationship between the outputs of the light receivers 24a, 24b and the position information of the measurement point in the voltage measurement control unit 26, it is possible to obtain a voltage measurement result with an enhanced "time resolution". Note, with respect to the manner of voltage application to the electro-optic crystal, optical paths of the laser beams $P_3$, $P_4$ for voltage measurement, the state of polarization, the number or arrangement of optical elements and detectors for analysis of the state of polarization, and the like, the above example is not restrictive.

Additionally, in FIG. 2, reference 27 denotes a sample driving circuit which feeds a drive signal for operating an LSI chip as the sample 12; reference 28 denotes a timing circuit which responds to the voltage measurement result from the voltage measurement control unit 26 and a trigger signal from the sample driving circuit 27 and thus feeds a timing signal for optical sampling to the laser source 19; and reference 29 denotes a variable power source for applying a predetermined electric signal (0 V, DC bias voltage, or pulse signal) to the transparent electrode 3 of the device.

Figure 5:
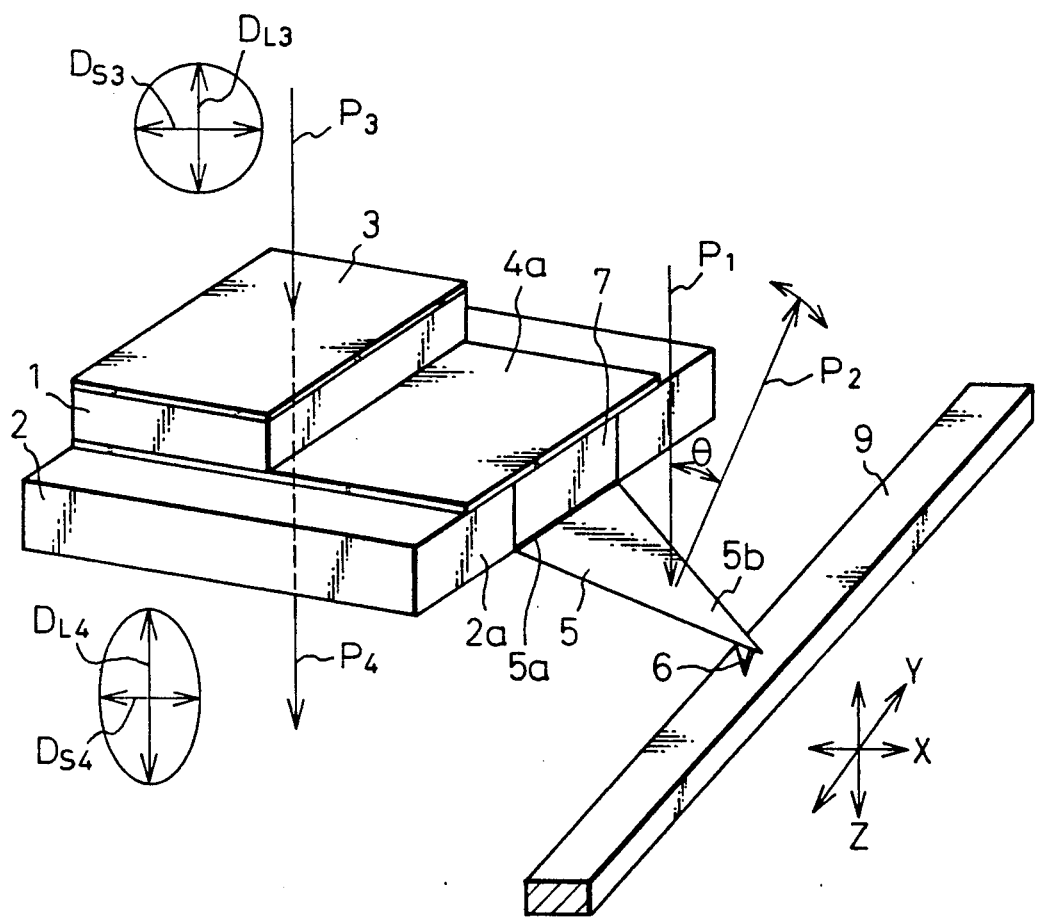
FIG. 5 is a perspective view showing a constitution of another embodiment of the probing device according to the present invention.

FIG. 5 shows a constitution of another embodiment of the probing device according to the present invention.

The present embodiment is characterized in that the voltage measurement means (optical sampling system including the laser beams $P_3$, $P_4$) is constituted in the form of a "light-transmission type" in place of the "reflection type" of FIG. 1. To this end, a light-transmitting and transparent electrode 4a is provided in place of the metal electrode 4, and a transparent probe substrate 2a is also provided. Other constitution and the mode of operation thereof are the same as those of FIG. 1 and thus the explanation thereof is omitted.

Next, the voltage measurement processing executed by the system of FIG. 2 will be explained with reference to the flowchart of FIG. 6.

First, at step 30, the sample 12 is mounted on the fine-moving stage 13. At step 31, the coarse-moving stage 14 is moved in the horizontal direction of XY to move the position of the sample 12. This movement control is carried out, for example, by means of an optical microscope as stated later, such that the probe 6 is positioned above the rough target region where the measurement object (e.g., minute wiring) is present.

When the probe 6 reaches above the rough target region, at step 32, a concave and convex image of the surface of the sample 12 (i.e., line profile) is observed. The observation is carried out by lowering the probe 6 to the very limit of the surface of the sample 12 (actually, raising the sample 12 by means of the fine-moving stage 13) and scanning the sample 12 with respect to the probe 6 in the horizontal direction of XY by means of the fine-moving stage 13. Thus, the magnitude of an interatomic force working between the probe 6 and the sample 12 is measured from the amount of deflection occurring in the cantilever 5, or from a distance between the probe substrate 2 and the sample 12 for keeping the amount of deflection constant.

At step 33, a judgement of whether a wiring as the measurement object is found (YES) or not (NO) in the observation field is carried out. Where a result of the judgement is NO, the control proceeds to step 34 and the sample 12 is fine-moved by the fine-moving stage 13 and then the control returns to step 32.

Where the result of the judgement at step 33 is YES, the control proceeds to step 35 and the sample 12 is fine-moved by the fine-moving stage 13 so that it is aligned with the position of the measurement object. At step 36, the sample 12 is raised to contact the measurement object with the probe 6. At step 37, the laser beam $P_4$ reflected from the BSO crystal 1 is led via the polarization beam splitters 22, 23 to the light receivers 24a, 24b and, based on the outputs thereof, the change in refractive index of the BSO crystal, i.e., a voltage of the measurement object, is measured. At step 38, a judgement of whether other measurement object is absent (YES) or not (NO) is carried out. Where a result of the judgement is YES, the control comes to an "END", and where the result is NO, the control returns to step 31 and the above processing is repeated.

As explained above, according to the probing device of the present embodiment, when the probe 6 is brought close to a minute wiring as the measurement object, an interatomic force is exerted between the probe 6 and the minute wiring and thus an amount of deflection corresponding to the magnitude of the force is caused in the cantilever 5. Accordingly, by measuring the amount of deflection, it is possible to detect the position of the minute wiring precisely and exactly. Also, since the tip of the probe 6 is contacted with the detected minute wiring to effect a voltage measurement, it is possible to heighten the "space resolution" of the voltage measurement. Furthermore, by applying the voltage occurring in the probe 6 via the connecting means (cantilever 5, wiring 7 and electrode 4) to the electro-optic crystal 1, it is possible to induce the electro-optic effect in the crystal 1 and thus heighten the "time resolution" of the voltage measurement.

Note, the force working between the probe 6 and the minute wiring is not restrictive to the above interatomic force. For example, it may be an electrostatic force, a magnetic force, or van der Waals force.

FIGS. 7a, 7b to 11 illustrate modifications of the probing device of FIG. 1.

Figure 7A:
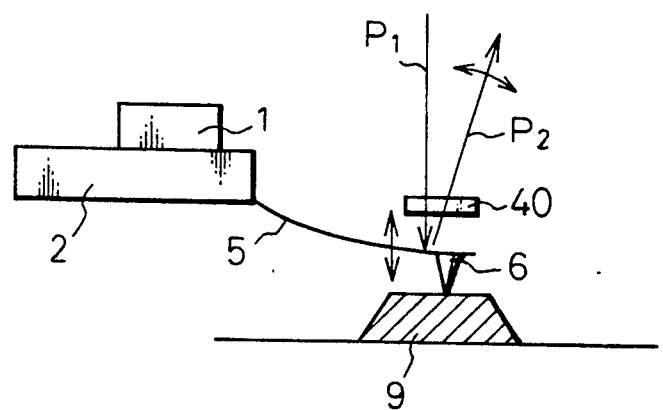
FIGS. 7a and 7b are views showing a first modification of the probing device of FIG. 1.
Figure 7B:
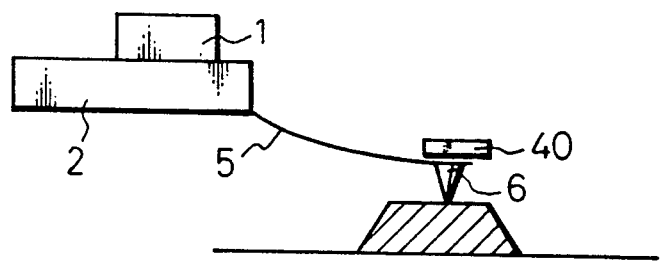
Figure 8A:
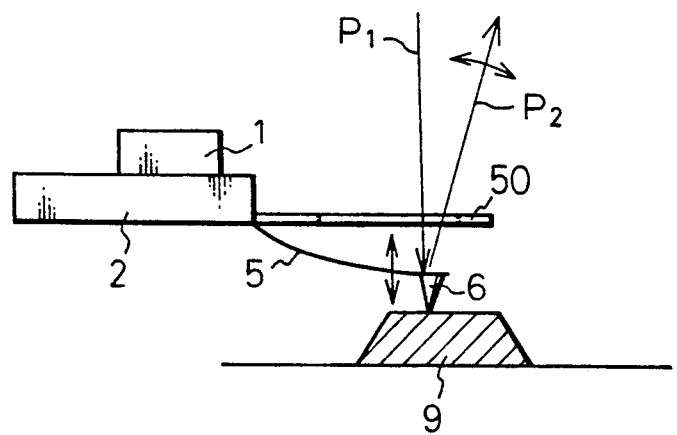
FIGS. 8a and 8b are views showing a second modification of the probing device of FIG. 1.
Figure 8B:
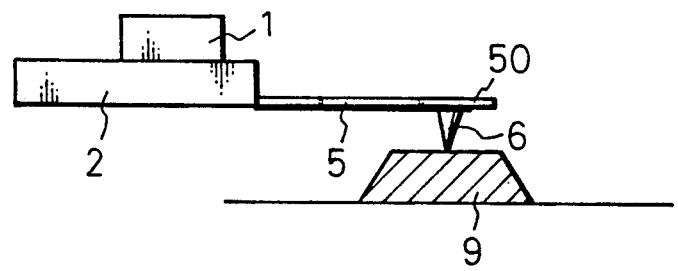

In the modification shown in FIGS. 7a and 7b, reference 40 denotes a transparent plate which is provided with a predetermined distance from one surface (reflection surface of the laser beam for displacement measurement) of the cantilever 5. The transparent plate 40 functions as a control means for controlling the amount of deflection of the cantilever 5 below a predetermined amount. As shown in FIG. 7a, when the cantilever 5 is not contacted with the transparent plate 40 (i.e., in the wiring search), the deformation of the cantilever 5 is smoothly permitted. Also, as shown in FIG. 7b, when the cantilever 5 is contacted with the transparent plate 40 (i.e., in the wiring voltage measurement), the deformation of the cantilever 5 is prohibited.

According to the constitution, since the deformation of the cantilever is controlled below the predetermined amount in the wiring voltage measurement, it is possible to remove a disadvantage seen in the case that the spring constant of the cantilever 5 is selected to be small. Namely, it is possible to prevent an increase in the contact resistance due to insufficiency of the pressure of the probe 6 relative to the measurement wiring 9. This contributes to an improvement in the measurement precision with respect to a very low voltage.

Figure 9:
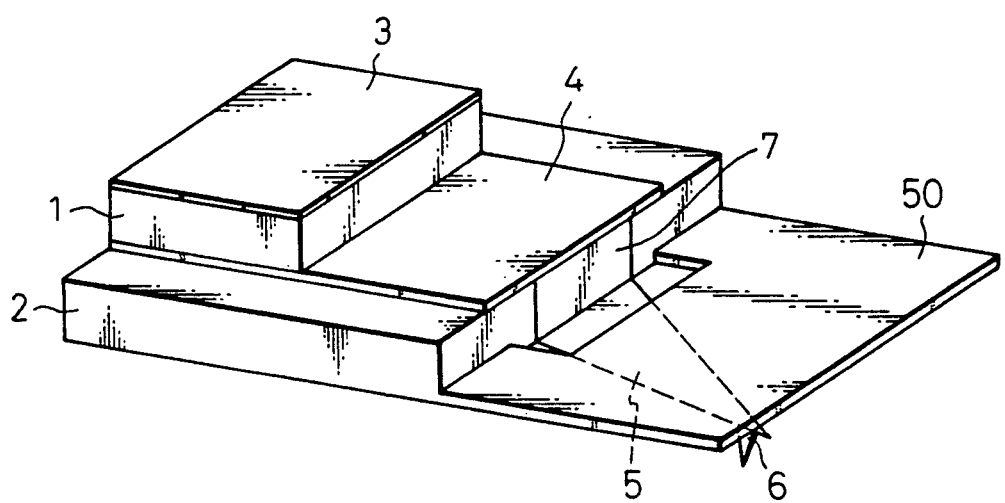
FIG. 9 is a perspective view showing a constitution of the probing device of FIGS. 8a and 8b.

Althouth the transparent plate is provided separately from the probe in the constitution of FIGS. 7a, 7b, the arrangement of the transparent plate is not restrictive thereto. For example, as in the modification shown in FIGS. 8a and 8b, a transparent plate 50 may be formed integral with the probe substrate 2. In this case, in the wiring voltage measurement shown in FIG. 8b, the cantilever 5 is contacted with the transparent plate 50 and thus, as well in the case of FIGS. 7a, 7b, a further deformation of the cantilever 5 is controlled. FIG. 9 shows the concrete constitution, in which the transparent plate 50 is formed by extending a portion of the probe substrate 2. In this connection, a transparent plate manufactured separately may be attached to the probe substrate 2.

Also, the control means (transparent plate 40, 50) may be supported elastically with respect to the probe substrate 2 and fine-movably along the direction of deflection of the cantilever 5.

In the modification shown in FIGS. 10a and 10b, reference 60 denotes a further cantilever (hereinafter referred to as a subcantilever, while the above cantilever 5 is referred to as a main cantilever) which is provided with a predetermined distance from one surface (reflection surface of the laser beam for displacement measurement) of the main cantilever 5. The subcantilever 60 functions as means for changing the spring constant of the entire cantilever, and has a predetermined spring constant and is formed by transparent material. When a deformation exceeding a predetermined amount occurs in the main cantilever 5, both of the cantilevers 5, 60 are contacted with each other (see FIG. 10b).

Figure 11:
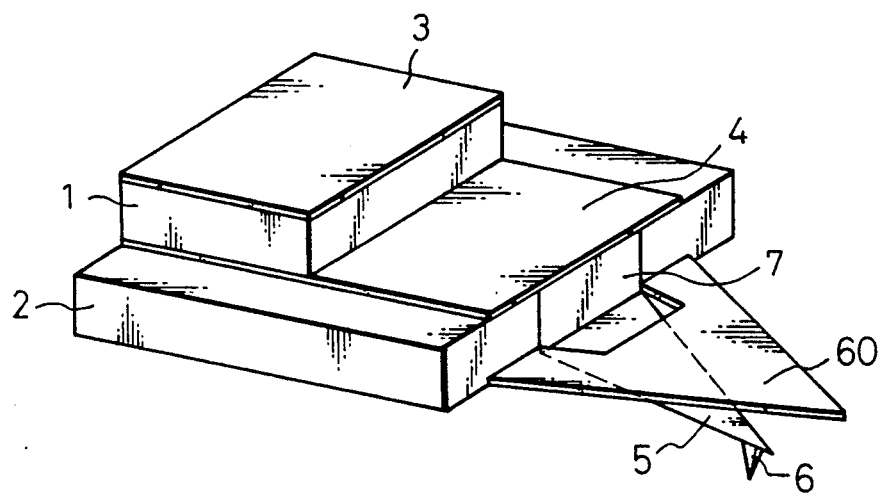
FIG. 11 is a perspective view showing a constitution of the probing device of FIGS. 10a and 10b.

According to the constitution, in the wiring voltage measurement, it is possible to elastically control the deformation of the main cantilever 5 by the sum of each spring constant of the main cantilever 5 and the subcantilever 60. Also, by regulating the spring constant of the subcantilever 560, it is possible to freely change the elasticity for the control. Accordingly, it is possible to avoid an excessive contact pressure between the probe 6 and the measurement wiring in the wiring voltage measurement. For example, it is possible to prevent a damage of the measurement wiring and remove a fault of the probing device such as a damage of the main cantilever 5. FIG. 11 shows the concrete constitution, in which the the main cantilever 5 and the subcantilever 60 are attached to the side surface of the probe substrate 2.

Figure 10A:
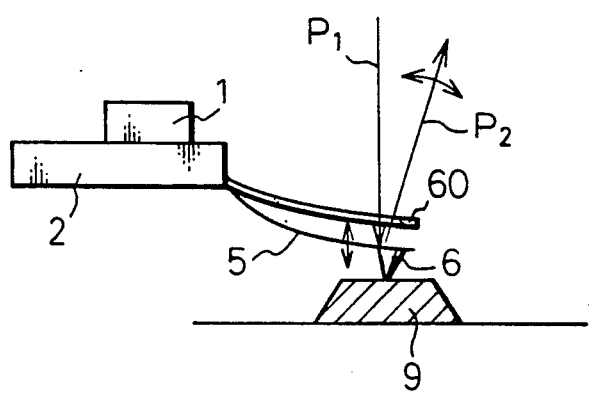
FIGS. 10a and 10b are views showing a third modification of the probing device of FIG. 1.
Figure 10B:
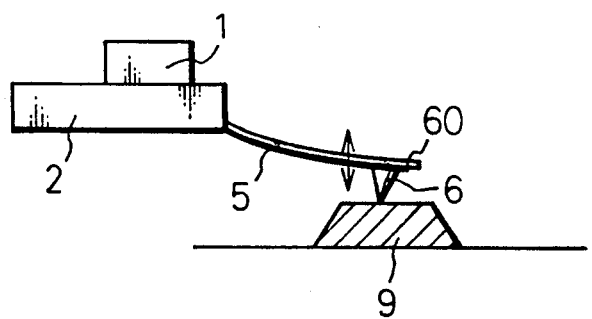

Note, althouth the number of the subcantilever 60 is one in the illustration of FIGS. 10a, 10b, it may be suitably plural according to the conditions of measurement.

Figure 12:
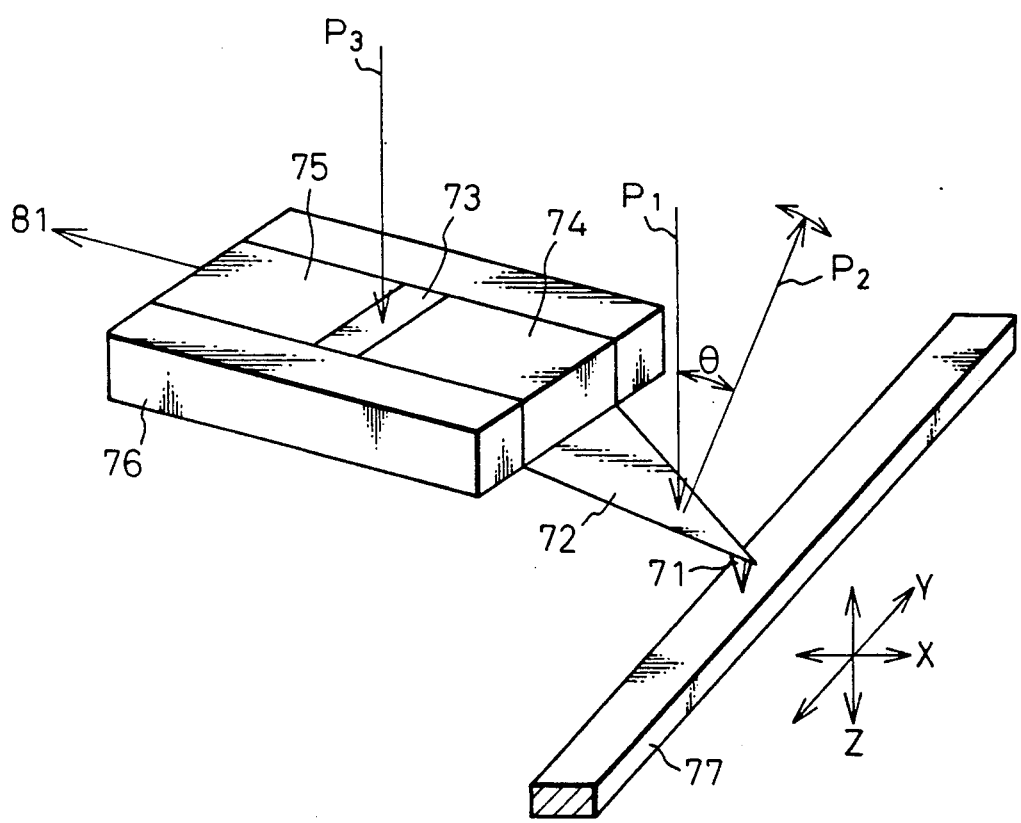
FIG. 12 is a perspective view showing a fundamental constitution of the probing device according to another aspect of the present invention.

FIG. 12 illustrates a fundamental constitution of the probing device according to another aspect of the present invention.

In the illustration, reference 71 denotes a minute probe; reference 72 a conductive cantilever; reference 73 a photoconductive gate; reference 74, 75 a conductor; reference 76 a substrate; reference 77 a wiring as the measurement object; reference 81 a detected current corresponding to the measurement voltage; reference $P_1$, $P_2$ a laser beam for displacement measurement of the cantilever; and reference $P_3$ a laser beam for voltage measurement.

The structures of the probe 71 and the cantilever 72 and their functions are the same as those (the probe 6 and the cantilever 5) used in the probing device of FIG. 1. Accordingly, it is possible to measure the height of the surface of the sample with a very high resolution (with the order of 0.1 nm to 1 nm) by means of the interatomic force working between the probe 71 and the minute wiring 77 (working in the distance of the order of 1 nm to 10 nm).

Also, as stated later, the device is provided with the function of fine-moving the sample with units of the order of nanometers in the vertical direction with respect to the wiring contact portion, and the function of constantly keeping the deflection of the cantilever (i.e., the distance between the probe 71 and the surface of the wiring 77) by means of a feedback control based on the measured deflection of the cantilever. Furthermore, the device is also provided with the function of scanning the sample with units of the order of nanometers in the horizontal direction with respect to the wiring contact portion.

By the above functions, it is possible to measure a minute shape of the order of nanometers to micrometers on the surface of the sample. Also, the entire probing device may be scanned in the two-dimensional direction with the sample being stationary.

Also, the line profile based on the wiring on the surface of the sample can be obtained. By observing the line profile and changing the scanning position, the wiring 77 to be measured can be found out. By moving the probe portion to the target point on the target wiring (e.g., center of the wiring width) and contacting the probe 71 with the target point on the wiring, the wiring 77 is electrically connected via the probe 71 to the cantilever 72. As a result, the photoconductive gate 73 formed on the substrate 76 of the probing device is connected to the cantilever 72, accordingly, to the probe 71.

According to the constitution of FIG. 12, the photoconductive gate 73 is connected to the conductive cantilever 72 provided with the conductive minute probe 71 for realizing the function of an AFM, and a photoconductive gate has a high sensitivity compared with an electro-optic effect. Therefore, it is possible to reduce time required for measuring a voltage signal waveform of the wiring with a constant resolution.

Also, since the voltage measurement is carried out by detecting the current (proportional to the measurement voltage) in the gate ON state, it becomes unnecessary to provide an optical system for detecting a reflected light as seen in the device using an electro-optic effect (see FIG. 1). Therefore, it is possible to realize a simplification and a small size of the device.

Furthermore, by applying a bias voltage to the photoconductive gate 73 and applying a laser beam (continuous beam or pulse beam) thereto, it is possible to apply the voltage to the minute wiring 77 contacted with the probe 71, continuously or in a pulsed form (utilization as a feeding probe).

Figure 13A:
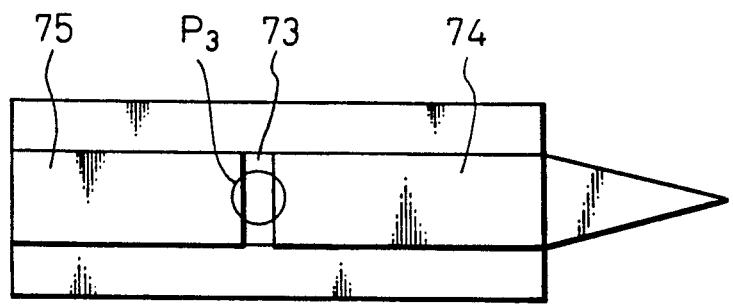
FIGS. 13a and 13b are views schematically showing a structure of the probing device as a first embodiment according to the aspect of FIG. 12.
Figure 13B:
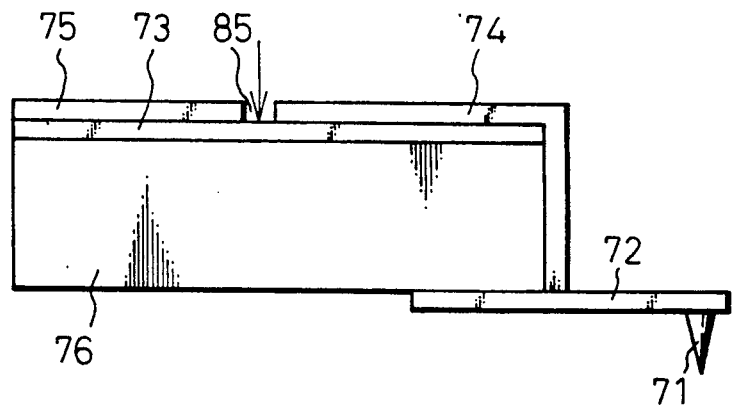

FIGS. 13a and 13b schematically show a structure of the probing device as a first embodiment according to the aspect of FIG. 12. Note, FIG. 13a is a plan view and FIG. 13b is an elevation view.

In the illustrated constitution, on the insulation substrate 76 such as sapphire, there is formed the photoconductive gate 73 consisting of photoconductive substance such as ion-implanted Si crystal, amolphous Si, or damaged GaAs crystal. Moreover, on the photoconductive gate 73, the metal electrodes 74 and 75 are formed with a parallel gap 85 therebetween. The width of the electrode is approximately 50 μm and the width of the parallel gap 85 is approximately 10 μm. Also, the load of the conductive probe 71 is approximately $10^{-8}$ N and the spring constant of the conductive cantilever 72 is approximately 1 N/m.

Figure 14:
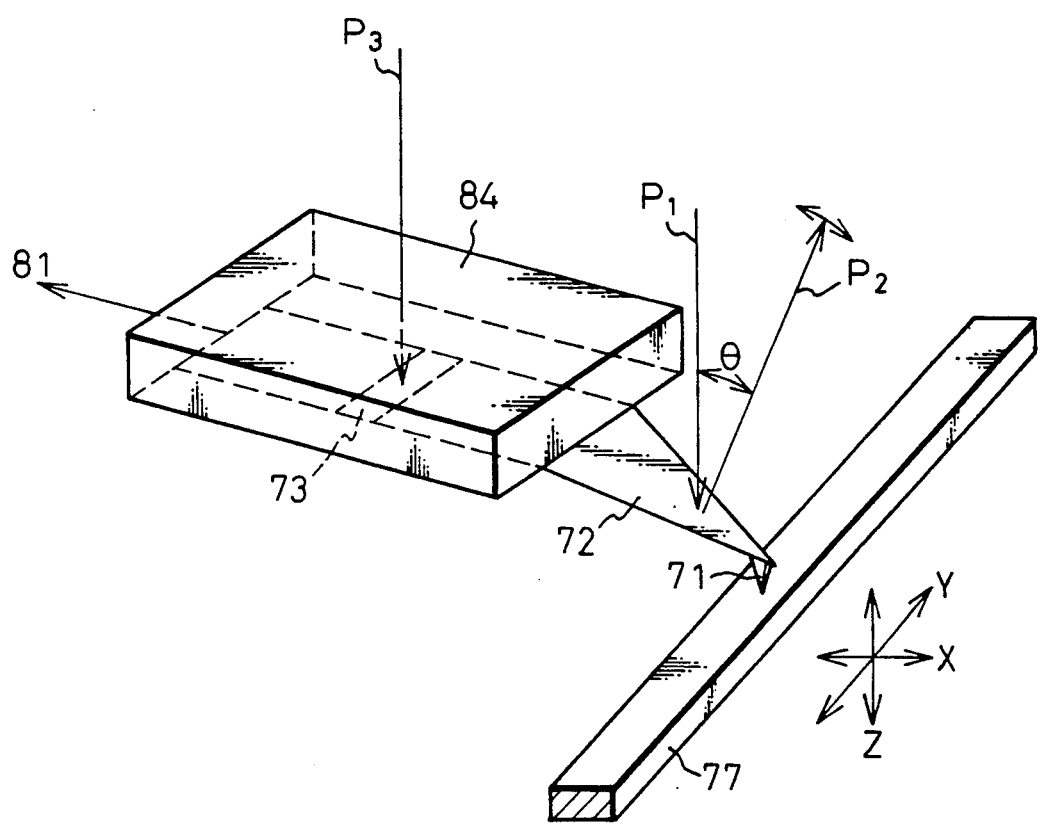
FIG. 14 is a perspective view showing a constitution of the probing device as a second embodiment according to the aspect of FIG. 12.
Figure 15A:
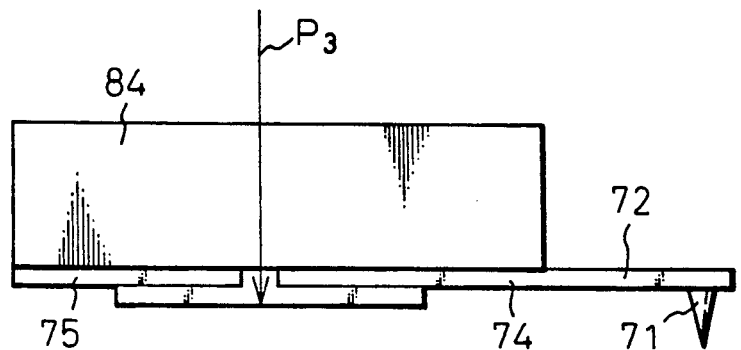
FIGS. 15a and 15b are views schematically showing a structure of the probing device of FIG. 14.
Figure 15B:
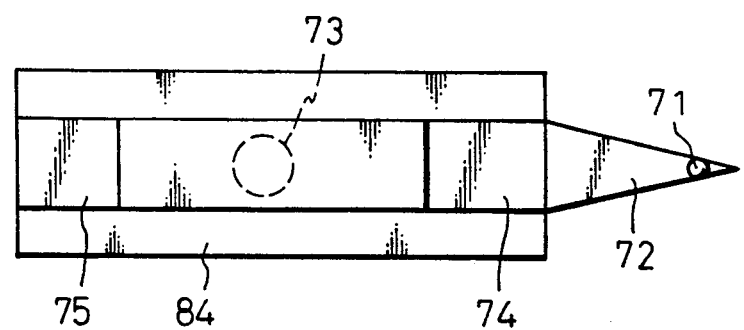

FIG. 14 shows constitution of the probing device as a second embodiment according to the aspect of FIG. 12, and FIGS. 15a and 15b schematically show a structure thereof. Note, FIG. 15a is an elevation view and FIG. 15b is a plan view.

In the illustrated constitution, the photoconductive gate 73 and the metal electrodes 74, 75 are formed on the bottom surface of a transparent substrate 84 such as sapphire. According to the constitution of the present embodiment, it is possible to obtain an advantage in manufacturing in that it is unnecessary to form the electrode 74, which connects the conductive cantilever 72 to the photoconductive gate 73, on the side surface of the transparent substrate 84. In this connection, referring to the constitution of the first embodiment (see FIGS. 13a, 13b), it is necessary to form the electrode 74, which connects the conductive cantilever 72 to the photoconductive gate 73, on the side surface of the substrate 76.

Figure 16:
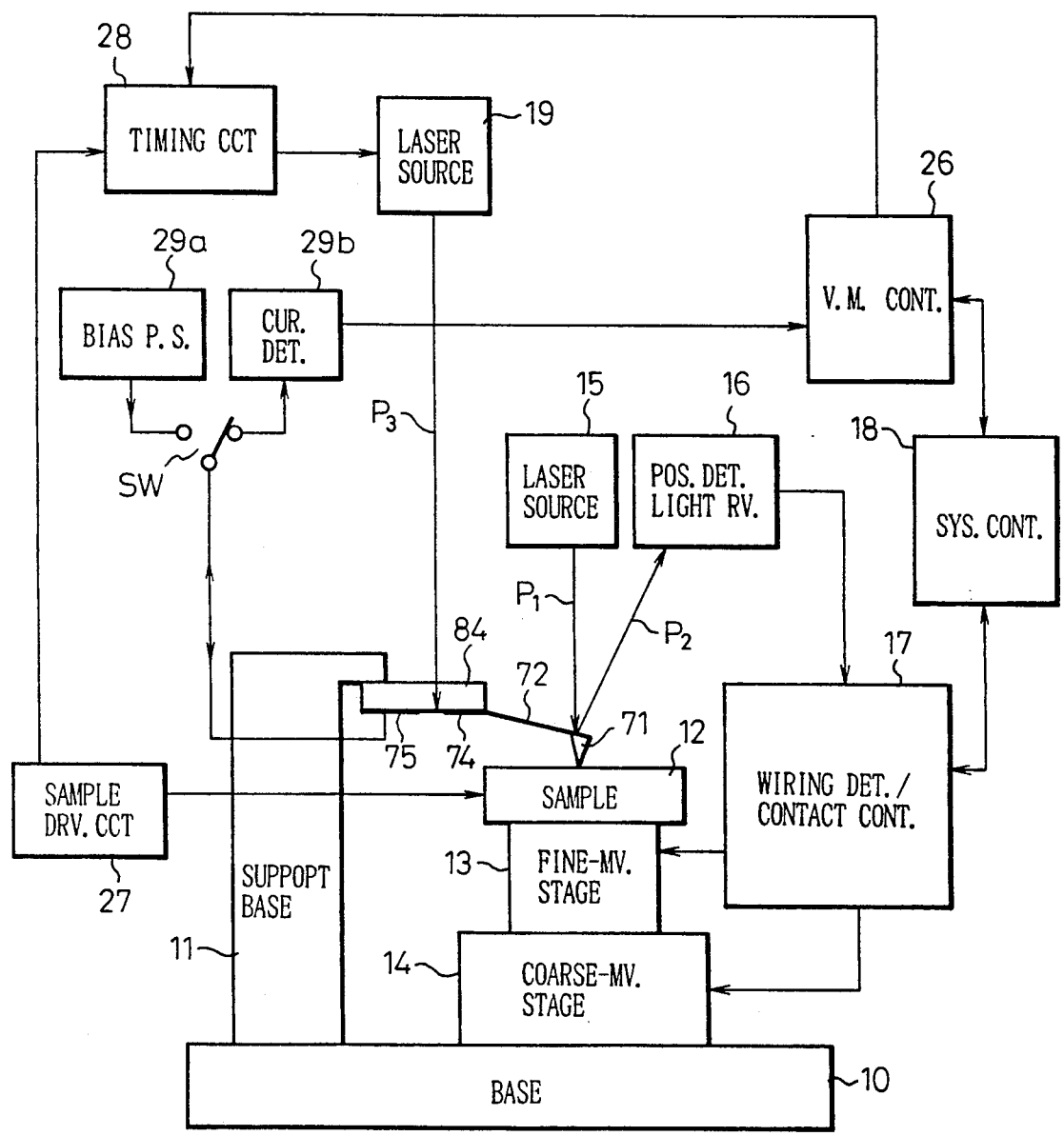
FIG. 16 is a diagram showing a constitution of the entire system including the device of FIG. 14.

FIG. 16 shows a constitution of the entire system including the device of FIG. 14. In the illustration, the same references as those used in FIG. 2 indicate like constituent elements and thus the explanation thereof is omitted.

In FIG. 16, reference 29a denotes a bias power source for applying a predetermined bias voltage via the electrode 75 (which is not directly connected to the cantilever 72) to the photoconductive gate 73; reference 29b a current detector for detecting current led from the cantilever 72 via the electrode 74 and the photoconductive gate 73 to the electrode 75; and reference SW a switch for selectively switching the bias power source 29a or the current detector 29b to the electrode 75.

The function of the testing system shown in FIG. 16 is the same as that in FIG. 2 (except for the operation of the probing device) and thus the explanation thereof is omitted.

Figure 17A:
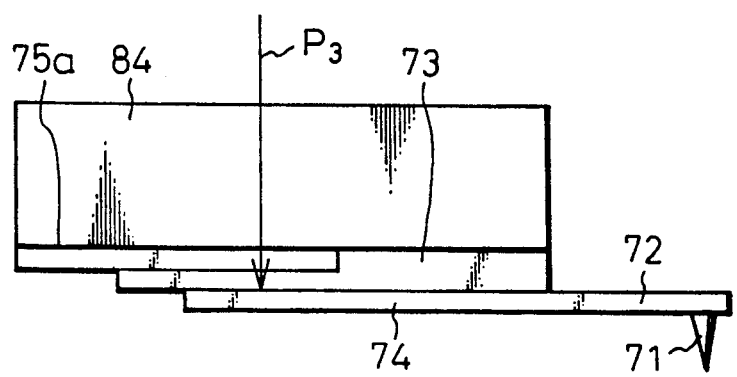
FIGS. 17a and 17b are views schematically showing a structure of the probing device as a third embodiment according to the aspect of FIG. 12.
Figure 17B:
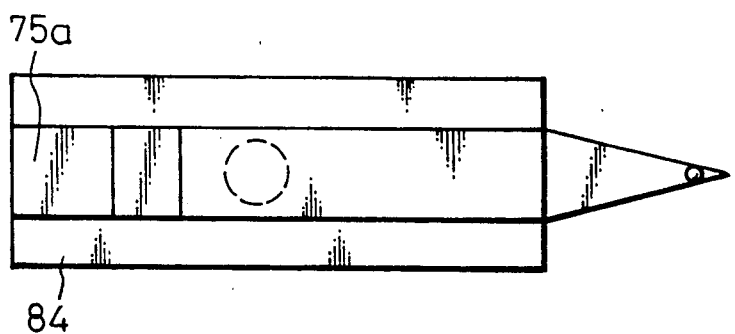

FIGS. 17a and 17b schematically show a structure of the probing device as a third embodiment according to the aspect of FIG. 12. Note, FIG. 17a is an elevation view and FIG. 17b is a plan view.

Generally, the narrower the gap between electrodes (see the parallel gap 85 in FIGS. 13a, 13b) becomes, the higher the voltage measurement sensitivity becomes and accordingly the resolution of the voltage measurement also becomes higher. On the other hand, the withstanding pressure at which a photoconductive gate is destroyed by an electric field is lowered. Accordingly, to form a photoconductive gate with a possible high sensitivity and a required withstanding pressure, it is necessary to control the gap between electrodes with the order of micrometers. To this end, an exposing apparatus with a high resolution needs to be provided. The present embodiment removes such a disadvantage.

Namely, in the illustrated constitution, two electrodes 74, 75a and the photoconductive gate 73 are provided on the bottom surface of the transparent substrate 84 and have a laminating structure in the direction of the incident light $P_3$. The electrode 75a provided next to the substrate 84 is a transparent electrode such as ITO. In this case, it is not so difficult to control the thickness of the photoconductive gate 73 with the precision of submicron. Therefore, according to the constitution of the present embodiment, since the voltage measurement sensitivity and the withstanding pressure can be changed according to the thickness of the photoconductive gate 73, it is possible to precisely control both the voltage measurement sensitivity and the withstanding pressure without using an exposing apparatus with a high resolution.

Figure 18A:
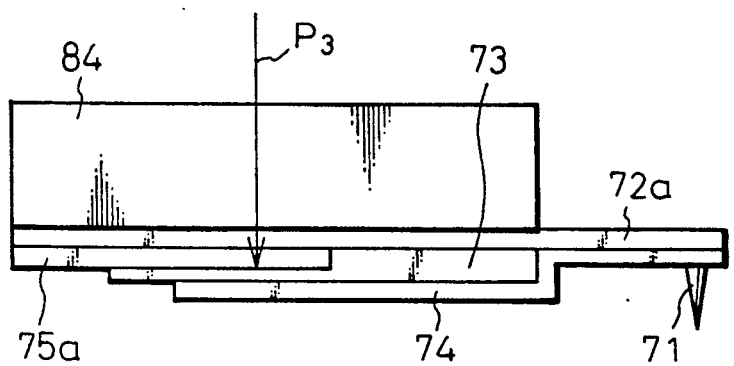
FIGS. 18a and 18b are views schematically showing a structure of the probing device as a fourth embodiment according to the aspect of FIG. 12.
Figure 18B:
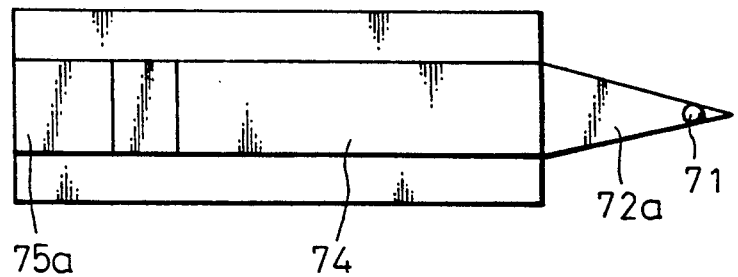

FIGS. 18a and 18b schematically show a structure of the probing device as a fourth embodiment according to the aspect of FIG. 12. Note, FIG. 18a is an elevation view and FIG. 18b is a plan view.

In the illustrated constitution, in place of the conductive cantilever (72), a transparent cantilever 72a consisting of silicon nitride ($Si_3N_4$) or silicon oxide ($SiO_2$) is formed. Moreover, the photoconductive gate 73, the electrode 74 and the transparent electrode 75a are formed on the transparent cantilever 72a. According to the constitution of the present embodiment, there is obtained an advantage in that it is possible to form the transparent cantilever 72a with a small spring constant by controlling the thickness of the $Si_3N_4$ film or the $SiO_2$ film.

FIG. 19 shows a constitution of an embodiment off the LSI testing apparatus according to the present invention.

In the illustration, reference 100 denotes a scanning type probe for effecting a probing to a wiring in the LSI (e.g., corresponding to the portions except for the optical system for voltage measurement and the optical system for displacement measurement of the cantilever in FIG. 1); reference 102 an optical sampling means for voltage measurement; reference 104 a stage provided fine-movably in the horizontal direction of XY, for mounting a probing head (scanning type probe 100 and optical sampling system 102) thereon; reference 106 an optical microscope for observing the surface of the sample (LSI); reference 108 a CCD camera for converting an image observed by the optical microscope 106 into an image signal; reference 110 a stage provided fine-movably in the X direction, for mounting the optical microscope 106 thereon; reference 112 a first stage provided coarse-movably in the horizontal direction of XY, for mounting the stage 104 and the stage 110 thereon; reference 114 a vibration-removing base for mounting the first stage 112 thereon; and reference 116 an opening portion for the LSI observation and the probing, provided to pass through the first stage 112 and the vibration-removing base 114.

In this constitution, the positioning of the scanning type probe 100 with respect to a wiring as the measurement object is carried out by observing the measurement wiring through the opening portion 116 by means of the optical microscope 106, bringing the scanning type probe 100 close to the measurement wiring and acquiring the line profile. The wiring voltage is led through the probe 100 to an electro-optic (EO) crystal and induces an electro-optic effect therein. In this case, by selecting the length of the scanning type probe to be below 200 to 300 μm, it is possible to effect a voltage measurement without increasing an electrical load with respect to the minute wiring.

FIGS. 20a to 20c illustrate the manner of probing to the wirings near the bonding wires.

FIG. 20a illustrates a wiring pattern in the peripheral portion of an LSI chip 120. In this example, a measurement wiring 122 is positioned between adjacent bonding wires 124. Accordingly, depending on the direction of access of the probe 100 to the wiring as illustrated in FIG. 20b, there is a disadvantage in that the probe and the bonding wire 124 interfere with each other. With respect to such a measurement wiring pattern, it is necessary to change the direction of access of the probe as illustrated in FIG. 20c, i.e., to prevent interference in the probing.

Figure 21:
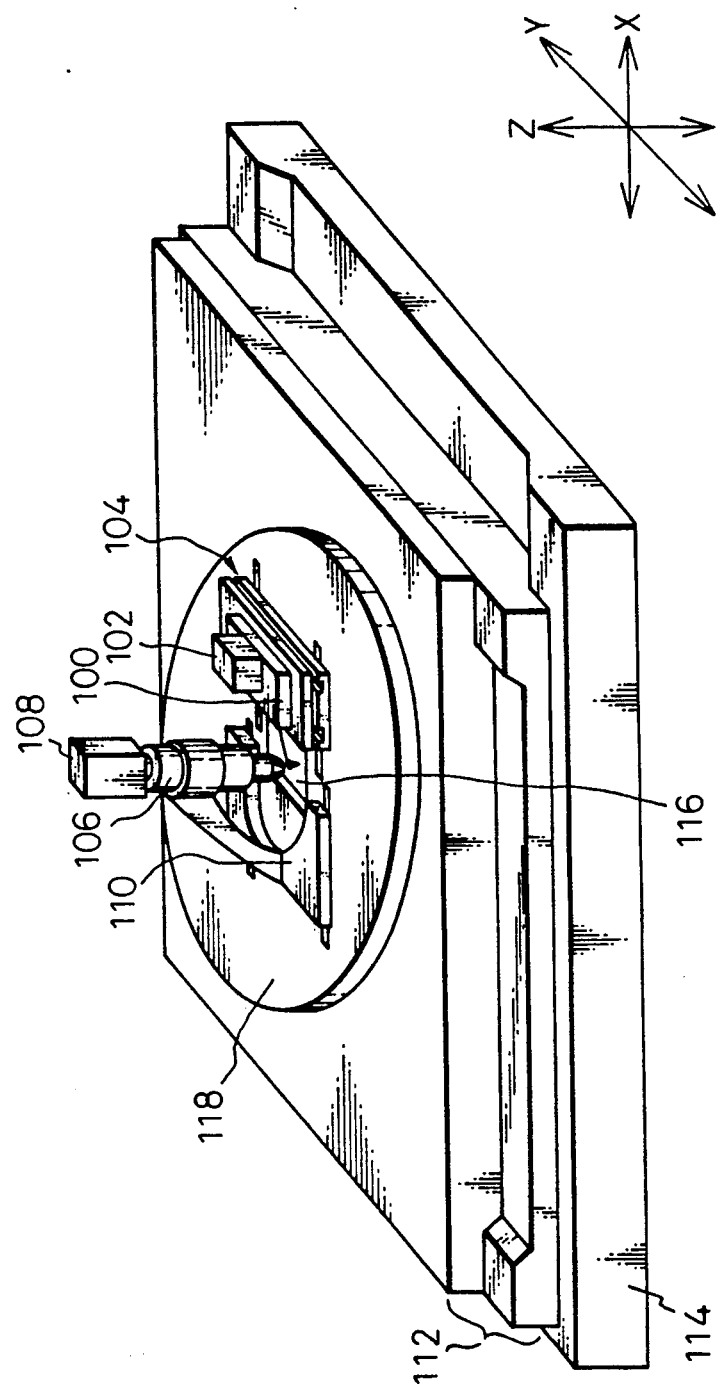
FIG. 21 is a view showing a constitution for enabling the probing shown in FIG. 20c.

FIG. 21 shows a constitution for enabling such a probing shown in FIG. 20c.

In this example, a second stage (rotation stage) 118 rotatable with respect to the Z direction axis is mounted on the first stage 112 movable in the horizontal direction of XY with respect to the vibration-removing base 114. Also, the stages 104 and 110 are mounted on the rotation stage 118. Accordingly, utilizing the rotation stage 118, it is possible to easily effect a probing to the wiring present near the bonding wire in the peripheral portion of the LSI chip.

Figure 22:
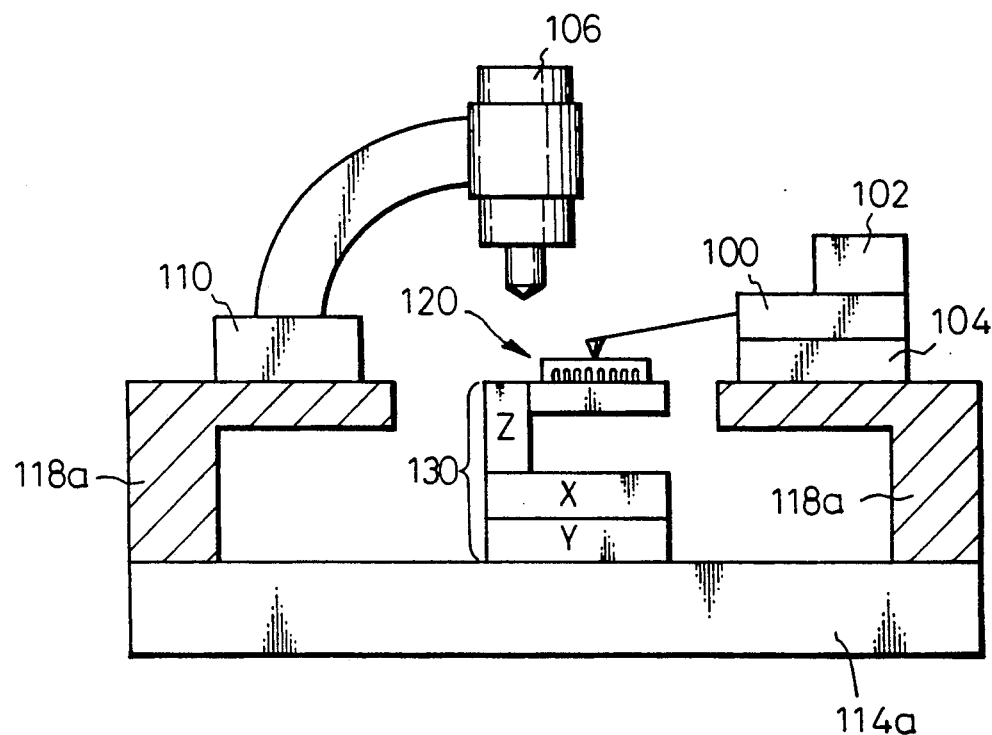
FIG. 22 is a view showing another constitution for enabling the probing shown in FIG. 20c.

FIG. 22 shows another constitution for enabling the probing shown in FIG. 20c.

In this example, a vibration-removing base 114a mounts thereon both a rotation stage 118a rotatable with respect to the Z direction axis and a stage 130 fine-movable in the three-dimensional direction of XYZ and mounting the LSI chip 120 thereon. By this constitution, it is possible to easily effect a probing to the wiring present near the bonding wire in the peripheral portion of the LSI chip. Also, there is obtained an advantage in that it is possible to realize a small size of the entire stage because there is not provided the first stage 112 as shown in FIG. 21.

Figure 23:
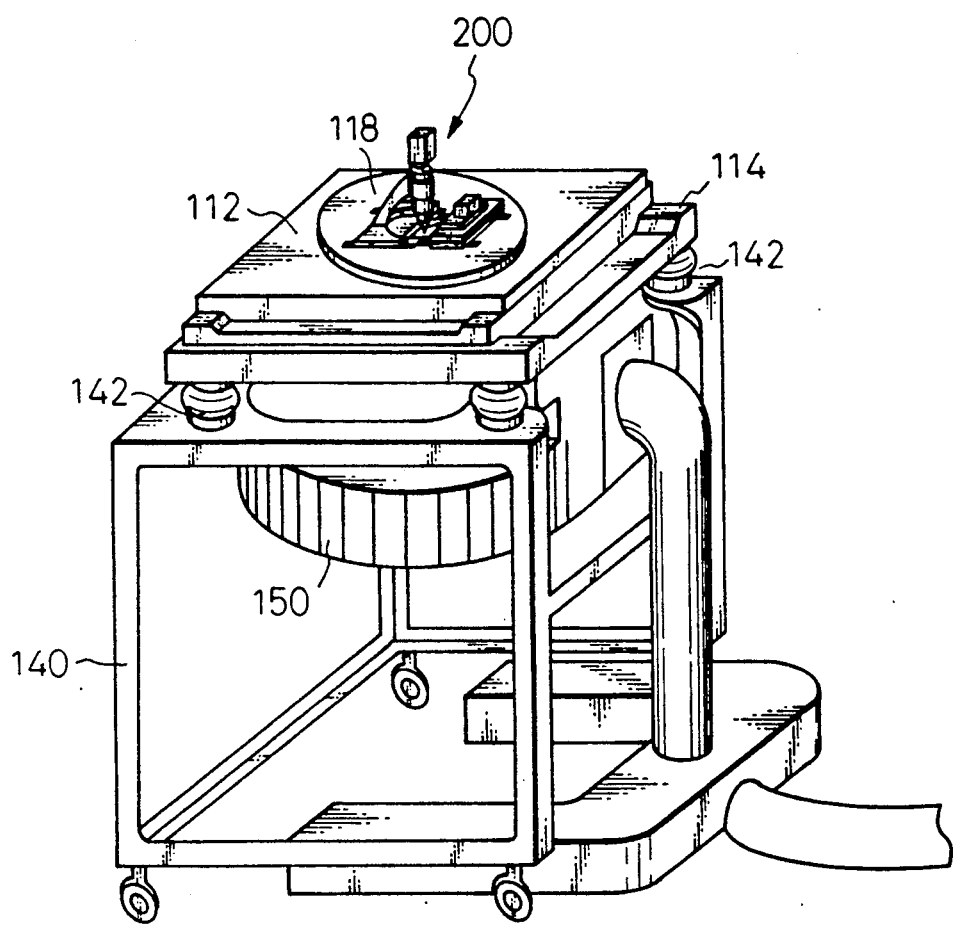
FIG. 23 is a perspective view showing an entire constitution of the LSI testing apparatus including the frame.

FIG. 23 shows an entire constitution of an LSI testing apparatus 200 including a frame 140. Since the testing apparatus 200 is averse to any vibration, it needs to be mounted via a vibration-removing means such as an airdamper 142 on the frame 140. Also, since the driving of an LSI chip is carried out by an LSI tester, it is necessary to arrange a test head 150 of the LSI tester under the vibration-removing base 114.

In this case, with respect to a coupling between the test head 150 and the testing apparatus 200, it is necessary to take suitable measures to prevent a tilt of the stages 112, 118 and to remove a vibration of the test head 150.

Figure 24A:
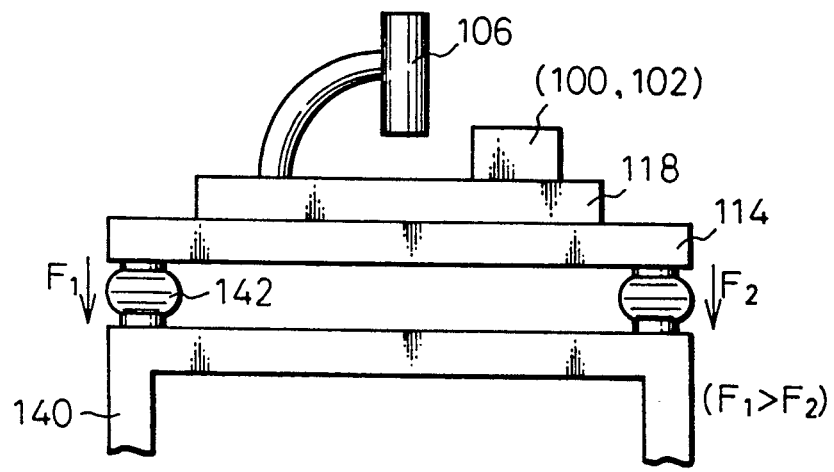
FIGS. 24a and 24b are views illustrating an inclination of the vibration-removing base accompanying the movement of the center of gravity due to the rotation.
Figure 24B:
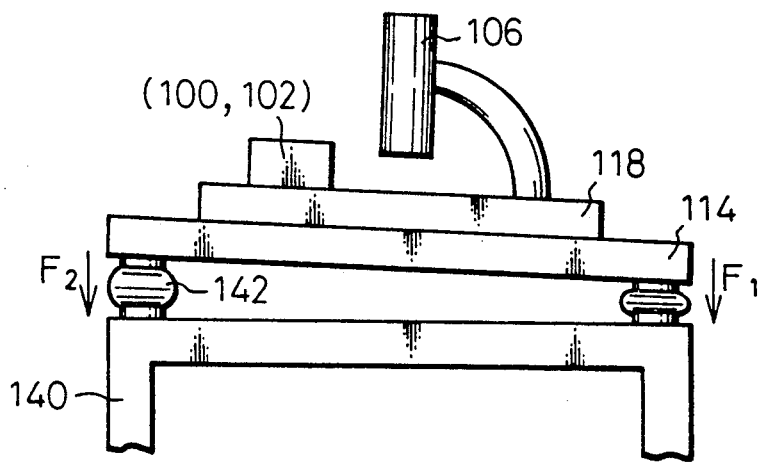

FIGS. 24a and 24b schematically illustrate the state of a tilt of the vibration-removing base 114 due to a rotation of the rotation stage 118. Where the position of the center of gravity of the entire apparatus is shifted by the rotation of the rotation stage 118 and thus a height compensation operation by the airdamper 142 cannot follow the shift, a tilt of the stage 118 is caused. To cope with this, for example, it is effective to arrange a counterbalance (not shown) in the outer side of the rotation stage 118.

A main cause for a relative vibration between the test head and the vibration-removing base is due to a rotation of a cooling fan provided within the test head. The relative vibration has an amplitude of approximately 50 to 60 μm. Also, since the test head and the testing apparatus including the frame are vibrated independently of each other by a vibration of a floor, it is not easy to avoid a vibration having an amplitude of 1 μm or more even if they are fixed to a firm floor.

Generally, an LSI is arranged in the center of a DUT (Device Under Test) board of the test head (e.g., DUT board 152 in FIG. 25) and the test head is arranged close to the vibration-removing base. Accordingly, where a rigidity of the test head is sufficiently high, it is possible to hold the test head by means of a clamping means to thereby suppress a relative vibration between the test head and the testing apparatus.

Figure 25:
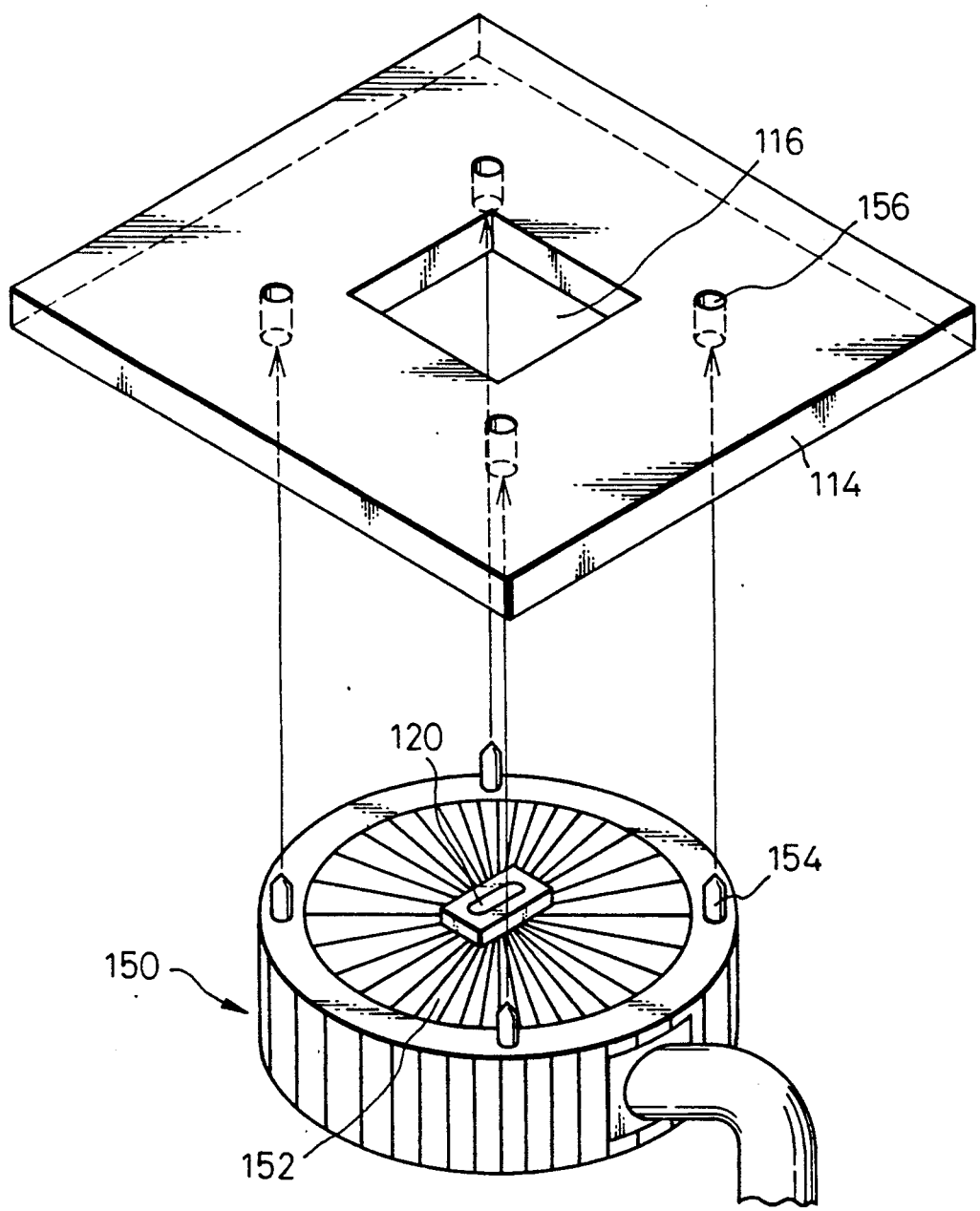
FIG. 25 is a view showing a first example of the constitution for fixing the location of the LSI under test relative to the vibration-removing base.
Figure 26:
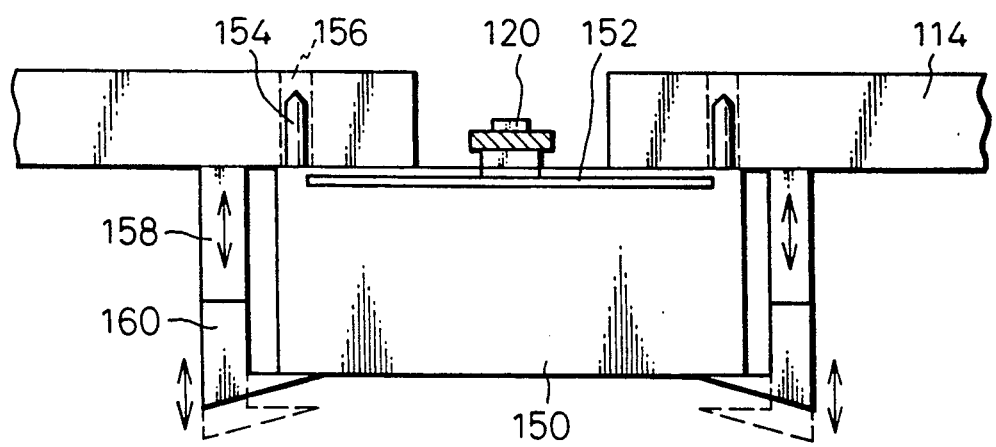
FIG. 26 is a view showing a second example of the constitution for fixing the location of the LSI under test relative to the vibration-removing base.

For example, as shown in FIG. 25, by providing guide pins 154 on the test head 150 and fitting the guide pins in corresponding guide openings 156 provided in the vibration-removing base 114, it is possible to make sure a relative position between the test head 150 and the vibration-removing base 114. Furthermore, as shown in FIG. 26, by clamping the test head 150 by means of a clamper 160·driven by an actuator 158 to thereby form a mechanically integral structure, it is possible to remove a relative vibration.

Figure 27A:
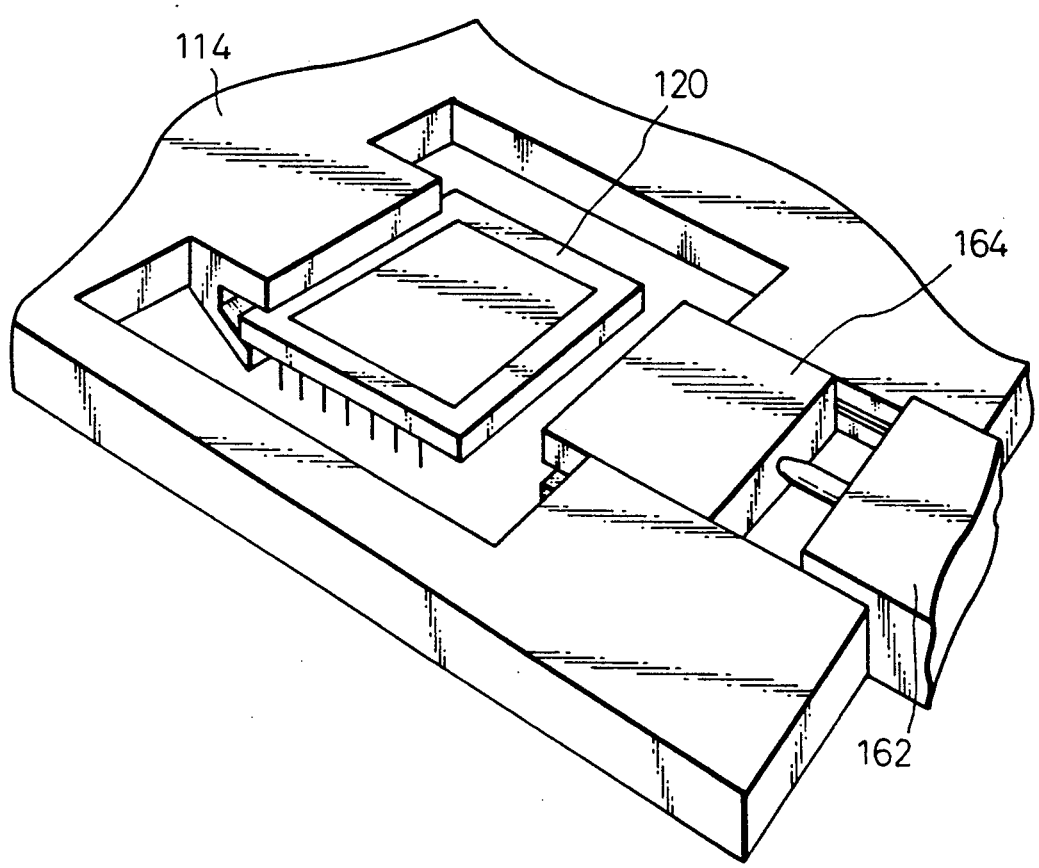
FIGS. 27a and 27b are views showing a third example of the constitution for fixing the location of the LSI under test relative to the vibration-removing base.
Figure 27B:
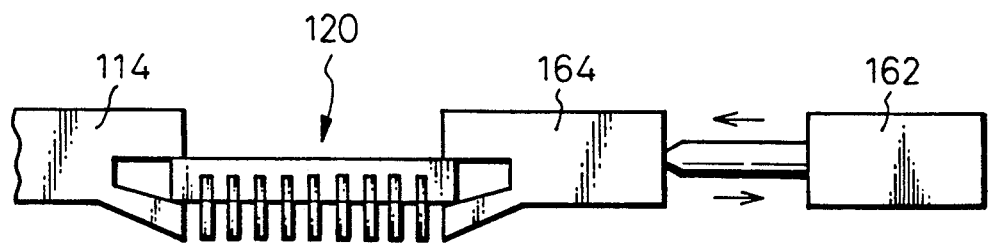

Also, where a natural vibration of the DUT board 152 is not negligible, as shown in FIGS. 27a, 27b, by directly clamping the LSI package 120 by means of a clamper 164 driven by an actuator 162 and thus constituting so that the LSI package 120 is mechanically attached to the vibration-removing base 114, it is possible to remove the above relative vibration substantially perfectly.

Figure 28:
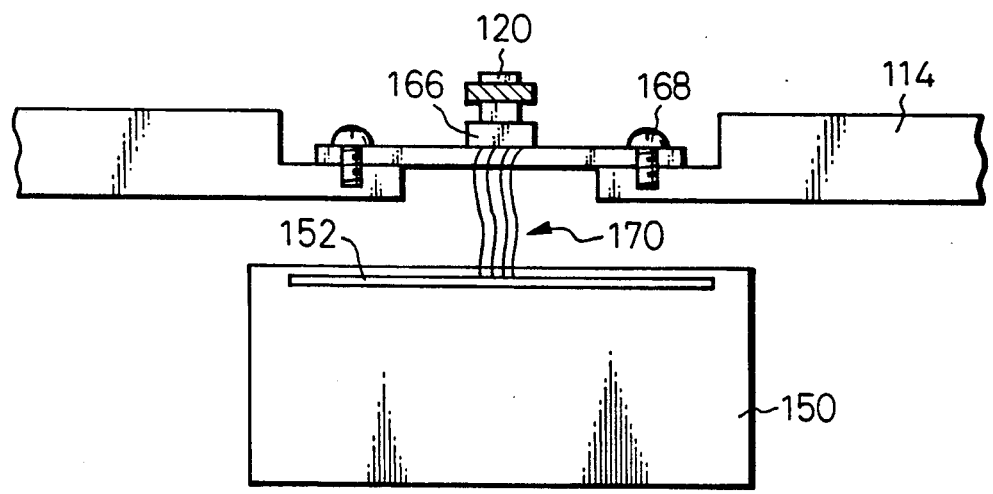
FIG. 28 is a view showing a fourth example of the constitution for fixing the location of the LSI under test relative to the vibration-removing base.

Also, where a deterioration in the frequency band of a signal fed to the LSI is permitted to a certain extent, as shown in FIG. 28, by fixing the LSI chip 120 and a socket 166 mounting the chip, e.g., by means of screws 168, to the vibration-removing base 114 and connecting them via a flexible wiring 170 to the DUT board 152, it is possible to prevent the LSI chip from receiving the effect of vibration.

In the constitution of the LSI testing apparatus, it is necessary to arrange the optical microscope and the probing head (scanning type probe and optical sampling means) so as not to interfere with each other. Also, it is necessary to pay a special attention to a reduction of the weight of the scanning type probe portion for the purpose of assurance of a sufficient scanning speed thereof.

Figure 29A:
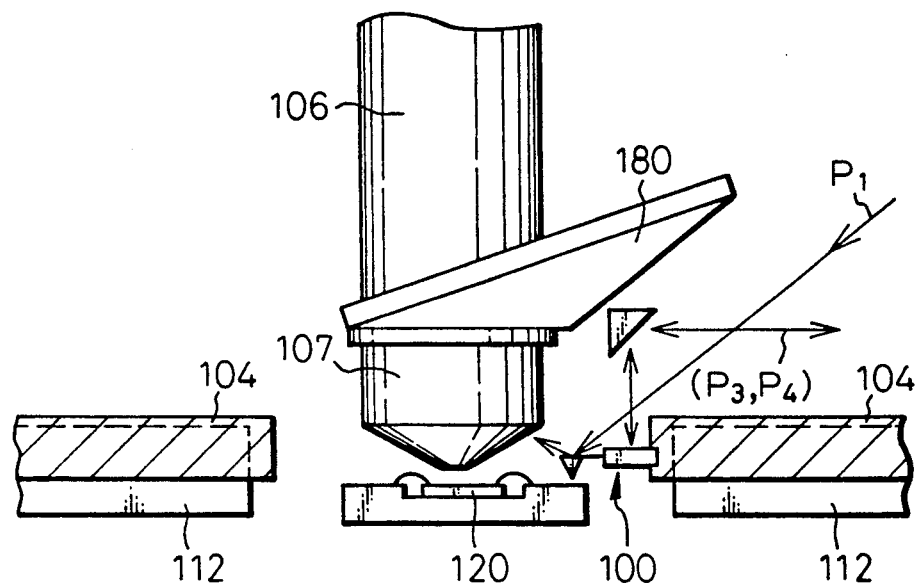
FIGS. 29a and 29b are views showing a constitution for preventing interference between the optical microscope and the probe.
Figure 29B:
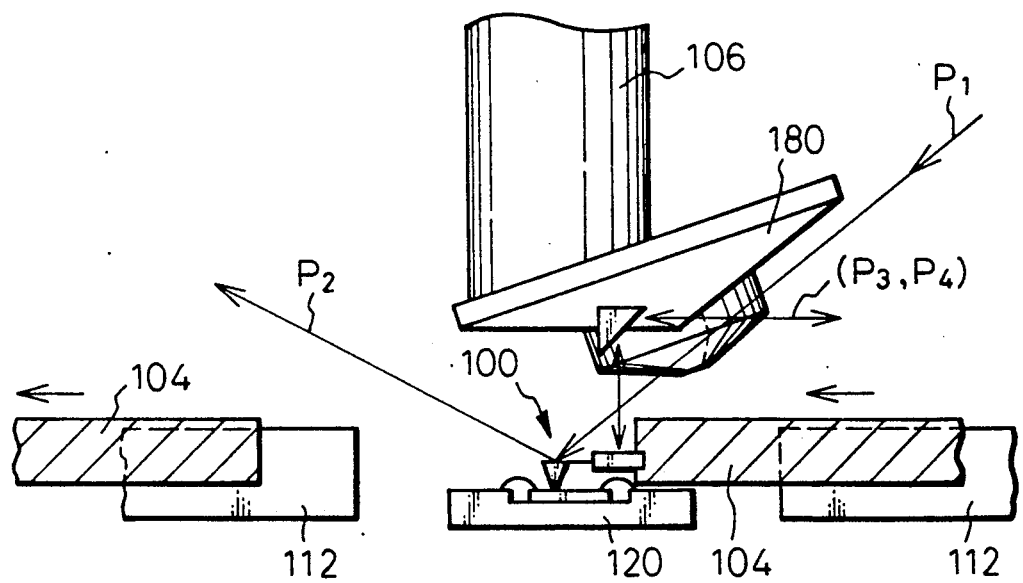

An example shown in FIGS. 29a, 29b is constituted such that it is possible to move an objective lens 107 of the optical microscope 106 to a position free from interference by means of a rotation holder 180 attached to the optical microscope, and that it is possible to move the probing head to a position free from interference by a movement of the stage 104 for the probing head. Accordingly, except when the LSI observation by the optical microscope 106 is carried out, i.e., in the voltage measurement (see FIG. 29b), it is possible to prevent interference between the optical microscope and the probing head by moving the objective lens 107 to a position free from interference by the probing head.

Figure 30A:
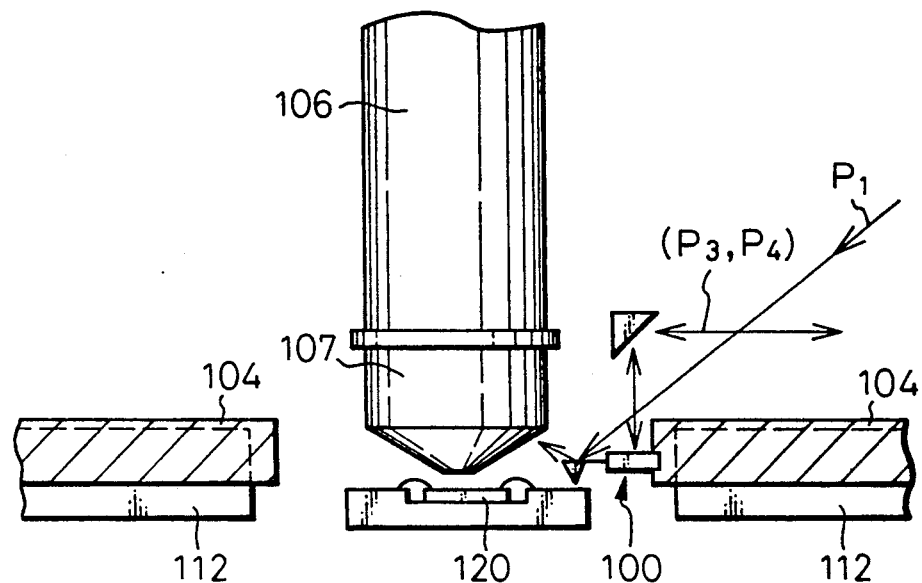
FIGS. 30a and 30b are views showing another constitution for preventing interference between the optical microscope and the probe.
Figure 30B:
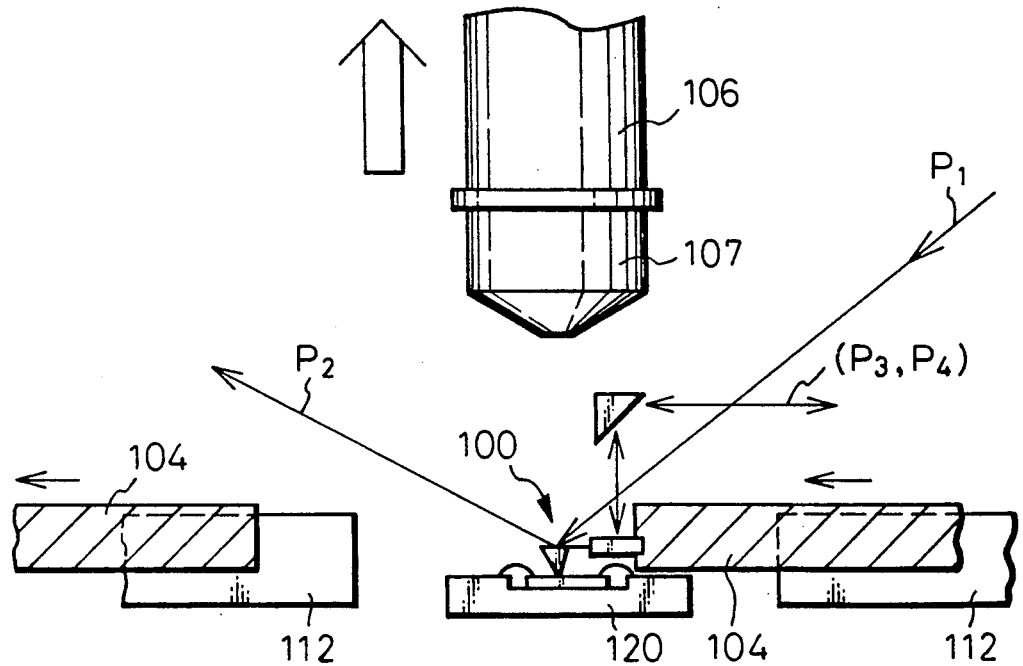
Figure 31A:
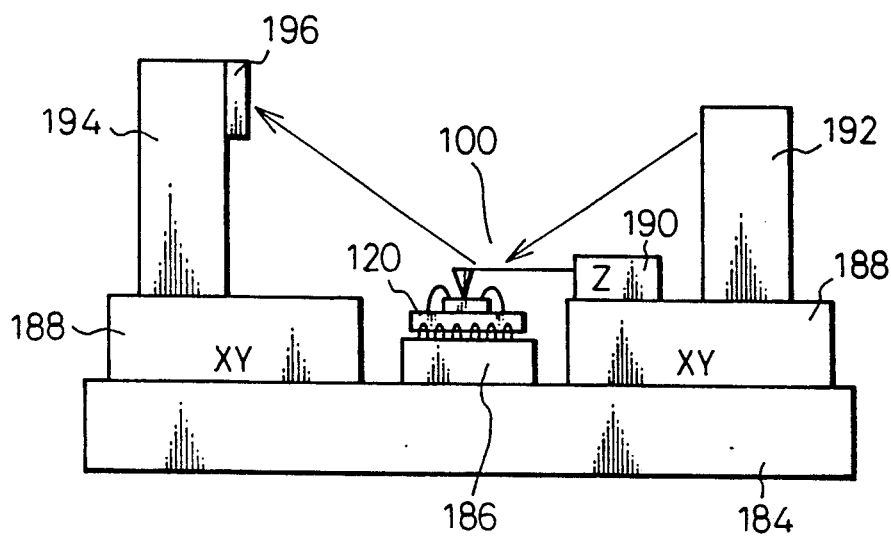
FIGS. 31a and 31b are views schematically showing a constitution of the probe scanning system in the embodiment of FIG. 19, in contrast with a conventional AFM scanning system.
Figure 31B:
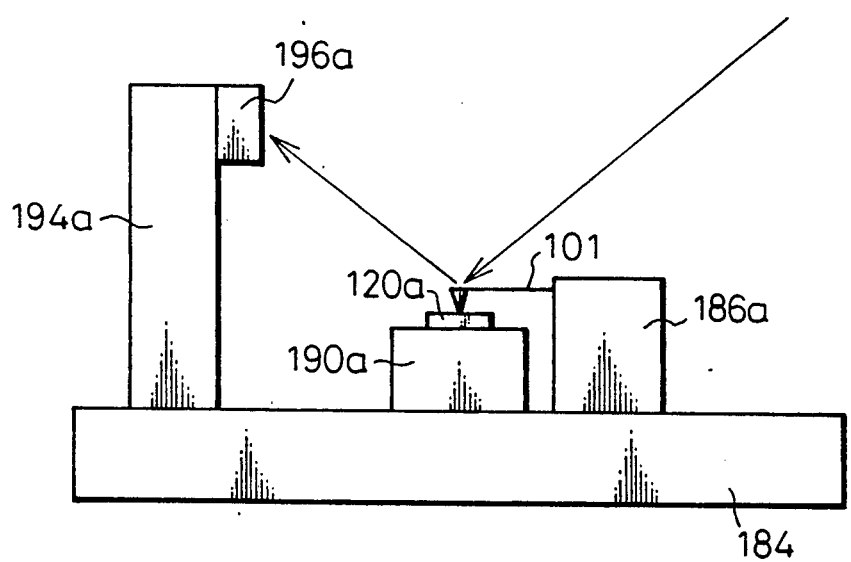

Also, as shown in FIGS. 30a, 30b, by constituting so that the optical microscope 106 is mechanically movable toward above in the Z direction in the voltage measurement (see FIG. 30b), it is possible to avoid interference as well. FIGS. 31a and 31b schematically show the constitution (FIG. 31a) of the probe scanning system in the apparatus of FIG. 19, in contrast with the constitution (FIG. 31b) of a conventional AFM scanning system.

In the illustration, reference 100 denotes a scanning type probe; reference 101 a cantilever of an AFM; reference 120, 120a a sample; reference 184 a vibration-removing base; reference 186, 186a a base; reference 188 a stage movable in the direction of XY; reference 190, 190a a stage movable in the direction of Z; reference 192 a laser optical system for displacement measurement; reference 194,194a a base; and reference 196, 196a a position sensitive detector (PSD).

Figure 32A:
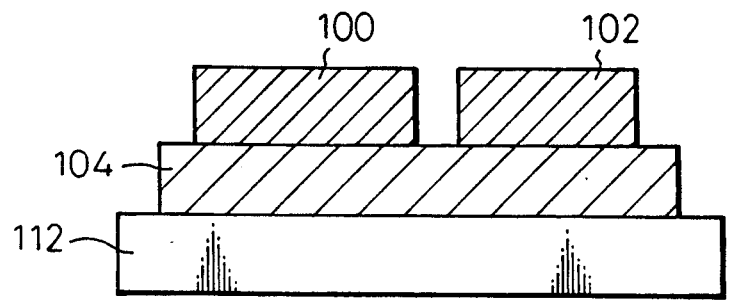
FIGS. 32a to 32c are views showing examples of the arrangement of stages for reducing the weight of the probe scanning system.
Figure 32B:
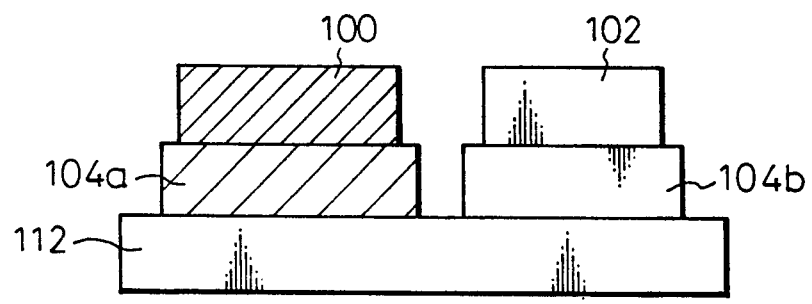
Figure 32C:
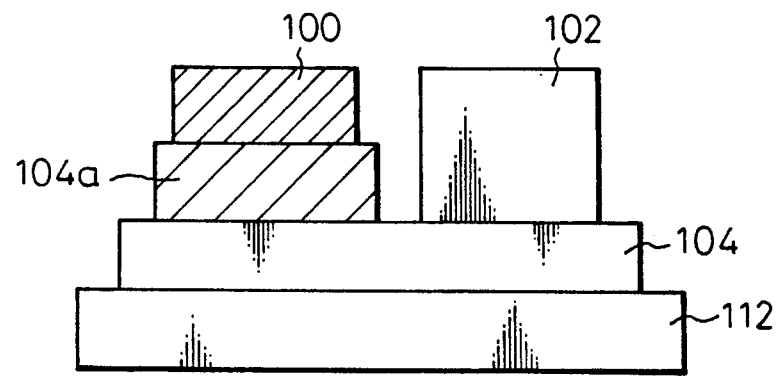

FIGS. 32a to 32c show examples of the arrangement of stages for reducing the weight of the probe scanning system. In the illustration, a hatched portion indicates a portion requiring scanning.

FIG. 32a shows a constitution in which the scanning type probe 100 and the sampling optical system 102 are mounted on the stage 104 for the probing head and thus the entire stage is AFM-scanned. This arrangement is disadvantageous in that the weight of the entire stage is heavy and thus the scanning speed is lowered. Accordingly, the arrangement is not realistic.

As a more realistic arrangement, FIG. 32b shows a constitution in which an AFM stage 104a and a stage 104b are separately mounted on the stage 112 and they are moved synchronously to each other. Sinse the weight of the AFM stage 104a is made lighter, the scanning speed is improved.

Figure 34:
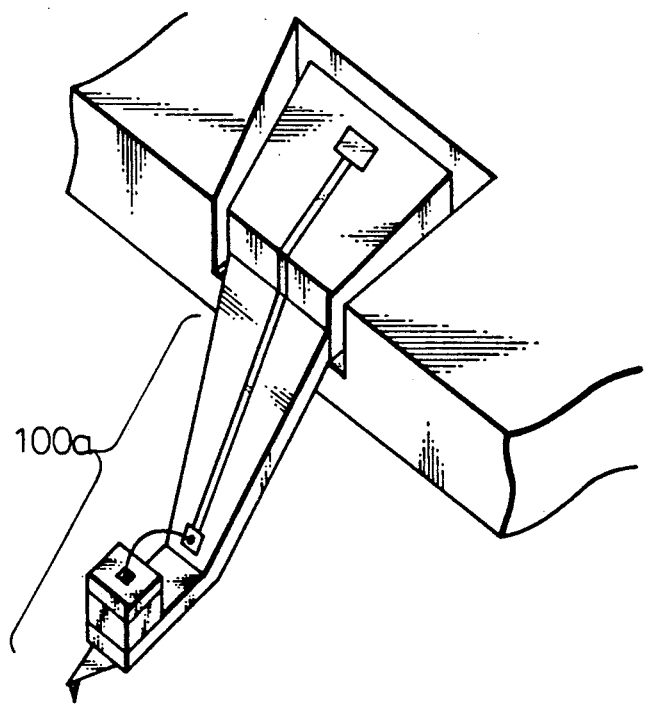
FIG. 34 is a perspective view showing a structure of the end portion of the AFM stage of FIG. 33.
Figure 35:
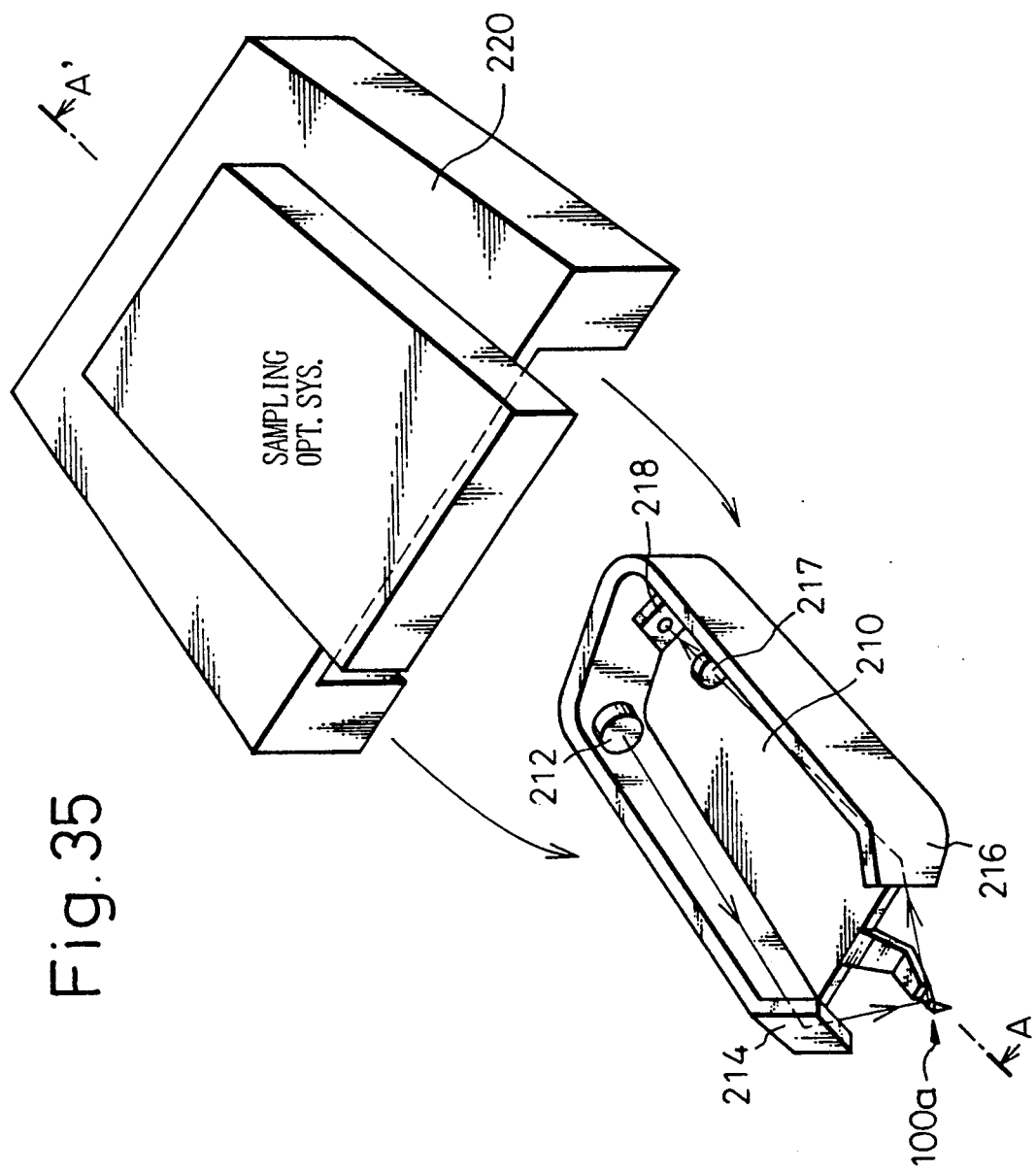
FIG. 35 is a perspective view showing a constitution of the AFM stage of FIG. 33, combined by the stage for the probe head.

FIG. 32c shows a constitution in which the AFM stage 104a is mounted on the stage 104. Since the scanning range of the scanning type probe 100 is approximately 5 to 6 μm, the precision of movement of the stage 104 is sufficient even in approximately 2 μm. For example, there is proposed a constitution in that an AFM stage 210 shown in FIGS. 33, 34 is carried or held by a stage 220 for the probing head shown in FIG. 35.

Figure 33:
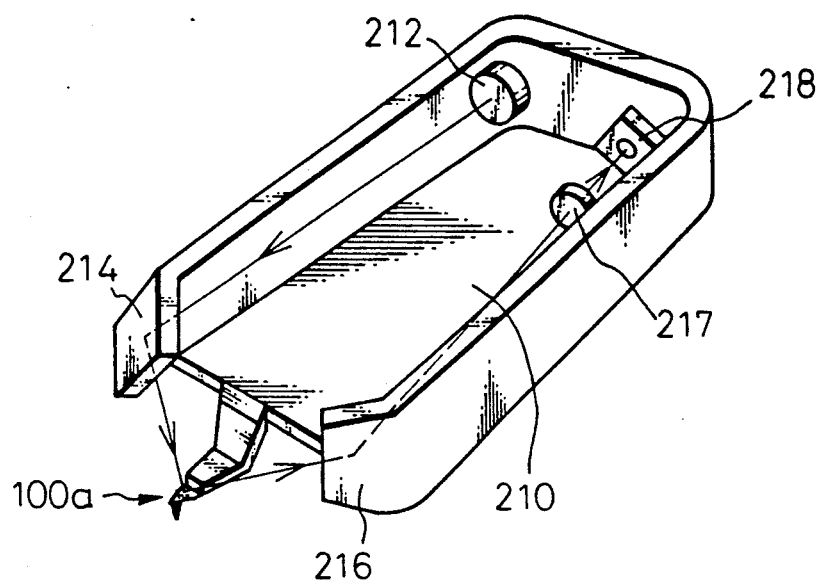
FIG. 33 is a perspective view showing an example of mounting of the AFM stage adapted for light weight and small size.
Figure 36:
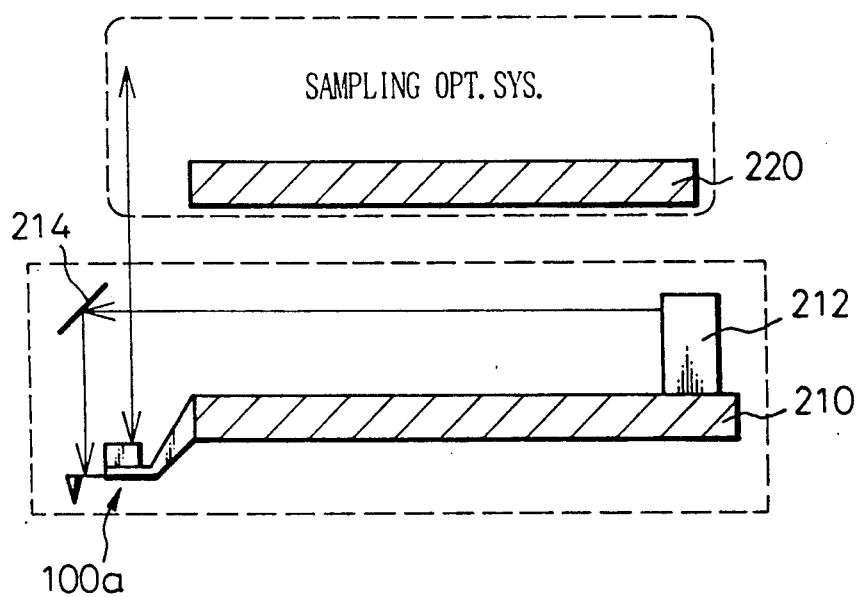
FIG. 36 is a schematical sectional view along the line A—A' in FIG. 35.

Note, in FIG. 33, reference 212 denotes a laser source for displacement measurement of the cantilever; reference 214 denotes a mirror for directing the laser beam from the laser source 212 to the cantilever of the scanning type probe 100a; and reference 216 denotes a mirror for directing a laser beam reflected from the cantilever to the light receiving system (lens 217 and PSD 218). Also, FIG. 36 schematically shows a sectional structure along the line A—A' in FIG. 35.

Figure 37A:
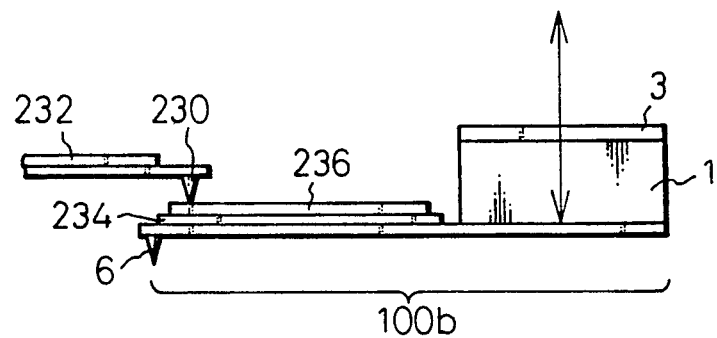
FIGS. 37a to 37c are views showing a constitution of the probe displacement detecting means adapted for small size.
Figure 37B:
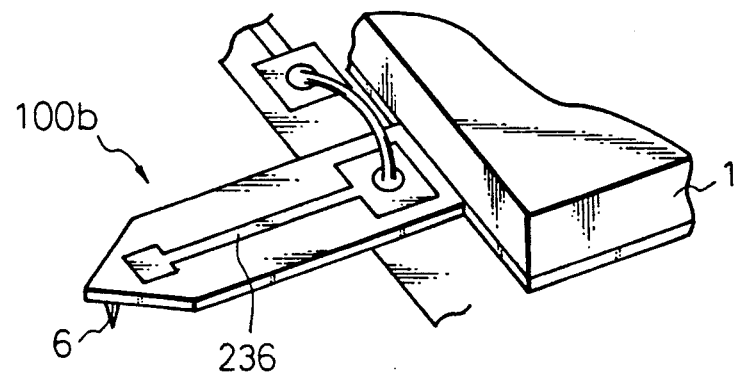
Figure 37C:
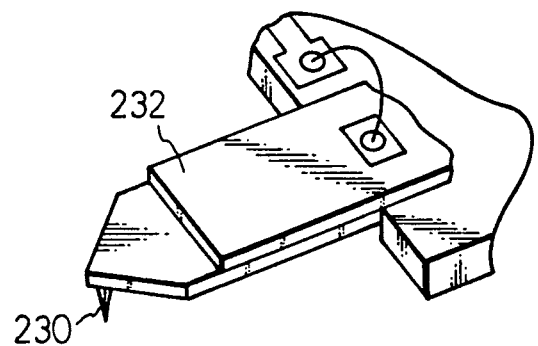
Figure 38A:
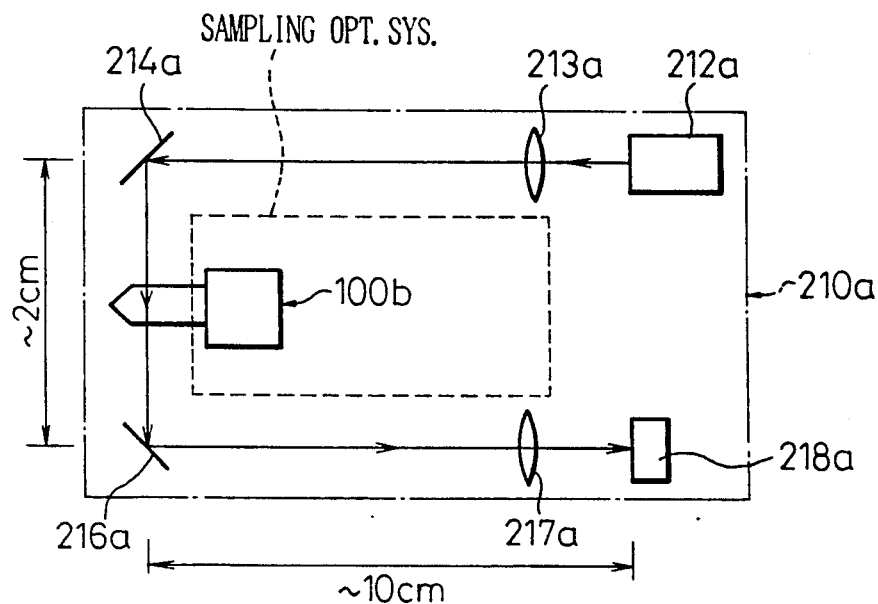
FIGS. 38a and 38b are plan views showing examples of the AFM optical system adapted for light weight and small size.
Figure 38B:
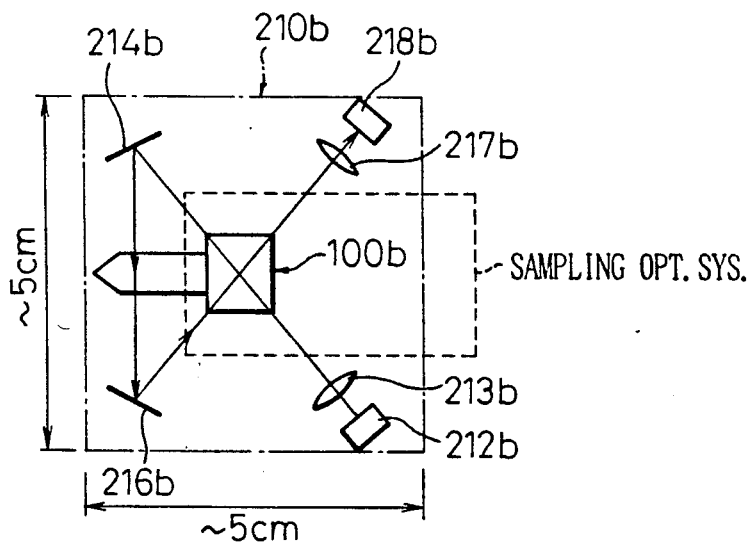

To realize a small size and a light weight of the portion of the AFM stage, it is effective to realize a small size of a displacement detecting means in the AFM optical system. For example, as shown in FIGS. 37a to 37c, by providing means for measuring a displacement in the Z direction of the probe 6 of a scanning type probe 100b by means of a scanning tunnel microscope (STM) probe 230, it is possible to suppress the height and dimension of the AFM stage and thus realize a small size thereof. Also, as shown in FIGS. 33, 36, 38a and 38b, by bending the optical path of the laser beam for displacement measurement of the cantilever, it is possible to realize a small size and a light weight of the portion of the AFM stage.

Figure 39A:
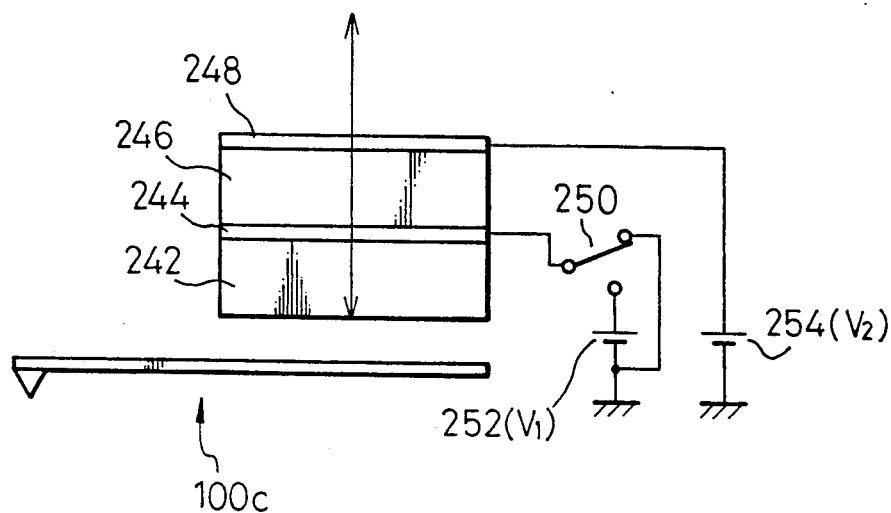
FIGS. 39a and 39b are views showing an example of the probe attaching/detaching mechanism.
Figure 39B:
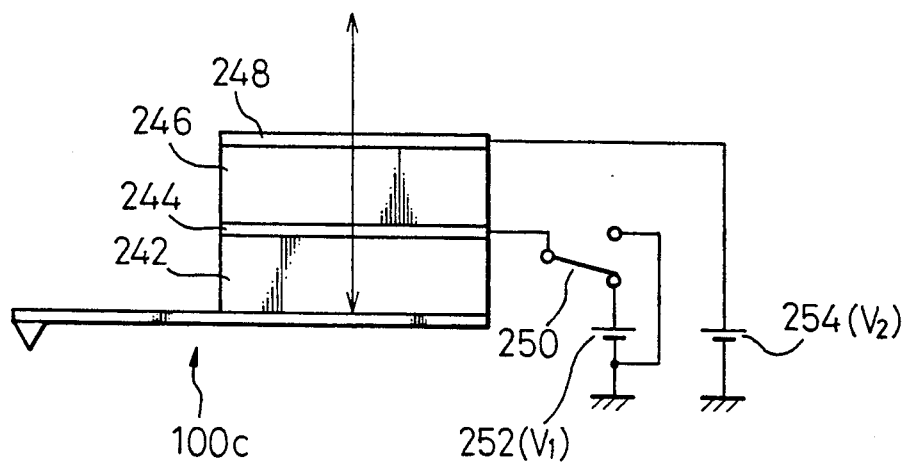
Figure 40:
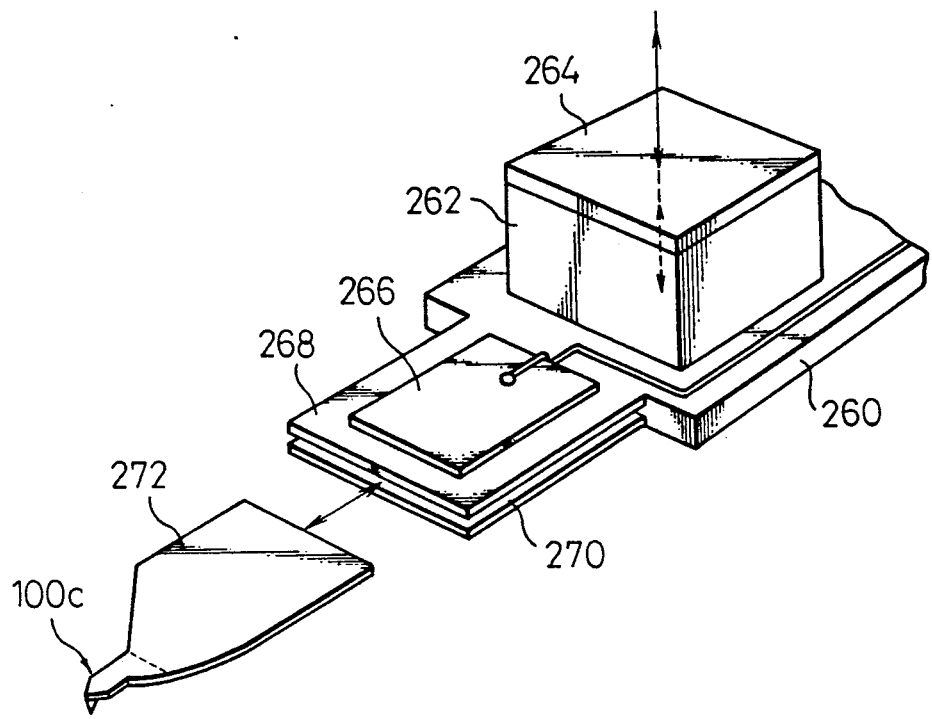
FIG. 40 is a view showing another example of the probe attaching/detaching mechanism.

Also, since the size of a portion, contacted with a measurement wiring, of the scanning type probe is below 1 μm and thus the portion is mechanically weak, it is preferable to easily exchange the probe portion. FIGS. 39a, 39b and 40 show examples of the probe attaching/detaching mechanism.

In the constitution shown in FIGS. 39a, 39b, a laminating structure including EO crystals 242, 246 and transparent electrodes 244, 248 is provided. The transparent electrode 244 is switchably connected via a switch 250 to a power source 252 with a holding voltage $V_1$, and the transparent electrode 248 is connected to a power source 254 with a bias voltage $V_2$. FIG. 39a shows a release state in which the probe 100c is detached from the EO crystal 242, while FIG. 39b shows a holding state in which the probe 100c is attached to the EO crystal 242 by means of an electrostatic force.

The example shown in FIG. 40 is constituted such that an EO crystal 262 is held by a diaphragm 260 and a base body 272 holding the scanning type probe 100c is held by an upper lead portion 268 and a lower lead portion 270 expanded by a piezoelectric film 266 provided on the diaphragm 260. According to the constitution, there is obtained an advantage in that the EO crystal 262 can be protected because the crystal and the base body 272 are perfectly separated from each other.

Figure 41:
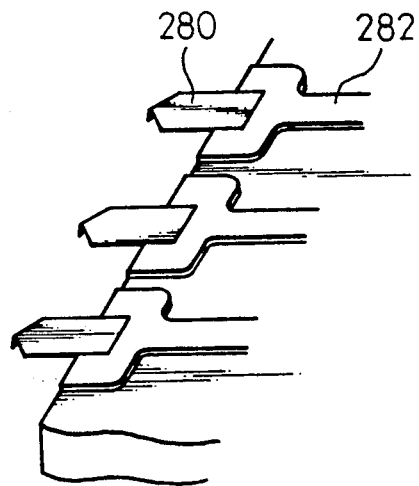
FIG. 41 is a view showing an example of the holding mechanism of spare probes.

FIG. 41 schematically shows an example of the holding mechanism of spare probes. In the example, an electrode 282 for electrostatically absorbing a corresponding spare probe is provided for each spare probe 280.

Figure 42:
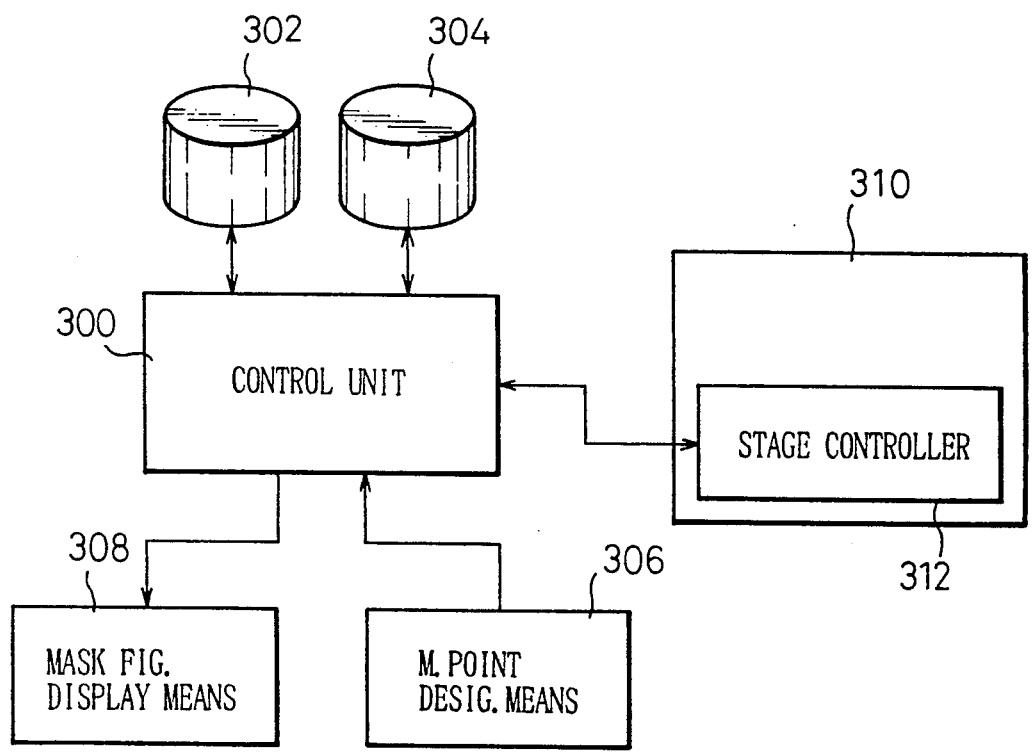
FIG. 42 is a block diagram showing a constitution of the LSI testing apparatus adapted for facilitating the positioning of a voltage measurement point.

FIG. 42 illustrates a constitution of the LSI testing apparatus adapted for facilitating the positioning of a voltage measurement point. In the constitution, reference 300 denotes a control unit for controlling the positioning; reference 302 a design data base in which information on a mask figure of the LSI (layout information) is stored; reference 304 a memory means for storing alignment information for use in a determination of stage coordinates for displaying wiring patterns, which are designated by a coordinate system (CAD coordinates) of the mask figure and coordinates of mask figures in the control unit 300, in the microscope image; reference 306 a measurement point designating means (e.g., mouse or the like); reference 308 a mask figure displaying means (e.g., CRT or the like); and reference 310 a stage controller under control of the control unit 300. According to the constitution, it is possible to realize a swift coarse-movement to the measurement point and to determine a contact pressure of the scanning type probe by reading information on material of the measurement point from the design data base.

Figure 43:
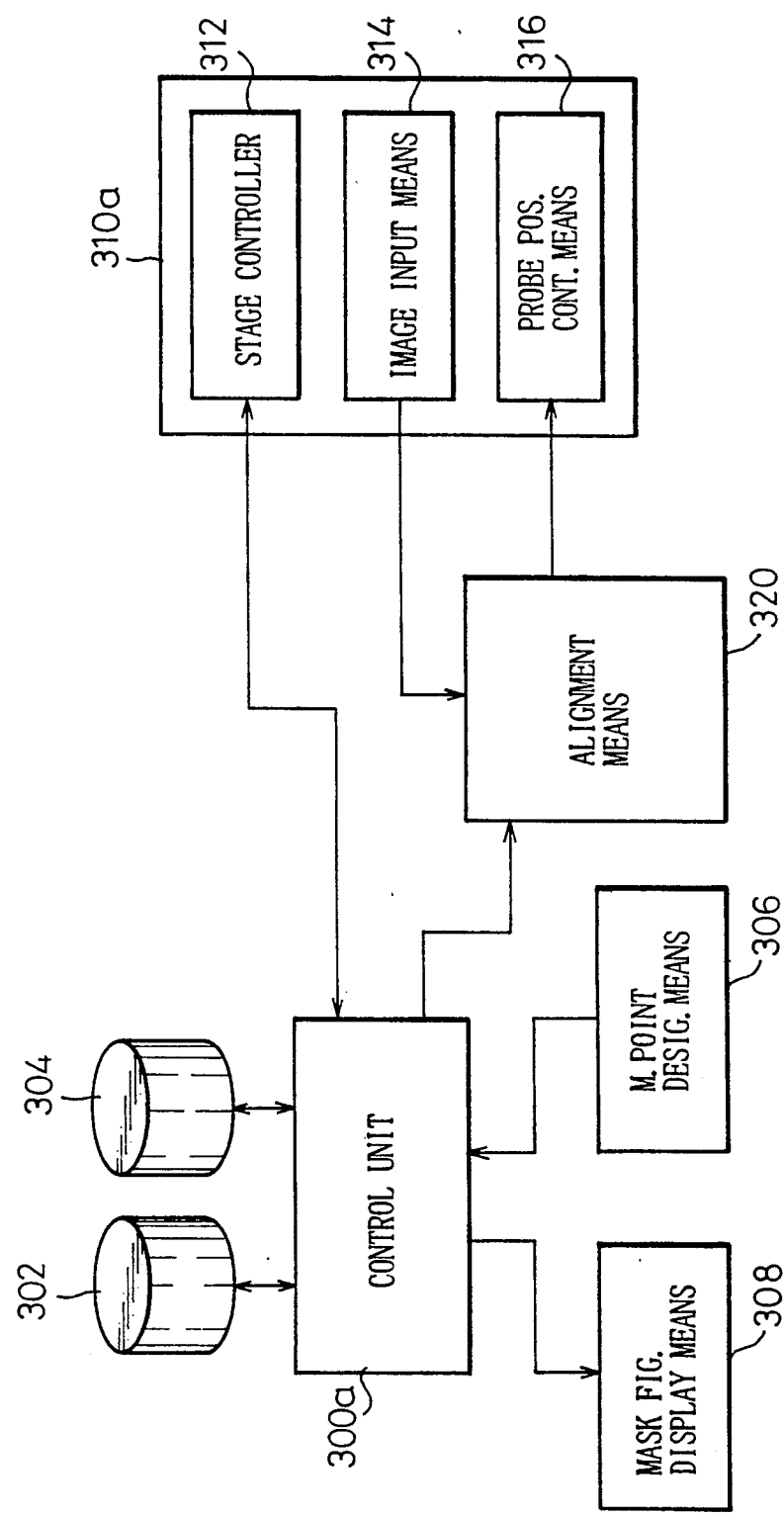
FIG. 43 is a block diagram showing a constitution of the LSI testing apparatus capable of effecting an alignment compensation by means of a pattern matching.

FIG. 43 illustrates a constitution of the LSI testing apparatus capable of effecting an alignment compensation by means of a pattern matching. According to the constitution, by providing an alignment means 320 for compensating the difference between the optical microscope image data fed through the image input means 314 and the mask figure data fed through the control unit 300a, it is possible to compensate the probe position coordinate to be fed to the probe position control means 316 and, together with information of a determined contact pressure, to effect an automatic probing.

Figure 44:
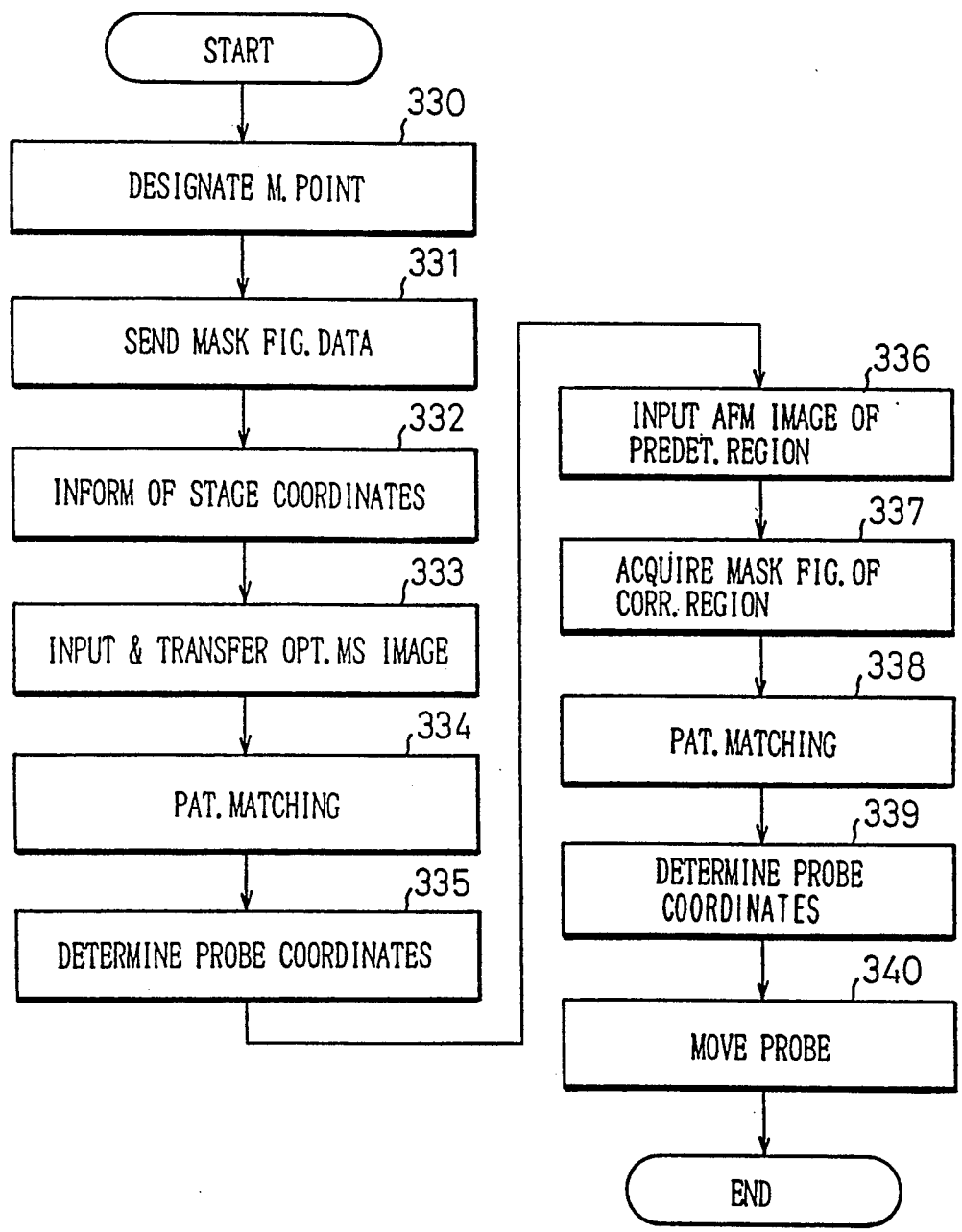
FIG. 44 is a flowchart representing a processing of the alignment compensation executed by the apparatus of FIG. 43.
Figure 45:
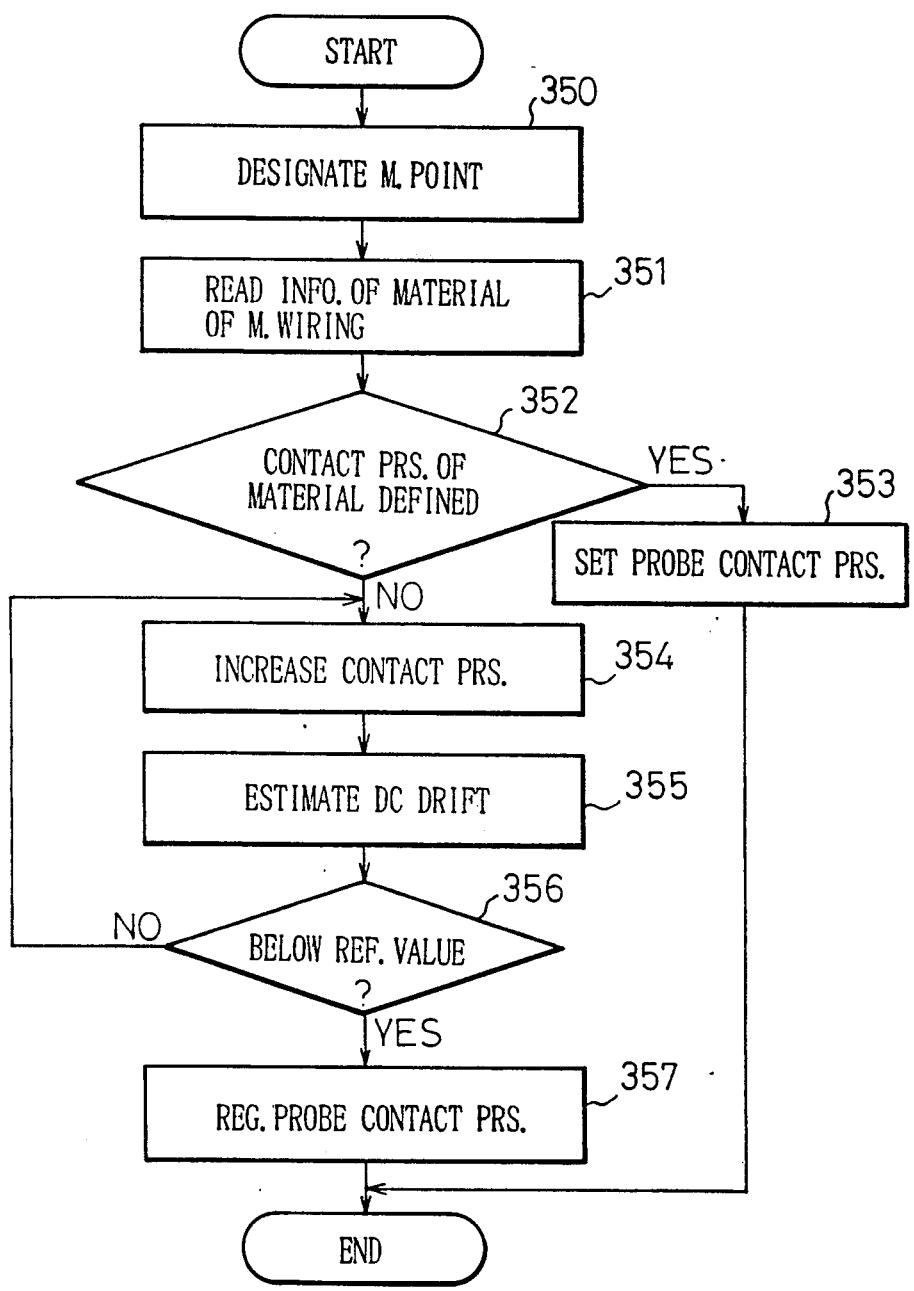
FIG. 45 is a flowchart representing a processing of the probe contact pressure determination executed by the apparatus of FIG. 43.

FIG. 44 shows an example of a processing of the alignment compensation executed by the apparatus of FIG. 43. Also, FIG. 45 shows an example of a processing of the probe contact pressure determination executed by the apparatus of FIG. 43.

Figure 46:
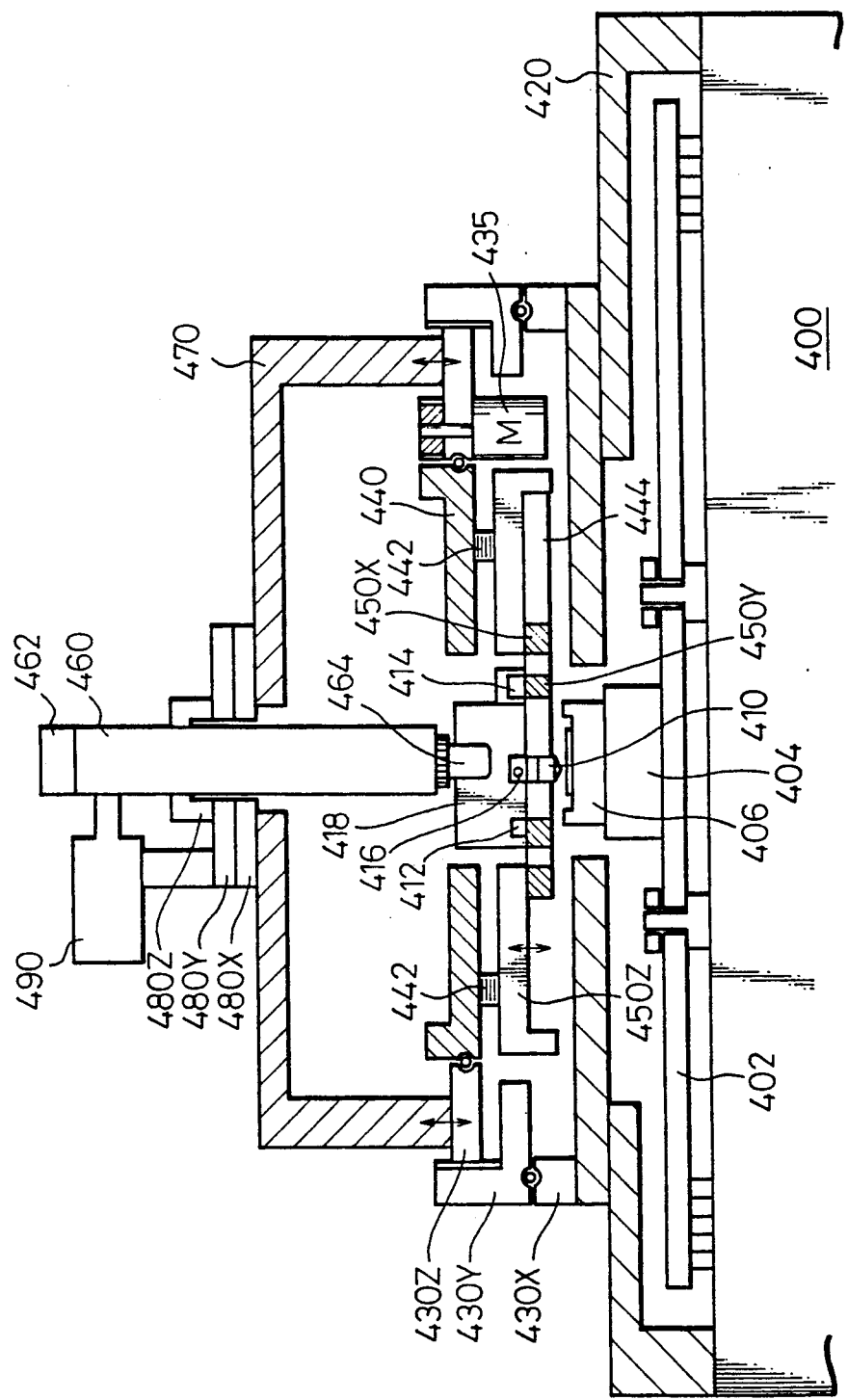
FIG. 46 is a view showing, partially in sectional, an example of a concrete arrangement and structure of the LSI testing apparatus according to the present invention.

FIG. 46 shows, partially in sectional, an example of a concrete arrangement and structure of the LSI testing apparatus according to the present invention.

In the illustration, reference 400 denotes a station part of the LSI tester which is a driving apparatus for the LSI; reference 402 a performance board; reference 404 an LSI socket; reference 406 an LSI chip which is the object of diagnosis and analysis; reference 410 a scanning type probe; reference 412 a laser source for displacement measurement of the cantilever; reference 414 a position sensor; reference 416 a voltage sensor portion; reference 418 a voltage measurement portion; reference 420 a probing frame fixed to the station part 400 of the LSI tester; reference 430X, 430Y, 430Z a stage coarse-movable in each direction of XYZ; reference 435 a motor; reference 440 a rotation stage driven by the motor 435; reference 442, 444 a piezoactuator; reference 450X, 450Y, 450Z a stage fine-movable in each direction of XYZ; reference 460 an optical microscope; reference 462 a CCD camera; reference 464 an objective portion of the optical microscope 460; reference 470 a frame for exclusive use of the optical microscope 460; reference 480X, 480Y, 480Z a three-dimensional stage movable by approximately 5 to 6 mm; and reference 490 a laser source for making a opening portion in an insulation film of the LSI. The laser source 490 shares an optical system of the optical microscope 460 and applies a laser beam having a diameter of 1 to 2 μm to the surface of the sample (LSI). Also, the fine-moving stage 450X, 450Y has a structure with a central portion and a plate spring forming portion (see FIG. 49). In the central portion, a supporting portion (see reference 452 in FIG. 49) for holding the scanning type probe 410 and the voltage sensor portion 416 is formed.

Figure 47:
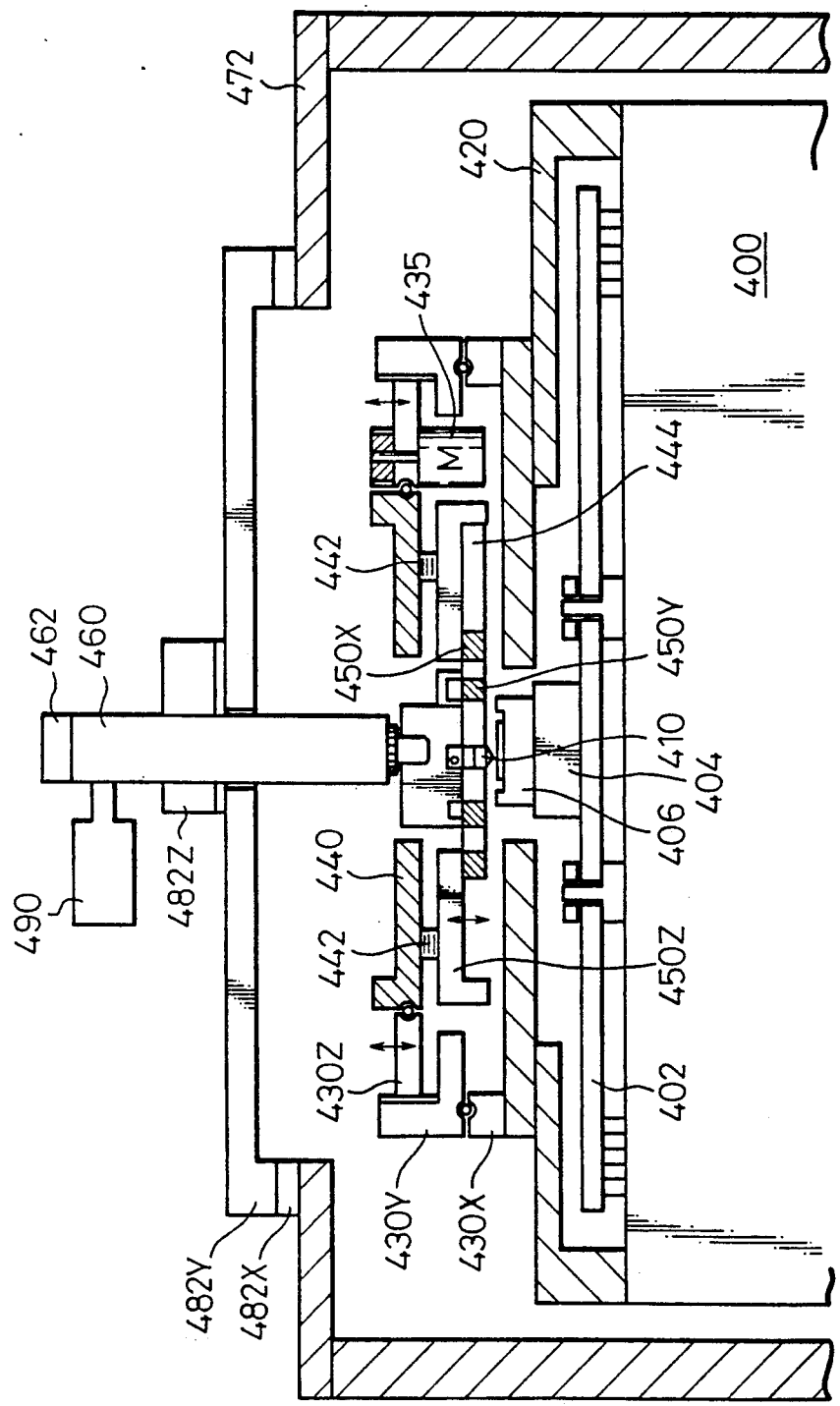
FIG. 47 is a view showing, partially in sectional, another example of a concrete arrangement and structure of the LSI testing apparatus according to the present invention.

FIG. 47 shows, partially in sectional, another example of a concrete arrangement and structure of the LSI testing apparatus according to the present invention.

In the present example, the optical microscope 460 is constituted independently of the LSI tester station part 400 and the probing frame 420, and mounted on a frame 472 for exclusive use thereof fixed to a floor, via stages 482X, 482Y, 482Z coarse-movable in each direction of XYZ. According to the constitution, it is possible to remove a disadvantage in that a vibration in the optical microscope 460 has a direct influence on the AFM scanning system. As a result, it is possible to stably obtain an AFM image.

Figure 48:
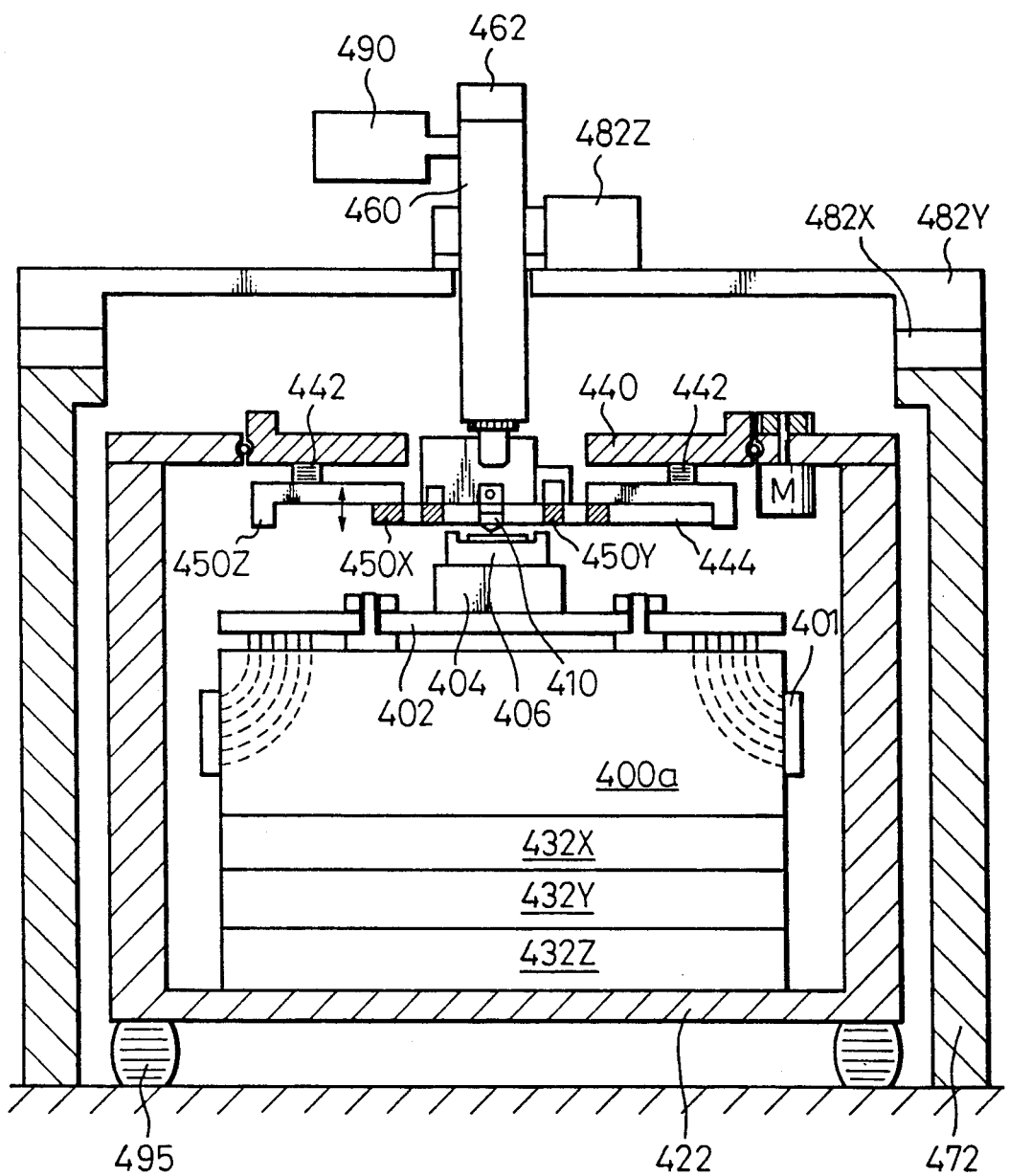
FIG. 48 is a view showing, partially in sectional, a still another example of a concrete arrangement and structure of the LSI testing apparatus according to the present invention.

FIG. 48 shows, partially in sectional, a still another example of a concrete arrangement and structure of the LSI testing apparatus according to the present invention.

In the present embodiment, a probing frame 422 mounts thereon coarse-moving stages 432X, 432Y, 432Z and an LSI mounting base 400a. Moreover, the LSI mounting base 400a mounts thereon the performance board 402, the LSI socket 404 and the LSI chip 406 in order. Also, the rotation stage 440 driven by the motor (M) is provided in engagement with the probing frame 422. Note, reference 401 denotes a connector for inputting an LSI drive signal, which is finally fed to the LSI chip 406. Also, reference 495 denotes a vibration-removing mechanism.

Other constitution and the operation thereof are the same as those of FIG. 47 and thus the explanation thereof is omitted.

FIG. 49 schematically illustrates a constitution of the mountings on the fine-moving stage (XY stages 450X, 450Y in FIGS. 46 to 48).

In the illustration, six plate springs A to F are provided in each of the four corner portions of the fine-moving stage so that the stage is fine-movable in the two-dimensional direction by pressures of the piezoactuators 444X, 444Y from the respective directions.

Figure 50A:
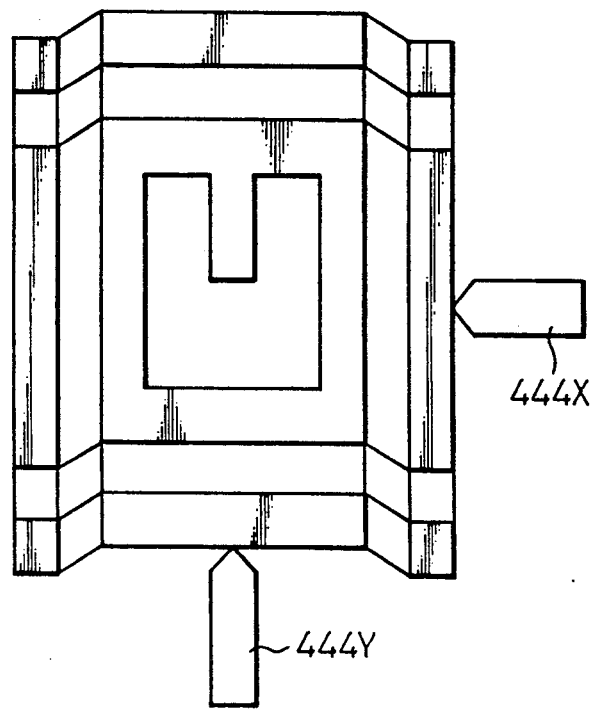
FIGS. 50a and 50b are views for explaining the operation of the fine-moving stage of FIG. 49.
Figure 50B:
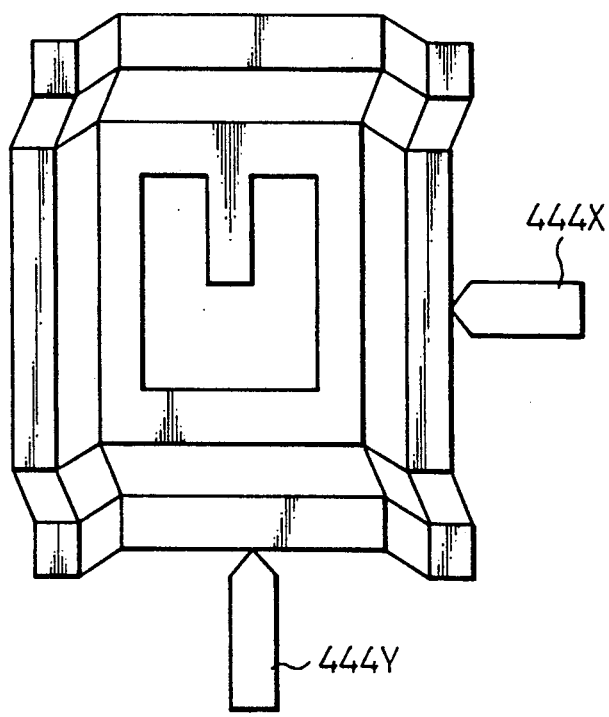

FIGS. 50a and 50b schematically show the manner of operation of the fine-moving stage based on the functions of the plate springs.

Figure 51A:
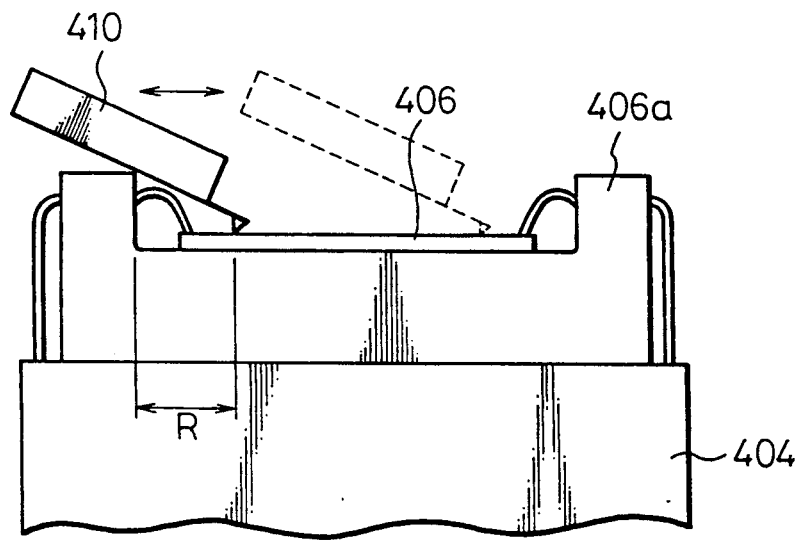
FIGS. 51a and 51b are views for explaining the necessity of the turning stage.
Figure 51B:
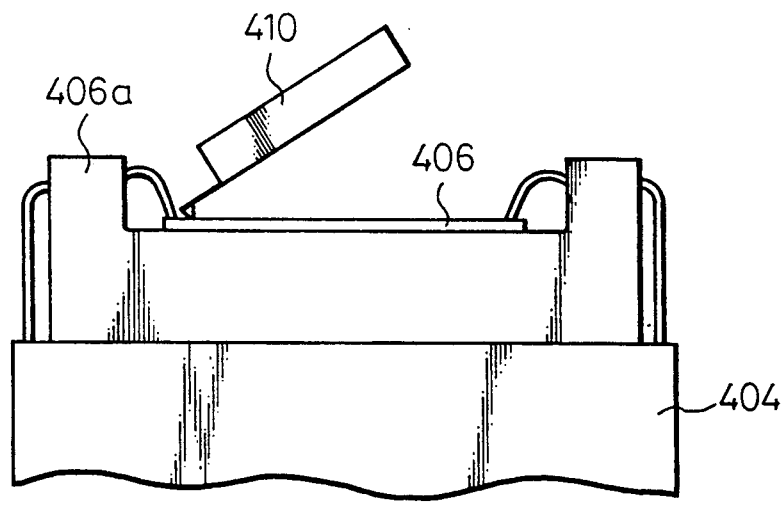

FIGS. 51a and 51b are views showing the reason for the necessity of the rotation stage in the probing to a packaged LSI chip. In FIG. 51a, reference R denotes a region in which the probing cannot be carried out, i.e., the measurement is impossible. As shown in FIG. 51b, however, by rotating the rotation stage by 180° to change the orientation of the probe 410, it is possible to observe the entire surface of the LSI chip 406.

Figure 52:
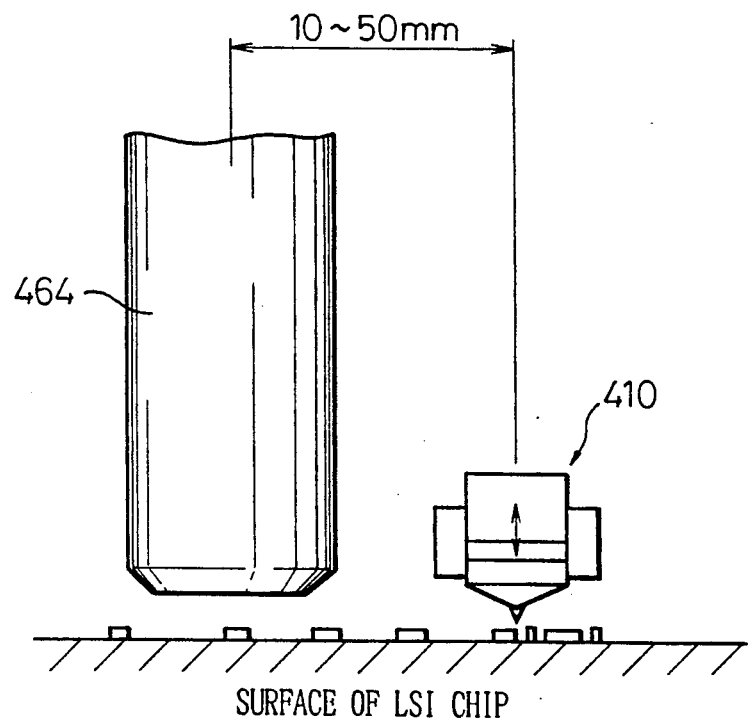
FIG. 52 is a view showing a constitution in the case that the optical microscope and the AFM probe are selectively used.

Although, in the above example, the probe is always within the field of sight of the optical microscope, this is not restrictive. For example, as shown in FIG. 52, by keeping the probe 410 away from an objective lens 464 of the optical microscope with a constant distance (10 to 50 mm) and selectively using the optical microscope and the AFM probe, it is possible to observe both of the microscope images.

FIGS. 53a, 53b to 56 and FIG. 49 illustrate the arrangement and structure of laser optical systems for realizing a low profile contributing to a reduction in scale of the apparatus.

Basically, the optical system is constituted such that the optical path of a laser beam for displacement measurement and the optical path of a laser beam for voltage measurement are both present within a predetermined range of height as small as possible.

Referring to FIG. 49, both the laser beam for displacement measurement of the cantilever and the laser beam for voltage measurement are propagated in the horizontal direction in the greater part of the optical paths.

Figure 53A:
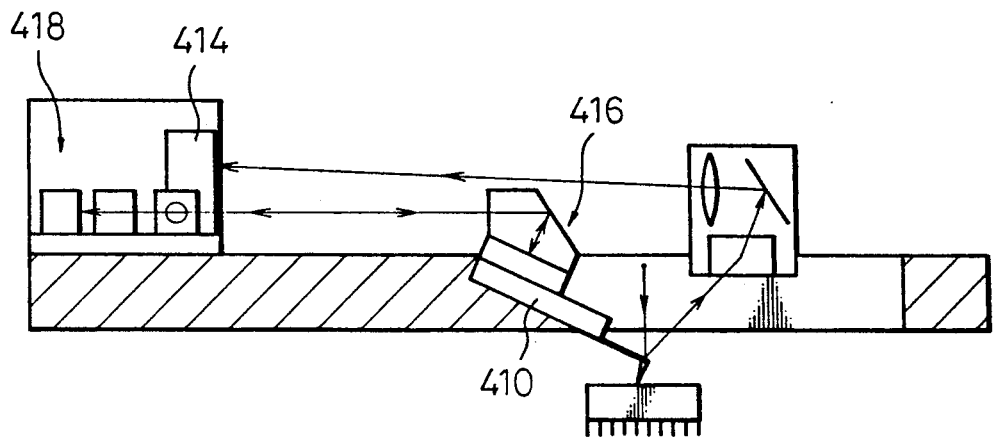
FIGS. 53a and 53b are schematical sectional views along the lines P—P' and Q—Q' in FIG. 49.
Figure 53B:
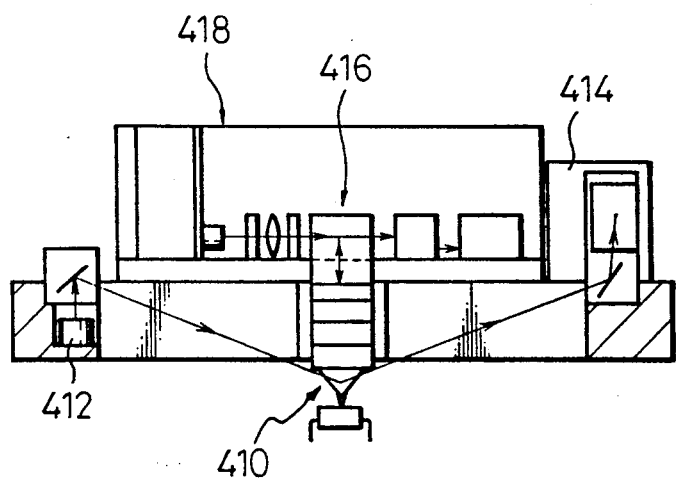

FIGS. 53a, 53b schematically show sectional structures along the lines P—P' and Q—Q' in FIG. 49. From the illustration, it will be appreciated that it is possible to secure a space enough to arrange the objective lens of the optical microscope above the scanning type probe 410.

Figure 54:
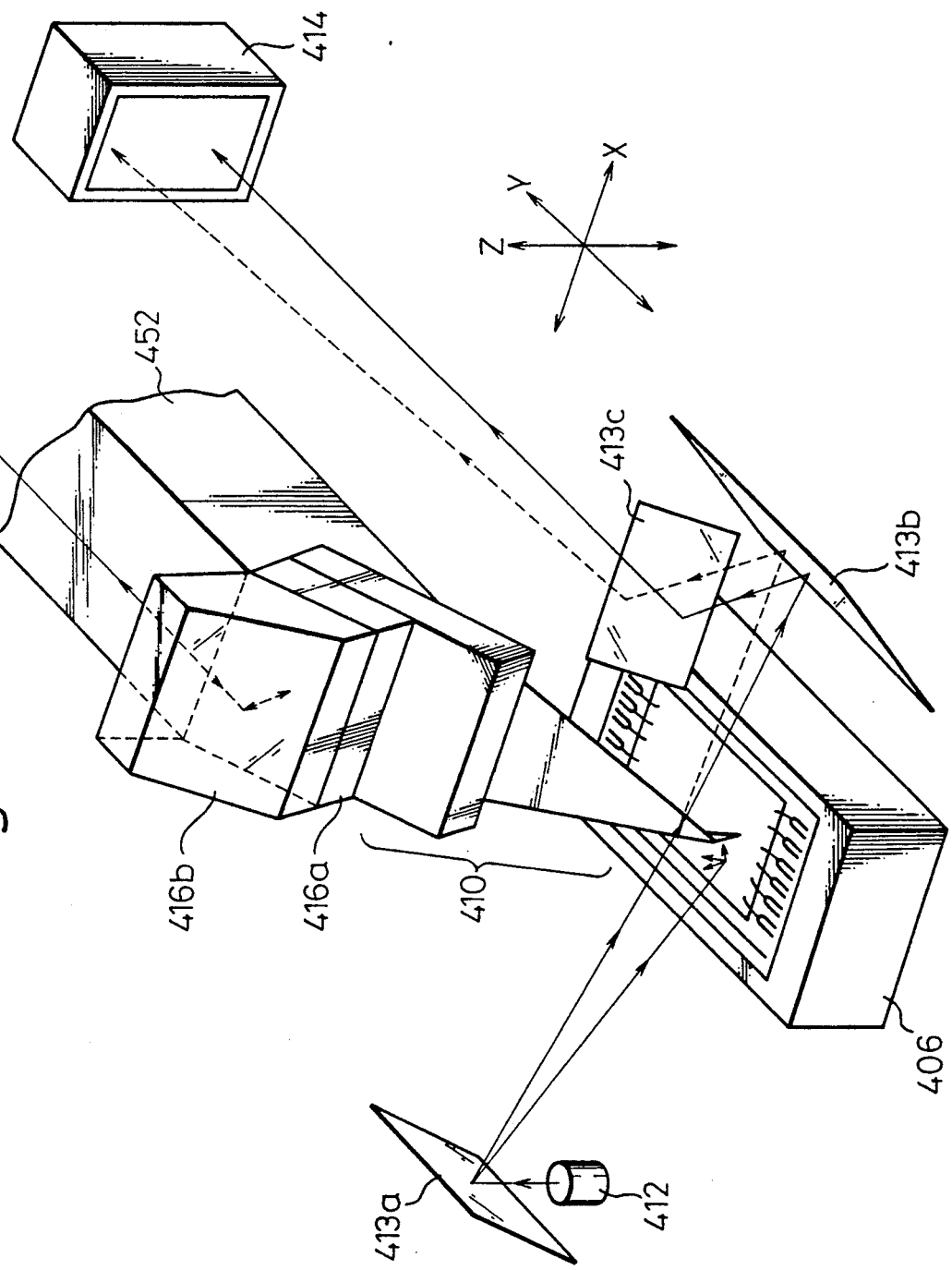
FIG. 54 is a detailed view showing the optical path of a laser beam in FIG. 49.

FIG. 54 shows, in detail, two optical paths of the laser beam for displacement measurement in FIG. 49. Note, reference 413a denotes a mirror for regulating the application position of the laser beam to the cantilever or the surface of the sample; reference 413b, 413c a reflection mirror; reference 416a an electro-optic crystal; and reference 416b a reflecting means (prism).

Figure 55:
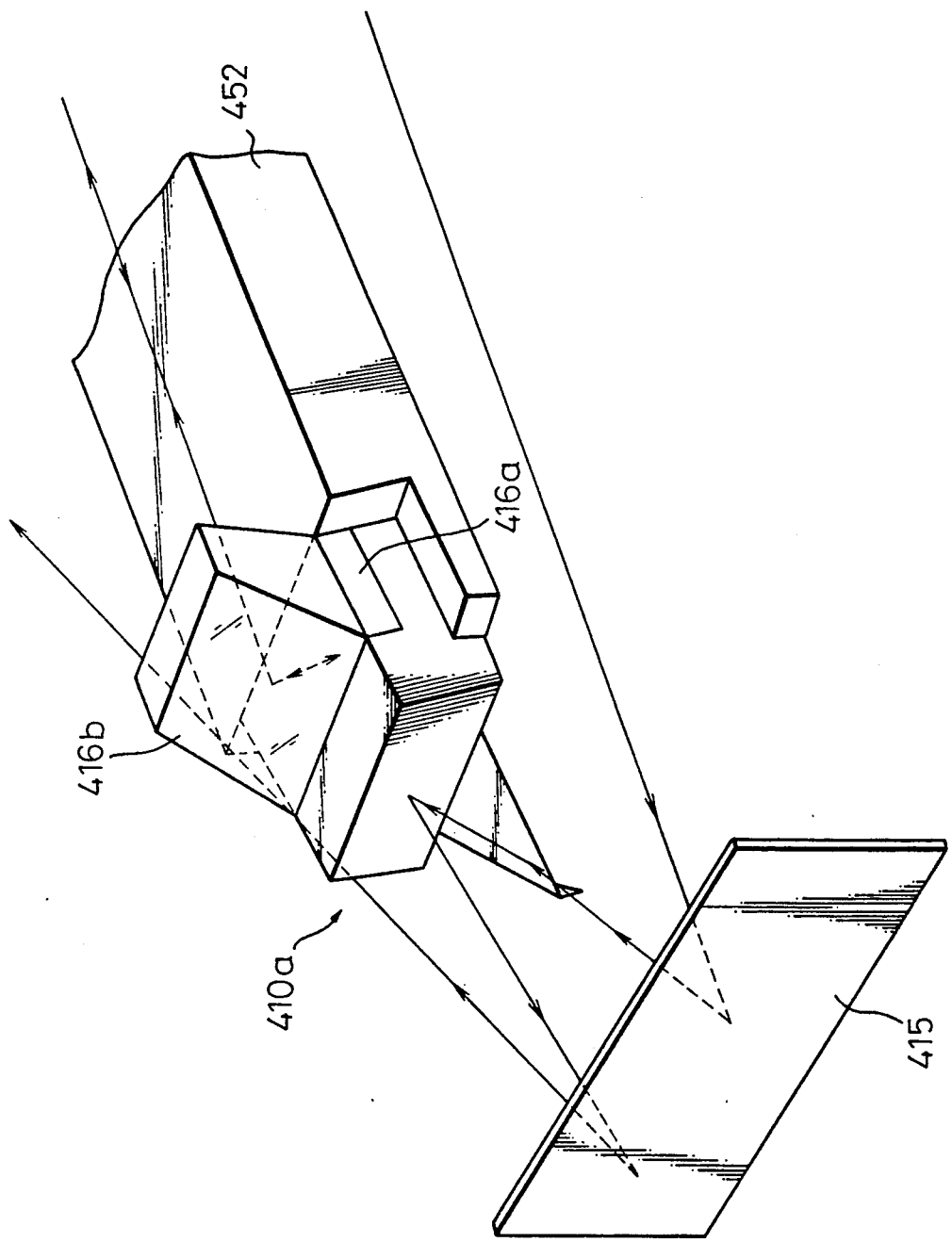
FIG. 55 is a view showing another example of the optical path of a laser beam for realizing a low profile laser optical system.

FIG. 55 shows another example of the optical path of a laser beam for realizing the low profile laser optical system.

In the illustration, the optical system for displacement measurement is constituted to have an optical path which is substantially parallel to the supporting portion 452 and in which the laser beam is sequentially reflected on a mirror 415 provided in the front side of the probing portion 410a, the reflection surface of the cantilever, an end surface of a substrate of the probing portion 410a, and the mirror 415, and finally returned to the direction of the supporting portion 452. Note, the incident angle of the laser beam on the reflection surface of the cantilever is selected to be 70° to 80°.

Figure 56:
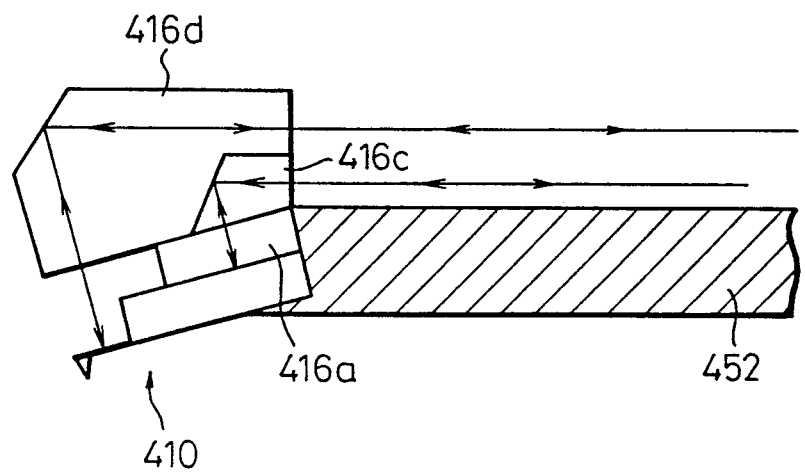
FIG. 56 is a view showing a still another example of the optical path of a laser beam for realizing a low profile laser optical system.

FIG. 56 shows a still another example of the optical path of a laser beam for realizing the low profile laser optical system.

In the illustration, the optical system for displacement measurement and the optical system for voltage measurement are constituted such that the respective optical paths of laser beams incident thereon are substantially parallel to each other and the respective laser beams are irradiated on the cantilever and the voltage sensor portion, respectively, by means of reflecting means (prisms 416d, 416c), and the respective reflected beams are propagated inversely to the respective incident optical paths.

Figure 57:
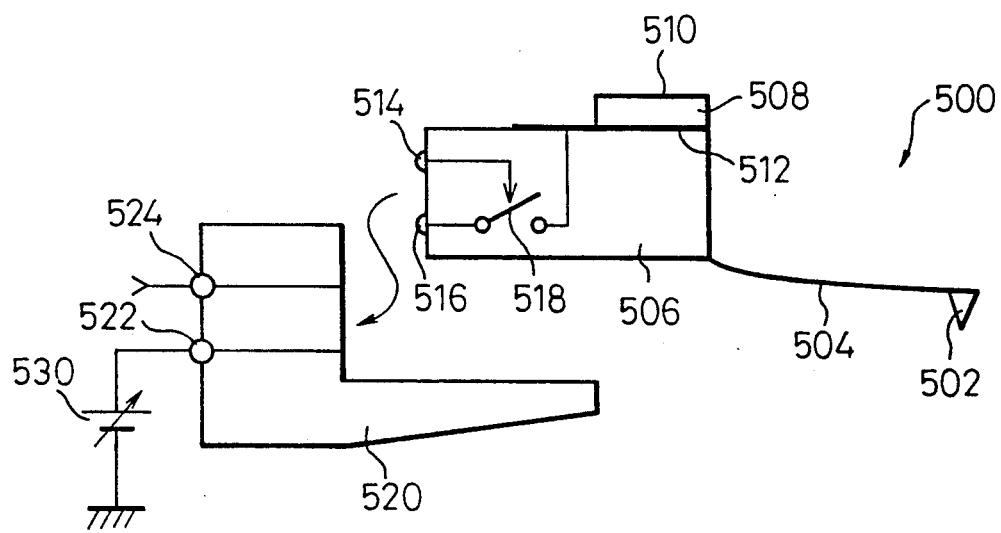
FIG. 57 is a view showing a constitution of the probing device in another embodiment of the LSI testing apparatus according to the present invention.

FIG. 57 shows a constitution of the probing device in another embodiment of the LSI testing apparatus according to the present invention.

In the illustration, reference 500 denotes a scanning type probe; reference 502 a minute probe; reference 504 a conductive cantilever; reference 506 a substrate for supporting the cantilever; reference 508 an electro-optic crystal; reference 510 a transparent electrode; reference 512 an electrode for reflecting a laser beam, connected via the cantilever 504 to the probe 502; reference 514 an electrode for switching; reference 516 an electrode for holder connection; and reference 518 a switch for connecting the electrodes 512 and 516 based on a control signal applied to the electrode 514. Also, reference 520 denotes a holder for holding the probe 500; reference 522 an electrode for connecting a voltage signal from an external variable power source (pulse generator) 530 to the electrode 516; and reference 524 an electrode for connecting a switch control signal to the electrode 514.

According to the constitution, since the probe 502 can be connected to the variable power source 530, it is possible to obtain the relationship between the detection signal (corresponding to the output of the light receiver 24a, 24b in FIG. 2) and the corresponding measured voltage.

Next, the manner of acquiring the relationship between the detection signal and the voltage will be explained with reference to FIGS. 58a, 58b.

Figure 58A:
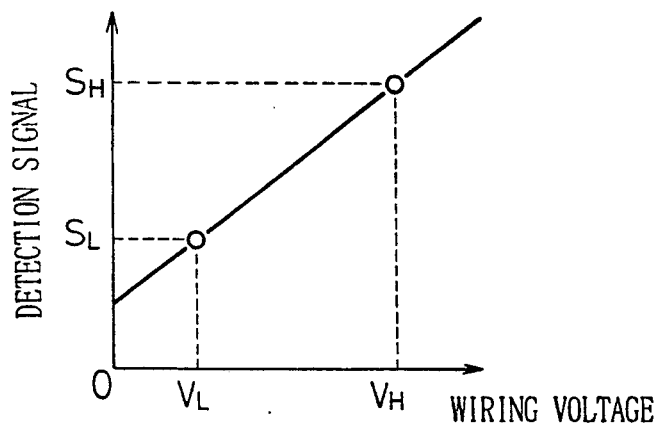
FIGS. 58a and 58b are diagrams for explaining the manner of acquiring the relationship between the detection signal and the voltage by means of the device of FIG. 57.
Figure 58B:
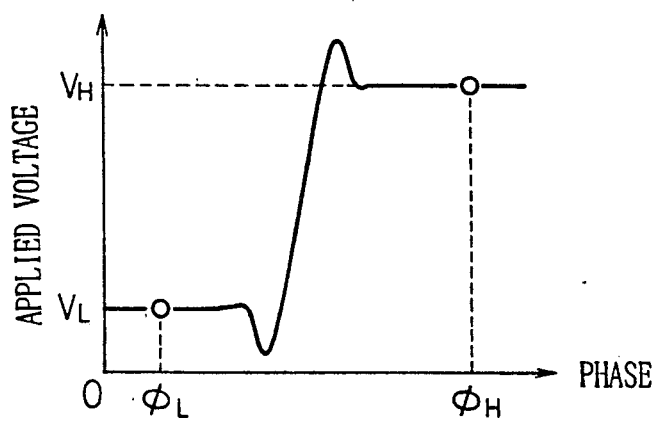

Referring to FIG. 58a, the relationship between the detection signal S and the voltage V is shown by the following linear expression:

$$V = a + b \times S \qquad (1)$$

Note, a, b indicates a constant. By learning the constant a, b in advance, it is possible to immediately learn a wiring voltage from a detection signal obtained when the probe is contacted with the wiring. The above constant is determined by applying two known voltages $V_L$, $V_H$ to the probe electrode (512).

Figure 59A:
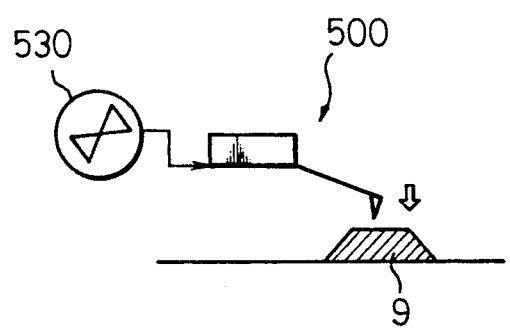
FIGS. 59a and 59b are diagrams for explaining the manner of measuring the circuit characteristics by means of the device of FIG. 57.

Next, the manner of measuring the circuit characteristics of the wiring portion will be explained with reference to FIGS. 59a, 59b.

Figure 59B:
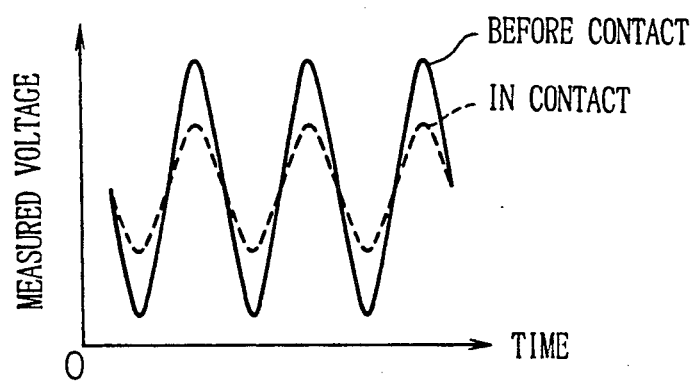

Referring to FIG. 59b, from the difference between a measured voltage value in the contact state and a measured voltage value in the non-contact state, i.e., from the change in the voltage measurement value, it is possible to learn an input impedance of an element connected to the probe contact point, a frequency characteristic, or the like.

Also, it is of course possible to use the present device as a mere feeding probe for feeding an electric signal to the probe electrode.

Figure 60:
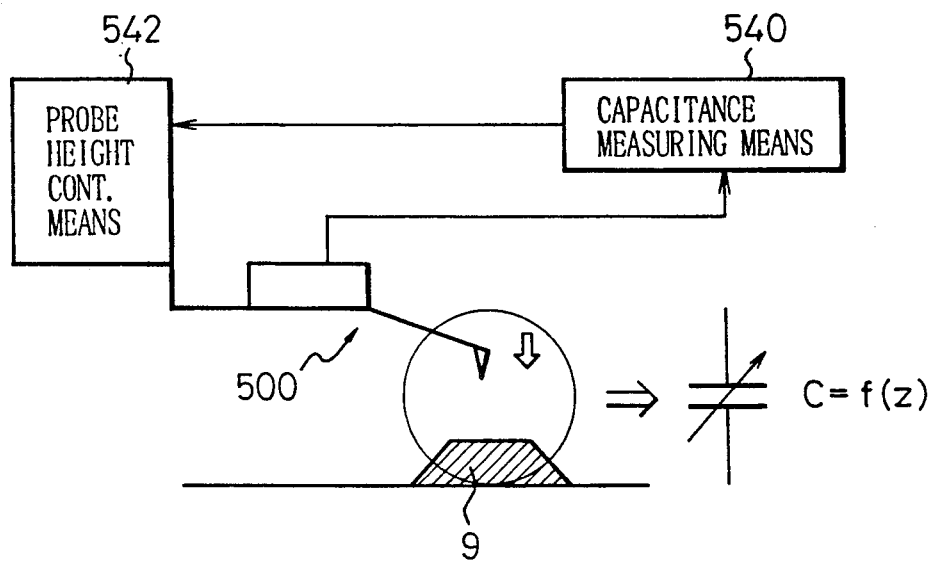
FIG. 60 is a diagram for explaining the manner of controlling the height of the probe by means of the device of FIG. 57.

Next, the manner of controlling the height of the probe will be explained with reference to FIG. 60.

In the illustration, by using a capacitance measuring means 540 and a probe height control means 542 and thus detecting a change in capacitance between the probe and the wiring 9, it is possible to learn a general height of the probe. The capacitance measuring means 540 utilizes, for example, a resonant phenomenon.

Next, the embodiments adapted for observing the shape of the sample surface without damaging the sample will be explained with reference to FIGS. 61 to 65c. Roughly classifying, two kinds of approach are proposed as described below in (a) and (b).

Figure 61:
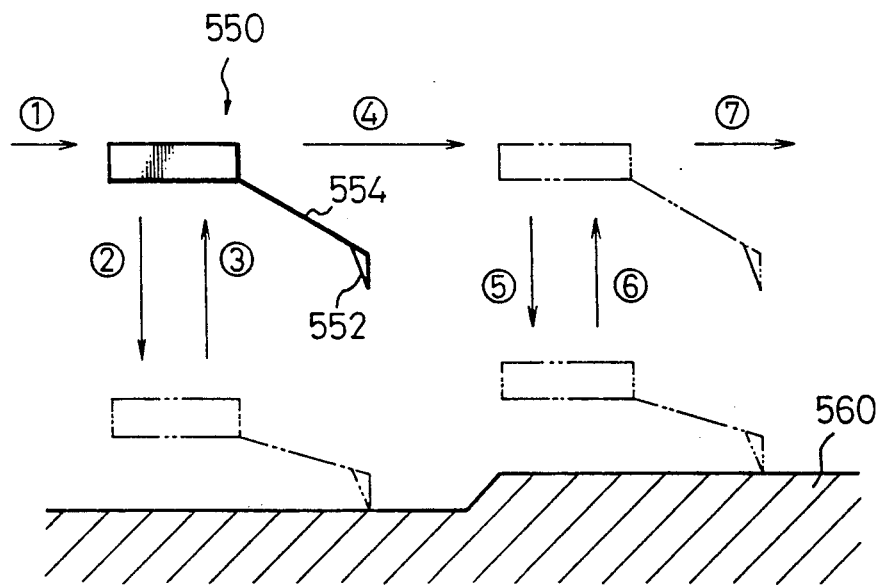
FIG. 61 is an explanatory view of the conception of the probe control adapted for preventing damage of the sample.
Figure 62:
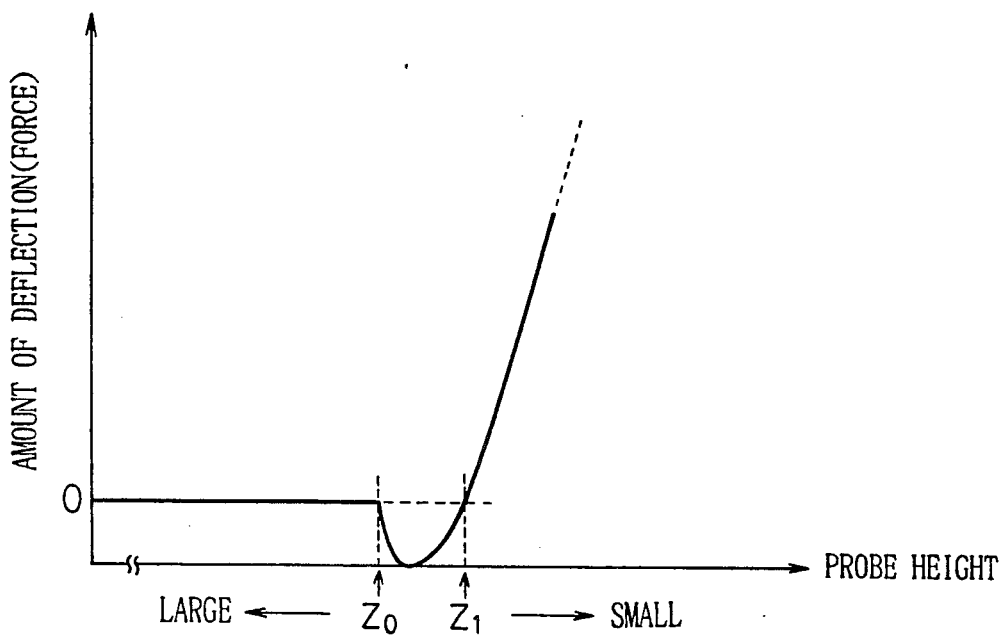
FIG. 62 is a graph showing the relationship between the height of the probe and the amount of the deflection of the cantilever.

(a) One approach is, as shown in FIG. 61, to bring the probe 552 of the scanning type probe device 550 close to the sample 560 from above (②, ⑤ in FIG. 61) and observe the shape of the sample surface at a contact point of the probe 552 with the sample 560. The contact point is defined in FIG. 62 by references $Z_0$, $Z_1$. Namely, by stopping the proximity operation at the contact point, it is possible to prevent damage of the sample.

(b) Another approach is to effect a feedback control with respect to the probe height so that the amount of deflection of the cantilever 554 is kept constant, in the movement of the probe 552 in the horizontal direction (①, ④, ⑦ in FIG. 61). Note, the feedback control is valid only when the probe is moved in the horizontal direction.

Figure 63:
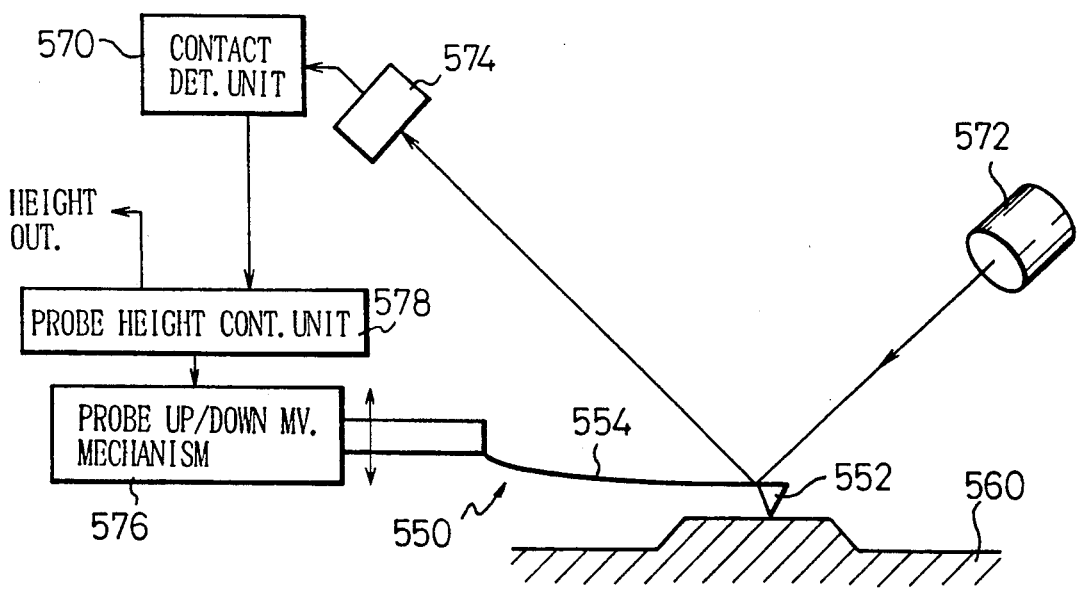
FIG. 63 is a diagram illustrating the constitution of an embodiment for realizing the probe control shown in FIG. 61.

FIG. 63 shows a constitution for realizing the probe control corresponding to the above approach (a).

In the constitution, reference 570 denotes a contact detecting unit which is characteristic of the present embodiment. Also, reference 576 denotes a mechanism for moving the probe in the up/down direction and reference 578 denotes a probe height control unit for controlling the probe up/down moving mechanism 576 based on the output of the contact detecting unit 570.

Figure 64:
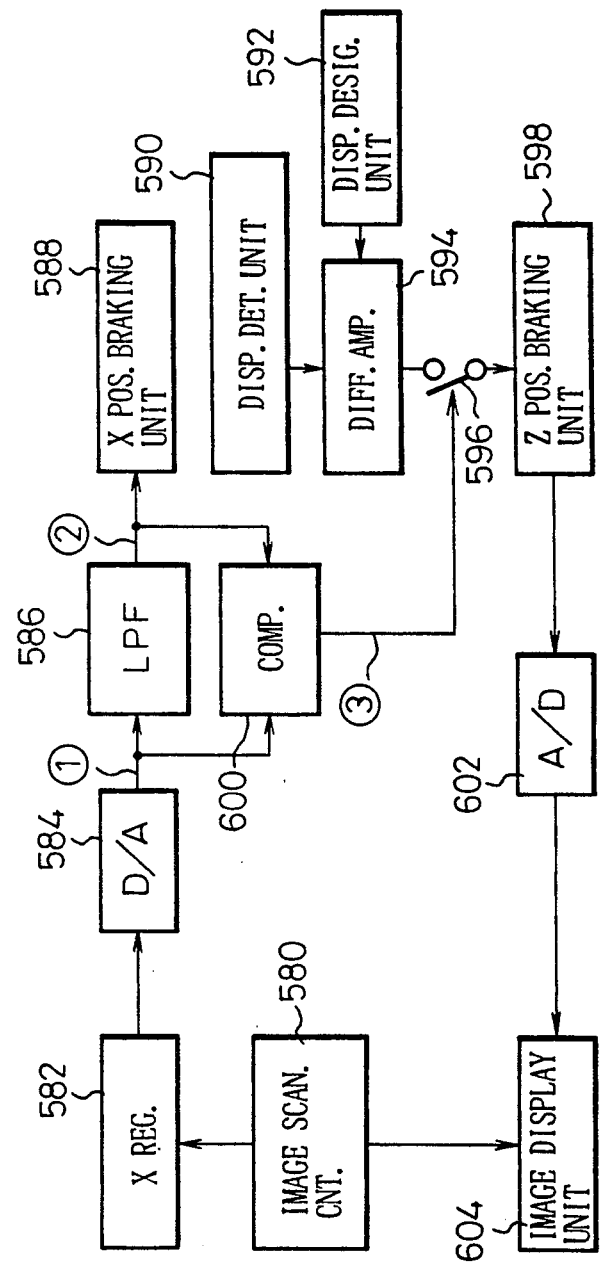
FIG. 64 is a diagram illustrating the constitution of another embodiment for realizing the probe control shown in FIG. 61.
Figure 65A:
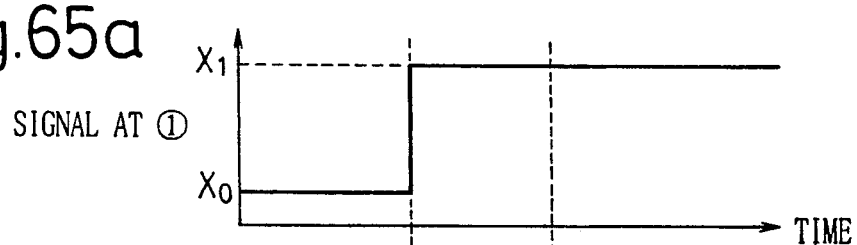
FIGS. 65a to 65c are operational timing charts at each portion in the constitution of FIG. 64.
Figure 65B:
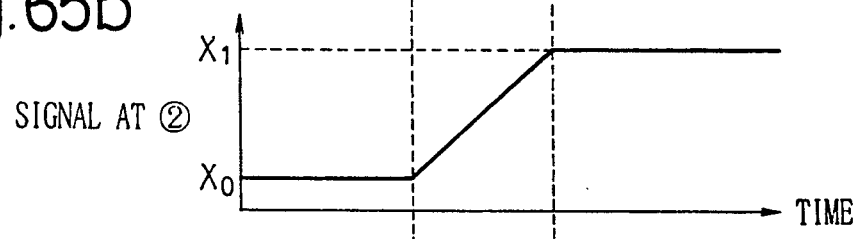
Figure 65C:
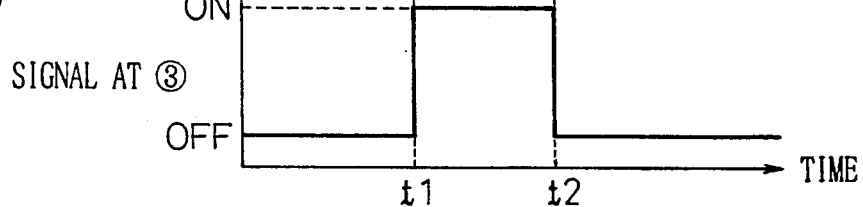

FIG. 64 shows a constitution for realizing the probe control corresponding to the above approach (b), and FIGS. 65a to 65c indicate operational timing charts at each portion in the constitution.

In FIG. 64, reference 580 denotes an image scanning counter; reference 582 an X register; reference 584 a D/A converter; reference 586 a low pass filter (LPF); reference 588 an X position braking unit; reference 590 a displacement detecting unit of the cantilever; reference 592 a displacement designating unit; reference 594 a differential amplifier; reference 596 a switch; reference 598 a Z position braking unit; reference 600 a comparator; reference 602 an A/D converter; and reference 604 an image display unit.

Next, the embodiments adapted for ensuring the electric contact between the wiring and the probe in the voltage measurement will be explained with reference to FIGS. 66a, 66b to 71. The assurance of the electric contact is realized by two means as described below in (1) and (2).

(1) Means for searching a wiring position

Figure 66A:
FIGS. 66a and 66b are diagrams for explaining an example of the means for realizing the wiring position search.
Figure 66B:
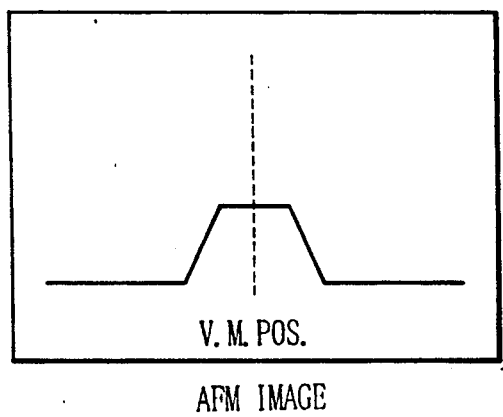
Figure 67A:
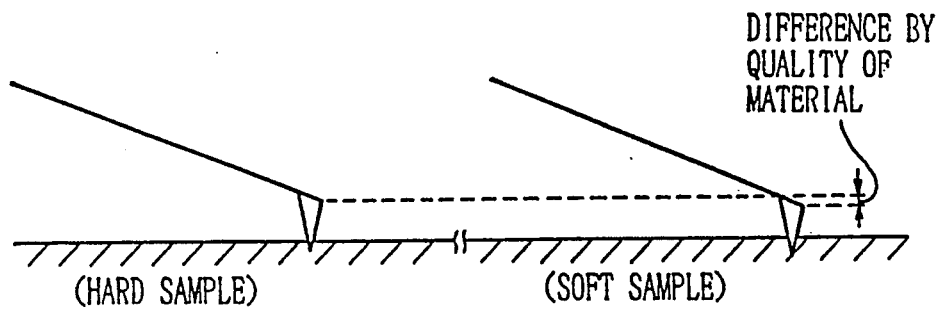
FIGS. 67a to 67c are diagrams for explaining another example of the means for realizing the wiring position search.
Figure 67B:
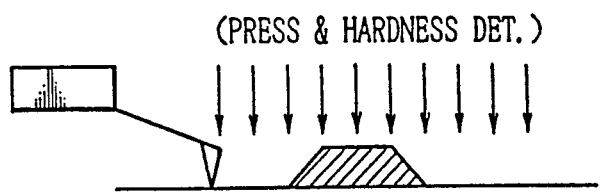
Figure 67C:
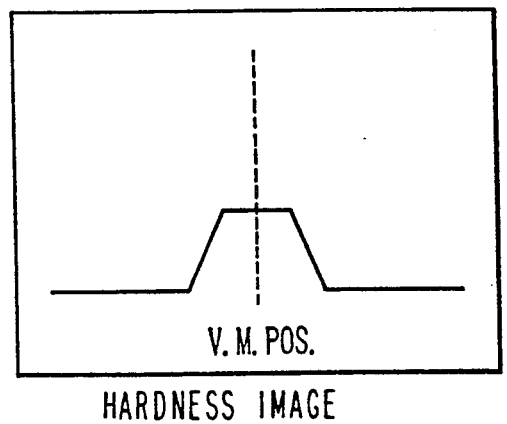

The wiring position is determined from the one- or two-dimensional scanning image of the wiring surface obtained by an AFM function (see FIGS. 66a, 66b).

Also, it is possible to utilize the feature that the hardness of the sample is different depending on the quality of material thereof. In this case, the wiring position is determined from the hardness image obtained when the probe is scanned in the horizontal direction (see FIGS. 67a to 67c).

Figure 68A:
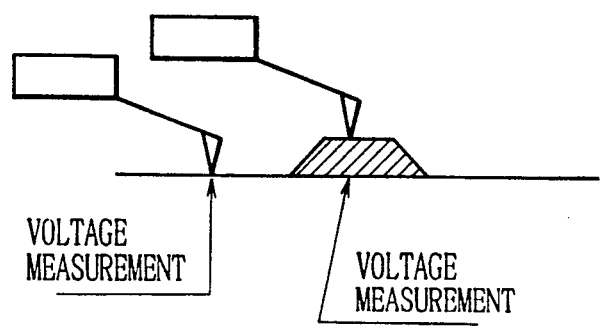
FIGS. 68a and 68b are diagrams for explaining a still another example of the means for realizing the wiring position search.
Figure 68B:
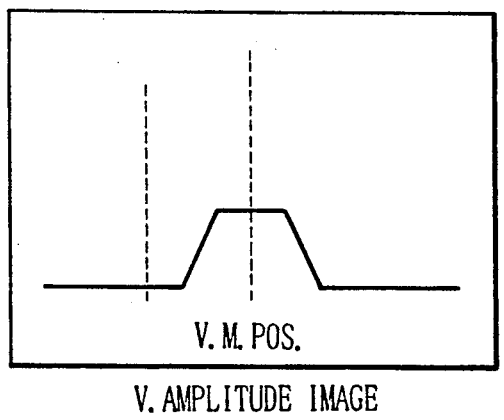

Furthermore, where a certain signal is applied to the wiring, the wiring position is determined from the voltage amplitude image obtained when the probe is scanned in the horizontal direction with the voltage measurement being carried out (see FIGS. 68a, 68b).

(2) Means for ensuring the electric connection between the wiring and the probe.

Figure 69A:
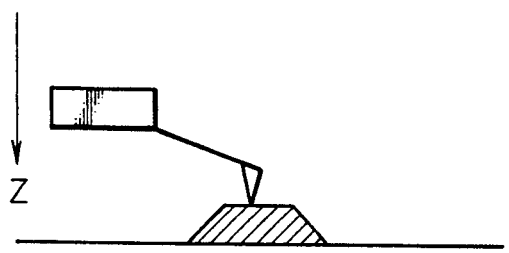
FIGS. 69a and 69b are diagrams for explaining an example of the means for ensuring the electric connection between the wiring and the probe.
Figure 69B:
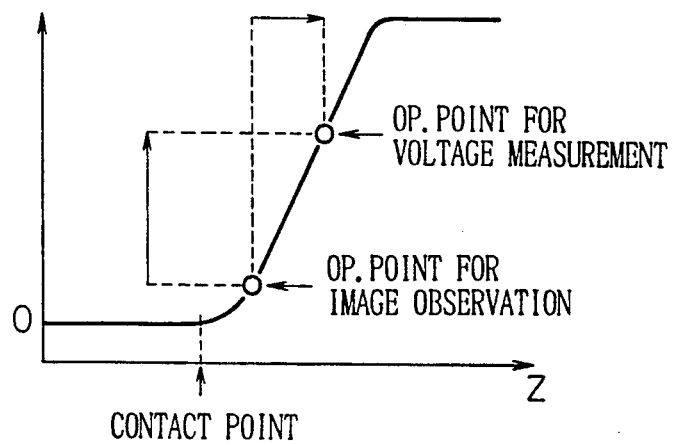

The electric connection is ensured by pressing the probe against the sample by a constant amount based on the wiring height obtained by an AFM function (see FIGS. 69a, 69b).

Figure 70A:
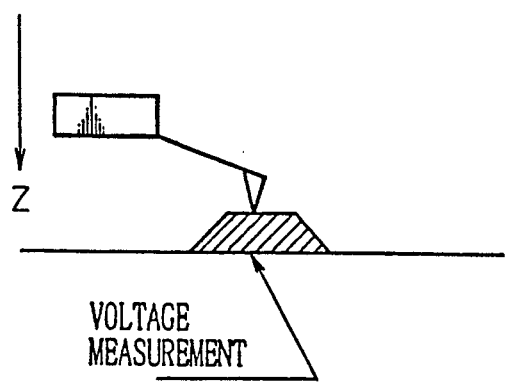
FIGS. 70a and 70b are diagrams for explaining another example of the means for ensuring the electric connection between the wiring and the probe.
Figure 70B:
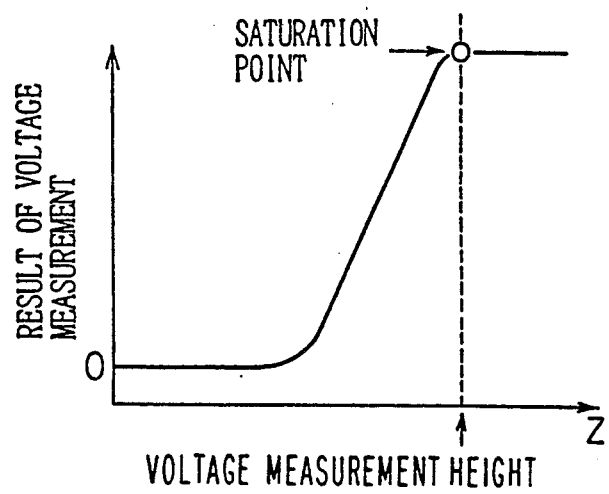

Also, where a certain signal is applied to the wiring, the electric connection is judged from the measurement result obtained when the probe is brought close to the sample with the voltage measurement being carried out (see FIGS. 70a, 70b).

Figure 71:
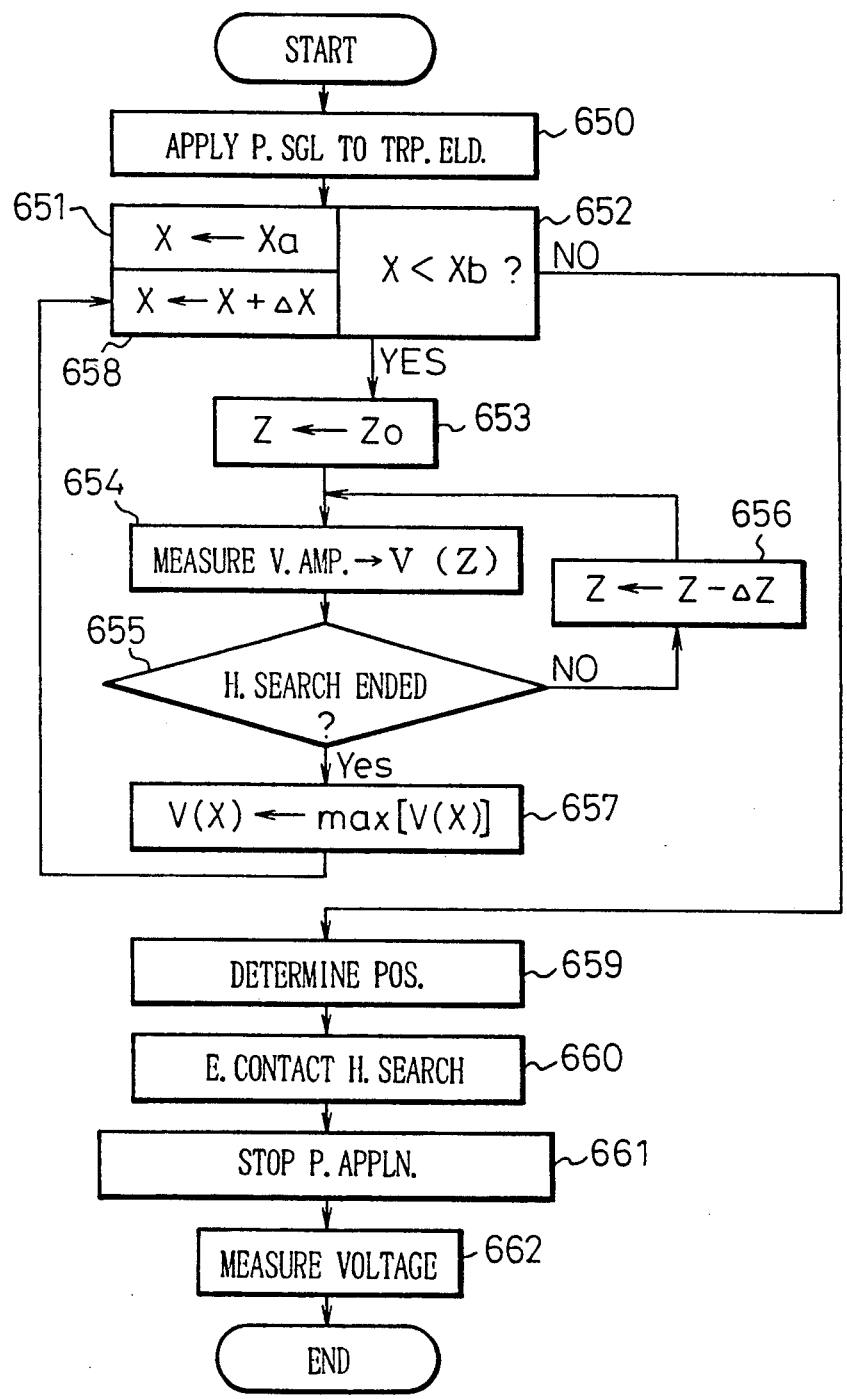
FIG. 71 is a flowchart representing a voltage measurement processing based on the wiring position search and the assurance of the electric connection.

FIG. 71 shows a voltage measurement processing based on the wiring position search and the assurance of the electric connection. In the flowchart of FIG. 71, the voltage measurement is carried out by applying a pulse signal asynchronous with the sample to the transparent electrode, for example, by means of the constitution of FIG. 2.

Figure 72:
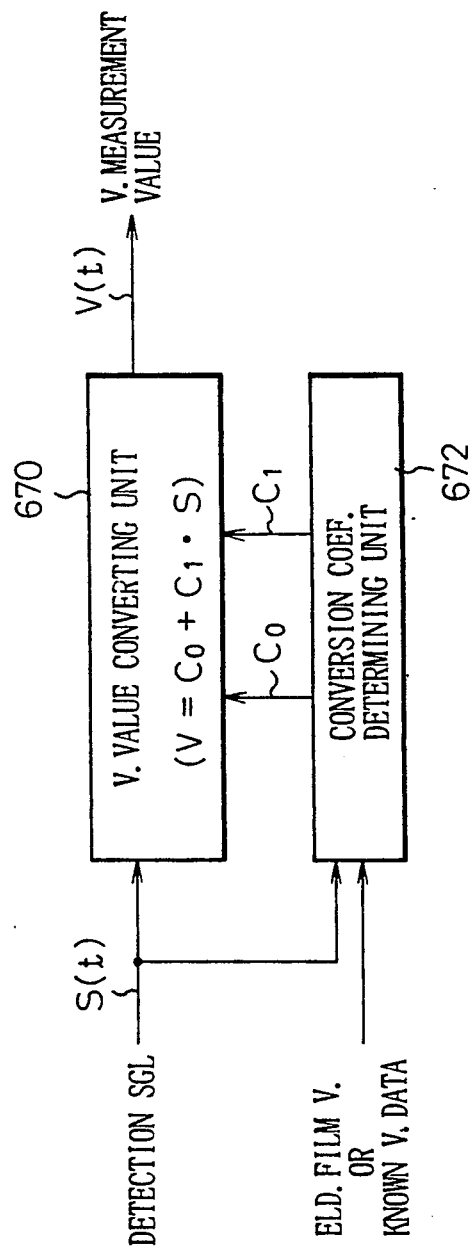
FIG. 72 is a block diagram showing a constitution of the main part of the LSI testing apparatus adapted for high speed of a voltage measurement utilizing an electro-optic effect.

FIG. 72 shows a constitution of the main part of the LSI testing apparatus adapted for high speed of a voltage measurement utilizing an electro-optic effect.

The illustrated constitution is characterized by the determination of a proportional coefficient between the detection signal (corresponding to the output of the light receiver 24a, 24b in FIG. 2) and the corresponding measurement voltage.

The constitution of FIG. 72 is a portion included in the wiring detection/contact control unit 17, the system control unit 18 and the voltage measurement control unit 26 in FIG. 2. In FIG. 72, reference 670 denotes a voltage value converting unit for converting the detection signal, i.e., difference signal S(t) into the measurement voltage V(t), and reference 672 denotes a conversion coefficient determining unit for determining a conversion coefficient (i.e., proportional coefficient $C_0$, $C_1$) based on the detection signal and an electrode film voltage or known voltage data. As the method of determining the conversion coefficient, three approaches are proposed below.

Figure 73:
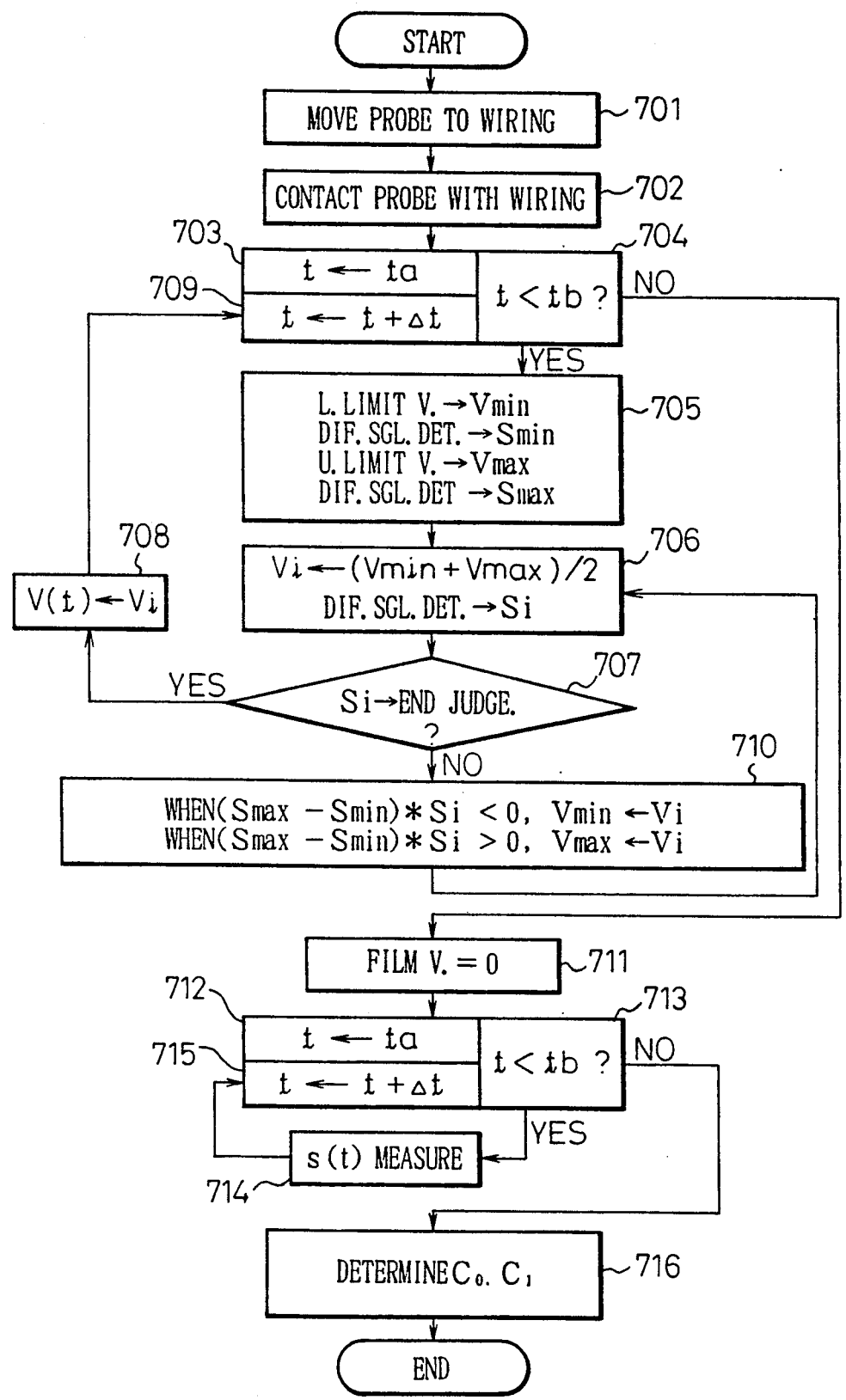
FIG. 73 is a flowchart representing an example of the processing executed by the conversion coefficient determining unit in FIG. 72.
Figure 74:
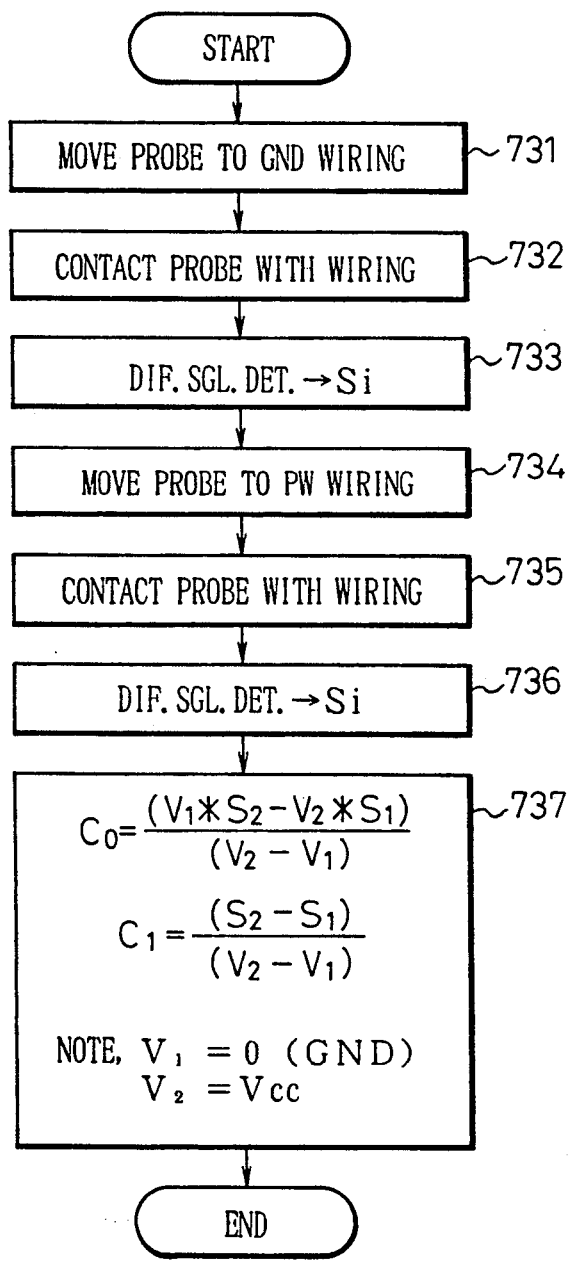
FIG. 74 is a flowchart representing another example of the processing executed by the conversion coefficient determining unit in FIG. 72.
Figure 75:
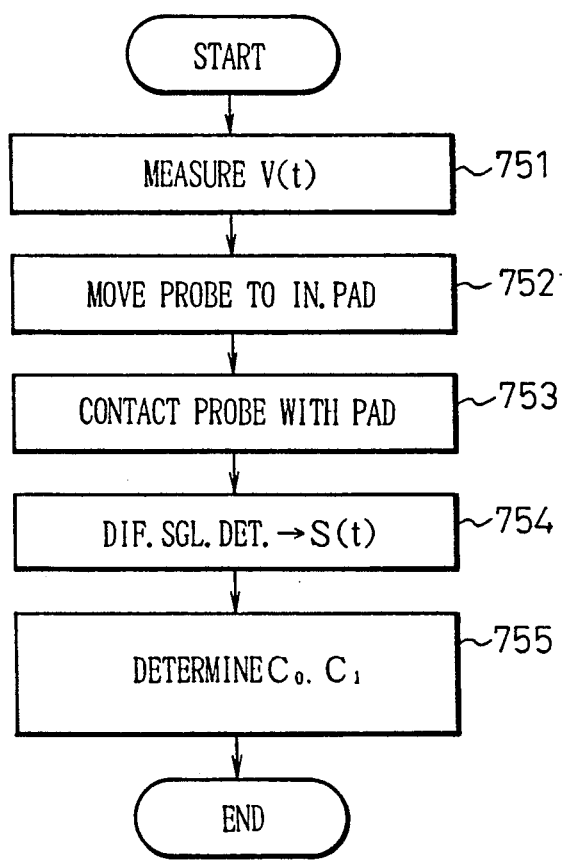
FIG. 75 is a flowchart representing a still another example of the processing executed by the conversion coefficient determining unit in FIG. 72.

One is to utilize a zero method (see FIG. 73), a second is to utilize a power supply line and a ground line (see FIG. 74), and a third is to utilize an input pad (see FIG. 75).

Next, the embodiments adapted for observing the surface of a packaged LSI chip without any trouble in the voltage measurement will be explained with reference to FIGS. 76 to 80.

Figure 76:
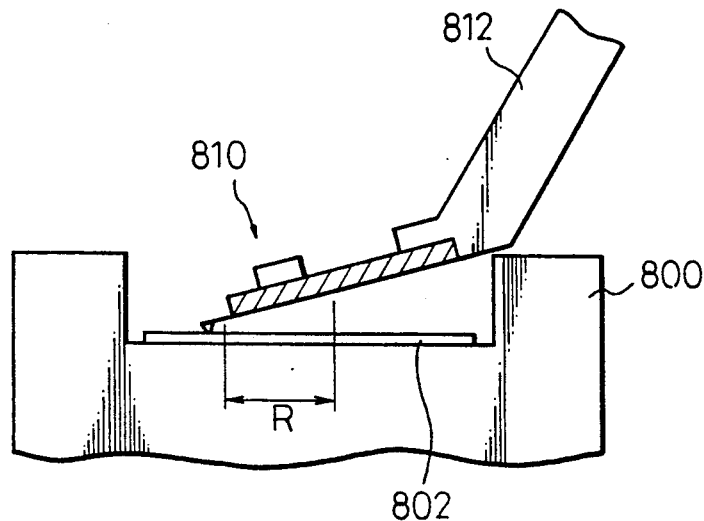
FIG. 76 is a view for explaining the problem in a conventional probing device.

Generally, since a scanning type probe using an electro-optic effect is used with being held by a holder 812, for example, as shown in FIG. 76, there is posed a problem where the surface of an LSI chip 802 accommodated in a package 800 is observed. Namely, a problem occurs in that it is impossible to contact the tip of the probe 810 with the entire surface of the LSI chip 802 and thus the observation region is limited. Reference R denotes a region in which the measurement is impossible.

Figure 77:
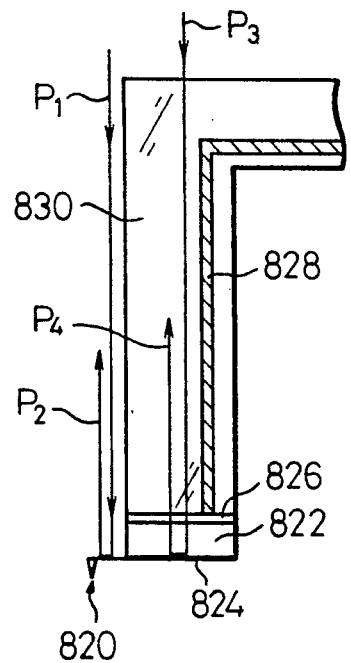
FIG. 77 is a view showing a constitution of the probing device solving the problem in FIG. 76.

The constitution illustrated in FIG. 77 is characterized in that a first substrate 822 formed by electro-optic crystal and supporting a cantilever 820 is provided with a second substrate 830 for light transmission thereon, and that the entire probing device is held by holding the second substrate.

According to the constitution, since the entire probe has a structure elongated upwards, it is possible to easily effect a positioning in the holding, and it is possible to observe the entire surface of the packaged LSI chip.

Figure 78:
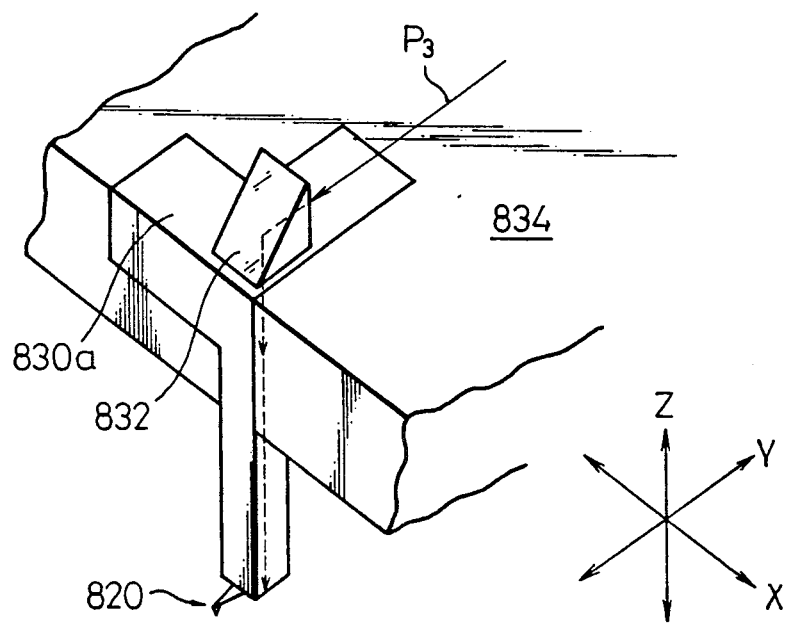
FIG. 78 is a view showing a modification of the probing device of FIG. 77.

FIG. 78 shows a modification of the probing device of FIG. 77. In the illustration, the means for changing the optical path of the laser beam $P_3$ for voltage measurement, e.g., a prism 832 is arranged on the second substrate 830a so that the laser beam $P_3$ is irradiated from the horizontal direction with respect to the probe. This constitution contributes to the realization of a low profile laser optical system. Also, by using a probe holder portion 834, it is possible to hold the probing device more securely.

Figure 79:
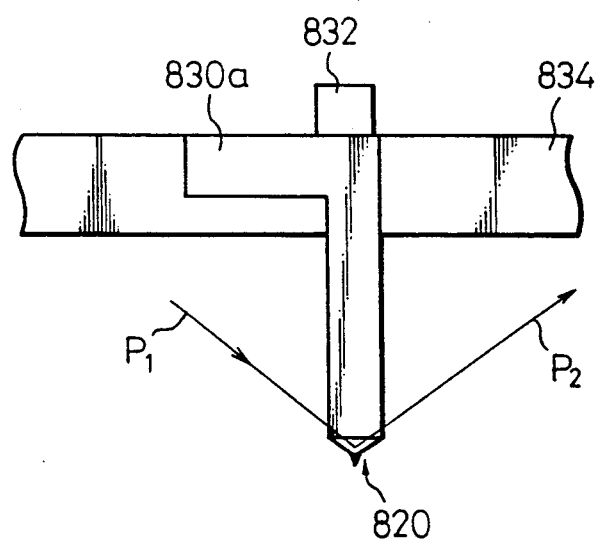
FIG. 79 is a view showing another modification of the probing device of FIG. 77.

FIG. 79 shows another modification of the probing device of FIG. 77. In the illustration, the laser beam $P_1$ for displacement measurement is irradiated on the cantilever 820 from a direction (X direction in FIG. 78) perpendicular to the elongated direction (Y direction in FIG. 78) of the cantilever.

Figure 80:
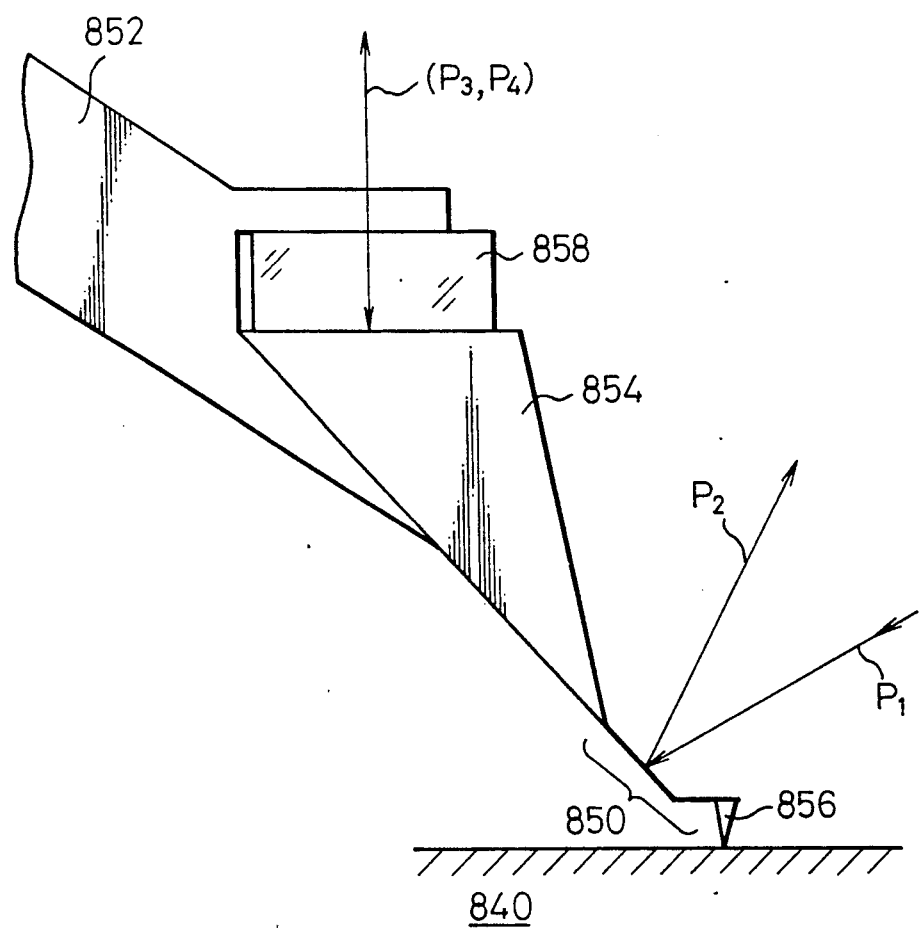
FIG. 80 is a view showing another constitution of the probing device solving the problem in FIG. 76.

The constitution illustrated in FIG. 80 is characterized in that a portion of the cantilever 850 is bent such that it has a convex form relatively to the surface of the sample 840, the another end of the cantilever 850 being fixed to a probing substrate 854 constituting part of the moving member, and respective bottom surfaces of the cantilever 850 and the probing substrate 854 are greatly inclined with respect to the surface of the sample 840 such that the probe 856 is applied substantially perpendicularly to the surface of the sample 840.

According to the constitution, it is possible to observe the entire surface of the LSI chip (sample 840) as well in the example of FIG. 77.

Next, the embodiments adapted for facilitating the sample observation and the wiring search will be explained with reference to FIGS. 81 to 84.

Figure 81:
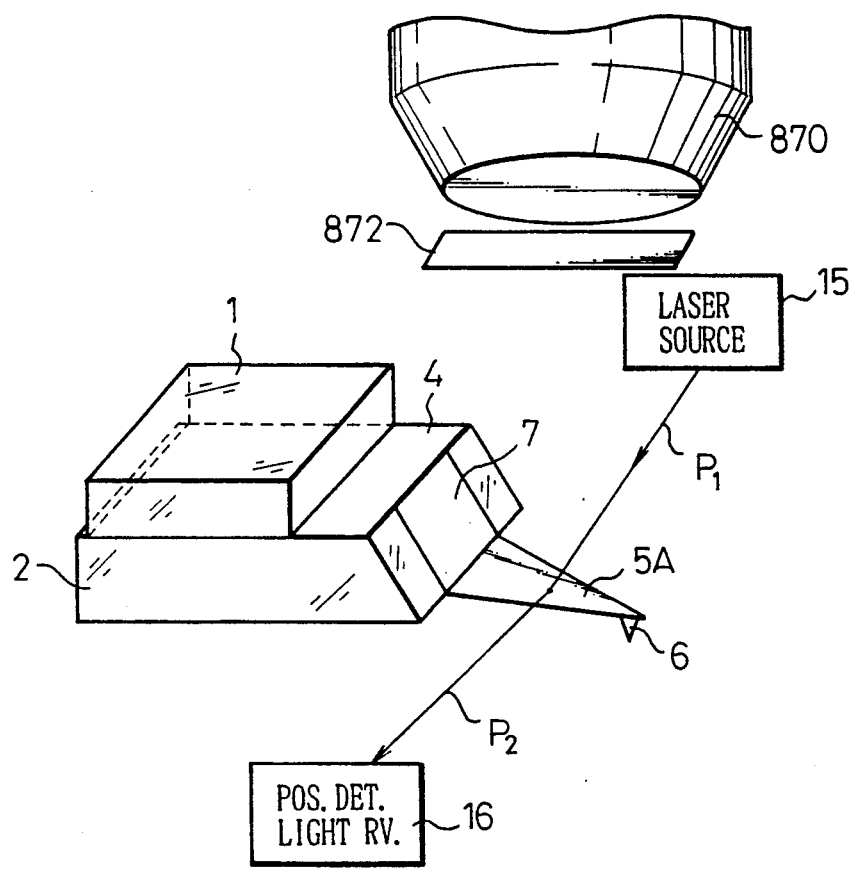
FIG. 81 is a view showing a constitution of the probing device adapted for facilitating the sample observation and the wiring search.

The constitution illustrated in FIG. 81 is characterized in that an optical microscope 870 for observing the surface of the LSI chip is provided, and that a wavelength filter 5A is formed on the surface of the conductive cantilever, which is electrically connected to the minute probe 6 and can be deflected (displaced) by a very small force received at the probe.

Figure 82:
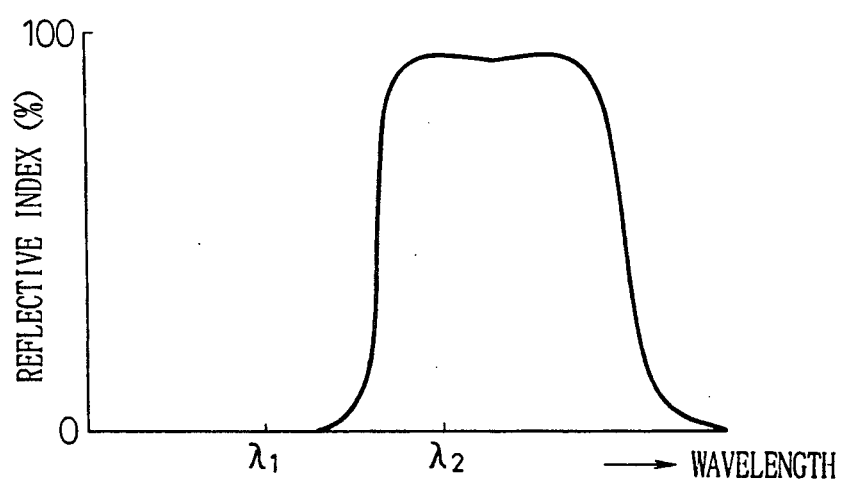
FIG. 82 is a graph showing the relationship between the reflective index of the cantilever in FIG. 81 and the wavelength.

FIG. 82 shows the relation of the reflective index of the cantilever with respect to the wavelength of light. In the illustration, $\lambda_1$ denotes a wavelength of the observation light and $\lambda_2$ denotes a wavelength of the laser beam for displacement measurement.

Figure 83:
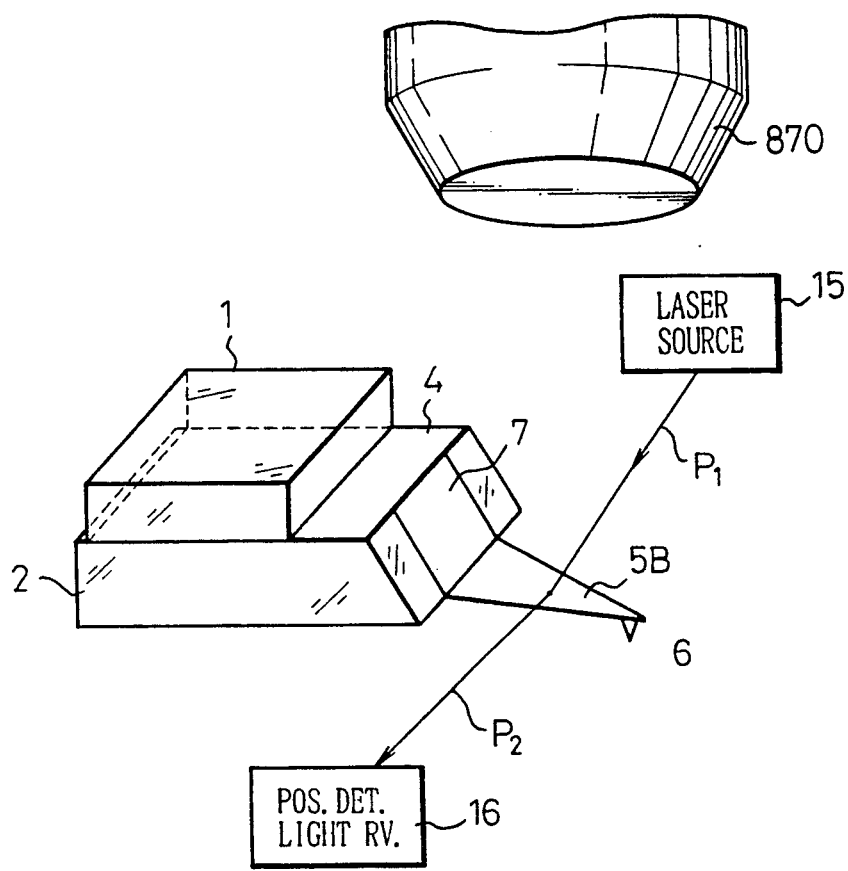
FIG. 83 is a view showing another constitution of the probing device adapted for facilitating the sample observation and the wiring search.

The constitution illustrated in FIG. 83 is characterized in that a transparent conductive cantilever 5B is provided.

Figure 84:
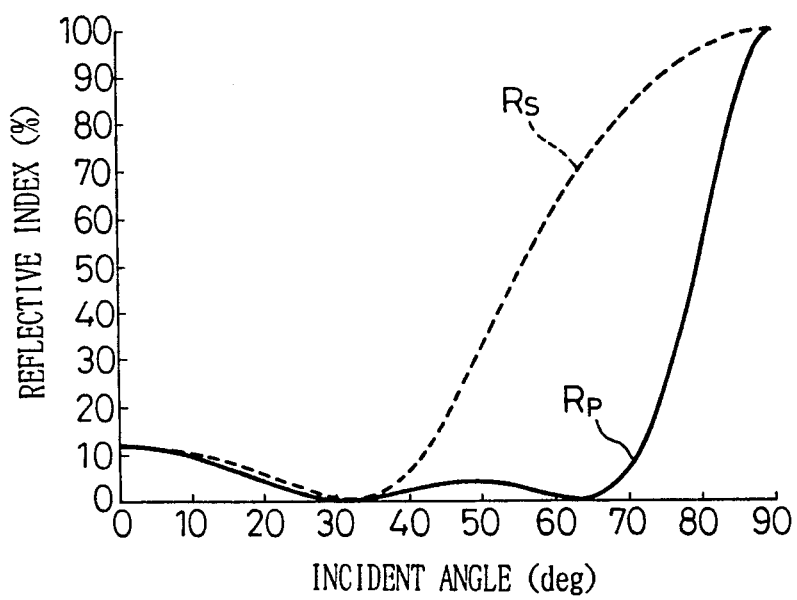
FIG. 84 is a graph showing the relationship between the reflective index of the cantilever in FIG. 83 and the incident angle of the laser beam.

FIG. 84 shows the relation of the reflective index of the cantilever with respect to the incident angle of the laser beam. The illustration indicates characteristics in the case that the cantilever 5B and the minute probe 6 are formed by $Si_3N_4$, that the thickness of the cantilever 5B is 1 μm, and that ITO electrode of 700 Å is formed on the cantilever 5B.

According to the above constitution, it is possible to observe the surface of the LSI chip through the cantilever by means of the optical microscope. As a result, it is possible to easily find out a target region in the surface of the LSI chip.

In the above embodiments effecting a voltage measurement using a conductive minute probe, where the voltage measurement is repeated again and again, a problem occurs in that the probe is subject to abrasion, wear or deformation. Accordingly, it is difficult to specify a chance of the exchange of the probe.

To cope with the disadvantage, two approaches are proposed as described below in (a) and (b).

Figure 85:
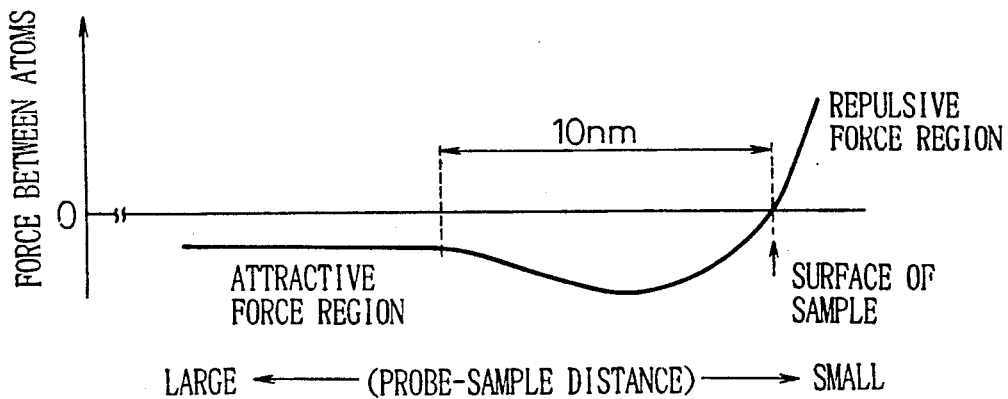
FIG. 85 is an explanatory diagram of the force curve.

(a) One approach is to utilize a graph of a control voltage of a fine-moving mechanism with respect to the interatomic force working between the probe and the sample. The graph is hereinafter referred to as a force curve (see FIG. 85). Where the probe is subject to a considerable wear, an offset occurs in the force curve in its initial state. Accordingly, by detecting the offset amount, it is possible to judge whether the probe is subject to a wear enough to require the exchange thereof.

(b) When the probe is subject to a wear, an offset occurs in the force curve and thus an offset also occurs in the AFM image as a whole. Accordingly, by calculating the average offset amount in the entire image, it is possible to judge whether or not the probe is subject to a wear.

Figure 86:
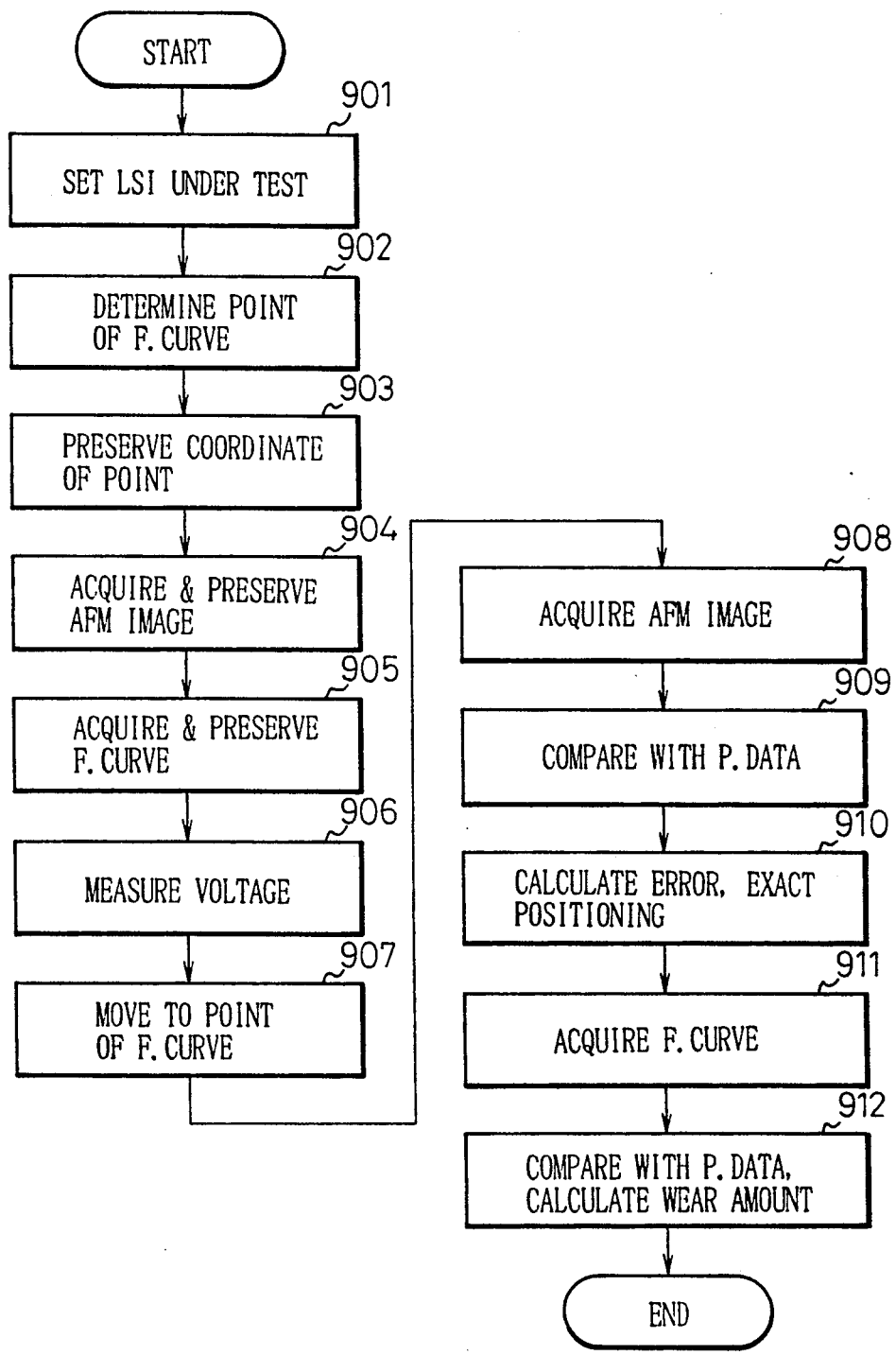
FIG. 86 is a flowchart representing the operation of the LSI testing apparatus adapted for determining a chance of the exchange of the probe.
Figure 87:
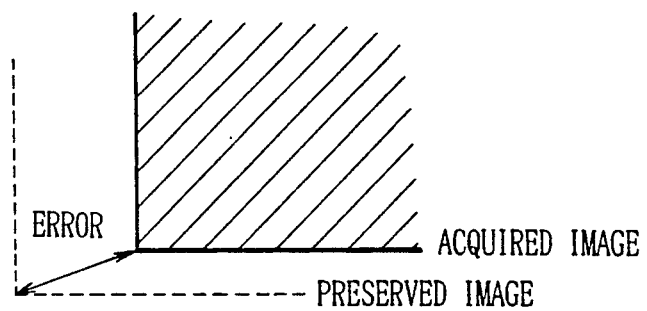
FIG. 87 is a diagram showing the state of the position offset when the probe is moved to the original point.
Figure 88:
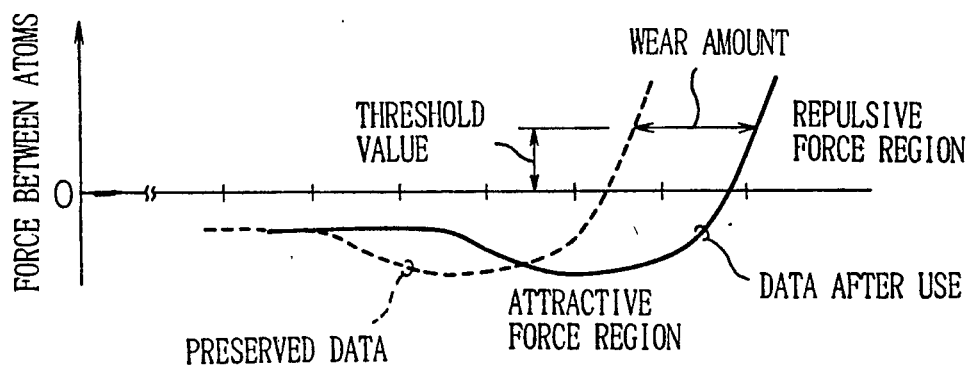
FIG. 88 is an explanatory diagram of the force curve for determining the wear amount of the probe.

FIG. 86 shows an operation sequence based on the above approach (a). The illustrated flowchart is adapted for determining a chance of the exchange of the probe. Also, FIG. 87 shows the state of the position offset when the probe is moved to the original point, and FIG. 88 shows the force curve for determining the wear amount of the probe.

According to the above embodiment, it is possible to judge the lifetime of the probe to thereby learn the chance of the exchange thereof.

Although the present invention has been disclosed and described by way of several embodiments and modifications or applications thereof, it is apparent to those skilled in the art that other embodiments and modifications of the present invention are possible without departing from the spirit or essential features thereof.

We claim:

1. A probing device comprising:
   a minute probe in which at least an end portion is formed by conductive material;
   a cantilever having one end to which the probe is attached, and another end fixed to a moving member movable relatively to a sample in each direction of X, Y and Z;
   means for moving the moving member relatively to the sample;
   a transducing means for generating information of voltage or current by means of light;
   a connecting means having a low electric resistance, for connecting the transducing means and the end portion of the probe;
   a detecting means for detecting a change in a physical amount occurring in the cantilever by a force caused between the probe and the sample by a relative proximity of the moving member to the sample; and
   a voltage measuring means for measuring a voltage at a measurement point on the sample, which is determined based on an output of the detecting means, by way of the transducing means when the probe is contacted with the measurement point.

2. A probing device as set forth in claim 1, wherein the transducing means comprises a crystal capable of inducing an electro-optic effect, and wherein the voltage measuring means utilizes the electro-optic effect induced in the crystal when the probe is contacted with the measurement point on the sample, to thereby measure a voltage at the measurement point.

3. A probing device as set forth in claim 2, wherein the crystal includes a conductive reflection surface electrically connected to the the probe and a transparent conductive film provided in the opposite side of the reflection surface and capable of maintaining a predetermined potential.

4. A probing device as set forth in claim 1, wherein the transducing means comprises a photoconductor film constituting a photoconductive gate portion, a first conductor contacted with a portion of the photoconductor film and connected to the end portion of the probe, and a second conductor contacted with a portion of the photoconductor film, and wherein the voltage measuring means measures a voltage at the measurement point on the sample based on a current led to the second conductor by an electric conduction of the photoconductive gate portion using a light when the probe is contacted with the measurement point.

5. A probing device as set forth in claim 4, wherein the first and second conductors are formed to be opposite to each other on the photoconductor film formed on a substrate.

6. A probing device as set forth in claim 4, wherein the photoconductive gate portion includes a laminating structure in which the first conductor, the photoconductor film and the second conductor are formed in the order thereof, one of the first and second conductors being transparent.

7. A probing device as set forth in claim 1, further comprising means for controlling a displacement of the cantilever to be below a predetermined amount.

8. A probing device as set forth in claim 1, further comprising means for increasing a spring constant of the cantilever when a displacement of the cantilever exceeds a predetermined amount.

9. A probing device as set forth in claim 1, wherein the detecting means comprises means for detecting a displacement caused in the cantilever by the relative proximity of the moving member to the sample.

10. A system for testing an integrated circuit, comprising:
a minute robe in which at least an end portion is formed by conductive material;
a cantilever having one end to which the probe is attached, and another end fixed to a moving member movable relatively to a sample in each direction of X, Y and Z;
means for moving the moving member relatively to the sample;
a transducing means for generating information of voltage or current by means of light;
a connecting means having a low electric resistance, for connecting the transducing means and the end portion of the probe;
a detecting means for detecting a change in a physical amount occurring in the cantilever by a force caused between the probe and the sample by a relative proximity of the moving member to the sample;
a voltage measuring means for measuring a voltage at a measurement point on the sample, which is determined based on an output of the detecting means, by way of the transducing means when the probe is contacted with the measurement point; and
means for controlling a height of the probe relative to the sample to be constantly maintained when the probe is moved relatively to the sample in a horizontal direction.

11. A system for testing an integrated circuit, comprising:
a probing device including a minute probe in which at least an end portion is formed by conductive material, a cantilever having one end to which the probe is attached, and another end fixed to a moving member movable relatively to a sample in each direction of X, Y and Z, a moving means for moving the moving member relatively to the sample, a transducing means for generating information of voltage or current by means of light, a connecting means having a low electric resistance, for connecting the transducing means and the end portion of the probe, a detecting means for detecting a change in a physical amount occurring in the cantilever by a force caused between the probe and the sample by a relative proximity of the moving member to the sample, and a voltage measuring means for measuring a voltage at a measurement point on the sample, which is determined based on an output of the detecting means, by way of the transducing means when the probe is contacted with the measurement point;
a monitor means for observing a portion near a wiring to be measured in the integrated circuit;
a stage means provided movably relative to the integrated circuit which is the sample, for mounting the probing device and the monitor means thereon; and
means for controlling the moving means and the stage means.

12. A system as set forth in claim 11, further comprising:
means for taking a first image from the monitor means and displaying the same;
means for taking the output of the detecting means as a second image and displaying the same as an at least one-dimensional image;
a control means for using the first image to position the probe of the probing device near the wiring to be measured in the integrated circuit; and
a control means for using the second image to position the probe of the probing device above the wiring to be measured in the integrated circuit, and using the moving means to electrically contact the probe of the probing device with the wiring to be measured.

13. A system as set forth in claim 12, further comprising:
means for taking a first image data as a digital data from the monitor means into an image memory and displaying the same;
means for taking the output of the detecting means as a second image data and displaying the same;
a control computer provided with the means for controlling the moving means and the stage means;
a design data base in which information on a mask figure of the integrated circuit is stored; and
means for storing alignment information for use in a determination of stage coordinates for displaying wiring patterns, which are designated by a coordinate system of the mask figure and coordinates of mask figures in the control computer, in the first or second image, wherein
the monitor means or the probing device is moved to a designated point on the design data base, and design information such as masks corresponding to a portion displayed in the first or second image is displayed.

14. A system as set forth in claim 13, further comprising means for effecting a pattern matching between the mask figure and the first or second image to thereby compensate the alignment, wherein the probe of the probing device is moved to above the designated wiring based on information of the compensated alignment.

15. A system as set forth in claim 13, further comprising means for acquiring information concerning material of the wiring to be measured, from the design data base, and, according to the kind of the material, determining a contact pressure of the probe of the probing device relative to the wiring to be measured.

16. A system as set forth in claim 15, further comprising:
means for judging whether a measurement of a contact pressure has been carried out in the past at a portion made of the same material as that of the wiring to be measured;
means for, where the measurement of a contact pressure has been already carried out in the past, contacting the probe of the probing device with the wiring to be measured, with the contact pressure based on the measurement; and
means for, where the measurement of a contact pressure has not been carried out in the past, setting a pressure with which the probe is contacted with the wiring to be measured, to such a minimum value that no DC drift appears in a measurement voltage of the wiring.

17. A system as set forth in claim 11, wherein the transducing means of the probing device comprises an electro-optic crystal capable of inducing an electro-optic effect, the system further comprising means for utilizing an electrostatic gravitation caused by a predetermined voltage applied to another electro-optic crystal, and thereby holding a probing portion including the probe, the cantilever, the electro-optic crystal and the connecting means of the probing device.

18. A system as set forth in claim 11, further comprising means for attachably and detachably holding at least a portion of a probing portion including the probe, the cantilever, the transducing means and the connecting means of the probing device.

19. A system as set forth in claim 11, further comprising a laser source attached to the monitor means so as to share an optical system with the monitor means, for making an opening in an insulation film in the integrated circuit.

20. A system for testing an integrated circuit, comprising:
a probing device including a minute probe in which at least an end portion is formed by conductive material, a cantilever having one end to which the probe is attached, and another end fixed to a moving member movable relatively to a sample in each direction of X, Y and Z, means for moving the moving member relatively to the sample, a transducing means for generating information of voltage or current by means of light, a connecting means having a low electric resistance, for connecting the transducing means and the end portion of the probe, a detecting means for detecting a change in a physical amount occurring in the cantilever by a force caused between the probe and the sample by a relative proximity of the moving member to the sample, and a voltage measuring means for measuring a voltage at a measurement point on the sample, which is determined based on an output of the detecting means, by way of the transducing means when the probe is contacted with the measurement point;
a monitor means for observing a portion near a wiring to be measured in the integrated circuit; and
a stage means provided movably relative to the integrated circuit, for mounting the probing device and the monitor means thereon,
the stage means including an opening portion for enabling the observation by the monitor means and the probing by the probing device, and at least one of a stage for mounting the monitor means and a stage for mounting the probing device.

21. A system as set forth in claim 20, further comprising a vibration-removing base for mounting the stage means, wherein the stage means comprises a table rotatable with respect to a Z-direction axis.

22. A system as set forth in claim 21, wherein the stage means is movable relatively to the vibration-removing base in a horizontal direction of X and Y.

23. A system as set forth in claim 21, wherein the stage means comprises a stage mounting the integrated circuit and movable in each direction of X, Y and Z.

24. A system as set forth in claim 20, further comprising means for bringing the monitor means to a position at which the monitor means has no interference with the probing device, except when the integrated circuit is observed.

25. A system as set forth in claim 20, further comprising means for bringing the probing device to a position at which the probing device has no interference with the monitor means, when the integrated circuit is observed.

26. A system as set forth in claim 20, wherein the detecting means comprises a displacement detecting system for detecting a displacement caused in the cantilever, and a probing portion including the probe, the cantilever, the transducing means and the connecting means of the probing device is arranged together with the displacement detecting system on an identical stage.

27. A system as set forth in claim 21, further comprising means for fixing a location of the integrated circuit relative to the vibration-removing base.

28. A system as set forth in claim 27, wherein the fixing means comprises a clamp for holding a package of the integrated circuit relatively to the vibration-removing base.

29. A system as set forth in claim 27, wherein the fixing means comprises means for attracting thereto or pressing thereagainst a package of the integrated circuit to thereby fix the package relatively to the vibration-removing base.

30. A system as set forth in claim 21, further comprising an integrated circuit tester for driving and testing the integrated circuit and a clamping means for holding a test head of the integrated circuit tester relatively to the vibration-removing base.

31. A system as set forth in claim 21, further comprising an integrated circuit tester for driving and testing the integrated circuit, a socket fixed to the vibration-removing base and mounting the integrated circuit, and a flexible signal wiring for connecting the socket to a test head of the integrated circuit tester.

32. A system for testing an integrated circuit comprising:

a probing device including a minute probe in which at least an end portion is formed by conductive material, a cantilever having one end to which the probe is attached, and another end fixed to a moving member movable relatively to a sample in each direction of X, Y and Z, means for moving the moving member relatively to the sample, a transducing means for generating information of voltage or current by means of light, a connecting means having a low electric resistance, for connecting the transducing means and the end portion of the probe, a detecting means for detecting a change in a physical amount occurring in the cantilever by a force caused between the probe and the sample by a relative proximity of the moving member to the sample, and a voltage measuring means for measuring a voltage at a measurement point on the sample, which is determined based on an output of the detecting means, by way of the transducing means when the probe is contacted with the measurement point;

a stage means serving as a first coarse-moving means provided to surround the integrated circuit, on a frame fixed to a station part of a testing apparatus for driving the integrated circuit which is the sample and effecting an external test of the integrated circuit;

a turning stage provided in the center of a moving table of the stage means, for mounting the probing device thereon; and a monitor means having a second coarse-moving means, for observing the integrated circuit.

33. A system as set forth in claim 32, wherein the second coarse-moving means is shared with the stage means serving as the first coarse-moving means.

34. A system as set forth in claim 33, further comprising a frame for mounting the monitor means, wherein the monitor means comprises means movable relatively to the frame in each direction of X, Y and Z in a relatively narrow range.

35. A system as set forth in claim 32, further comprising a frame for exclusive use of the monitor means, provided separately from the stage means serving as the first coarse-moving means.

36. A system as set forth in claim 35, wherein the stage serving as the second coarse-moving means has two control modes, one being a mode in which each movement direction of X, Y and Z of the second coarse-moving stage is controlled to be in synchronization with that of the first coarse-moving stage, the other being a mode in which the second coarse-moving stage is controlled independently of the first coarse-moving stage.

37. A system as set forth in claim 32, wherein the moving means of the probing device comprises a horizontal direction moving means formed by a single table having an opening portion, and a probing portion and a voltage sensor portion of the probing device are mounted on a supporting portion projecting from a frame portion in the periphery of the opening portion toward the center of the opening portion.

38. A system for testing an integrated circuit, comprising:

a probing device including a minute probe in which at least an end portion is formed by conductive material, a cantilever having one end to which the probe is attached, and another end fixed to a moving member movable relatively to a sample in each direction of X, Y and Z, means for moving the moving member relatively to the sample, a transducing means for generating information of voltage or current by means of light, a connecting means having a low electric resistance, for connecting the transducing means and the end portion of the probe, a detecting means for detecting a change in a physical amount occurring in the cantilever by a force caused between the probe and the sample by a relative proximity of the moving member to the sample, and a voltage measuring means for measuring a voltage at a measurement point on the sample, which is determined based on an output of the detecting means, by way of the transducing means when the probe is contacted with the measurement point;

a coarse-moving stage provided on a frame having a vibration-removing means for removing vibration from a floor;

an integrated circuit mounting base provided fixedly on the coarse-moving stage, mounting the integrated circuit thereon and provided with means for feeding a drive signal to the integrated circuit;

a probing frame provided to surround the integrated circuit mounting base and the coarse-moving stage on the frame having the vibration-removing means;

a turning stage provided in the center of a table of the probing frame, for mounting the probing device thereon;

a monitor means provided with means movable in a Z direction, for observing the integrated circuit; and a frame for mounting the monitor means thereon, provided to surround the probing frame and separately from the probing frame.

39. A system for testing an integrated circuit, comprising:

a probing device including a minute probe in which at least an end portion is formed by conductive material, a cantilever having one end to which the probe is attached, and another end fixed to a moving member movable relatively to a sample in each direction of X, Y and Z, means for moving the moving member relatively to the sample, a transducing means for generating information of voltage or current by means of light, a connecting means having a low electric resistance, for connecting the transducing means and the end portion of the probe, a detecting means for detecting a change in a physical amount occurring in the cantilever by a force caused between the probe and the sample by a relative proximity of the moving member to the sample, and a voltage measuring means for measuring a voltage at a measurement point on the sample, which is determined based on an output of the detecting means, by way of the transducing means when the probe is contacted with the measurement point, wherein the detecting means includes a first optical system and the voltage measuring means includes a second optical system, the first and second optical systems being arranged such that respective optical paths of laser beams are present within a predetermined range of height above the position of the minute probe attached to the one end of the cantilever.

40. A system as set forth in claim 39, further comprising means for regulating an irradiation direction of the laser beam in the first optical system to thereby increase an incident angle of the laser beam to a reflection surface of the cantilever.

41. A system as set forth in claim 39, wherein the first optical system is constituted to have an optical path which is substantially parallel to a supporting portion in a probing portion of the probing device and in which the laser beam is sequentially reflected on a reflection surface provided in the front side of the probing portion, a reflection surface of the cantilever, an end surface of a substrate of the probing portion, and the reflection surface provided in the front side, and finally returned to the direction of the supporting portion in the probing portion.

42. A system as set forth in claim 39, wherein the transducing means of the probing device comprises an electro-optic crystal capable of inducing an electro-optic effect, and wherein the first and second optical systems are constituted such that the respective optical paths of laser beams incident thereon are substantially parallel to each other and the respective laser beams are irradiated on the cantilever and a voltage sensor portion including the electro-optic crystal, respectively, by means of a reflecting means, and the respective reflected beams are propagated inversely to the respective incident optical paths.

43. A system as set forth in claim 39, wherein the transducing means of the probing device comprises an electro-optic crystal capable of inducing an electro-optic effect, and wherein the laser optical system for voltage measurement is constituted such that the laser beam is irradiated on the side or top surface of a probing portion including the probe, the cantilever, the electro-optic crystal and the connecting means of the probing device, and the laser beam modulated in the electro-optic crystal is transmitted through or reflected on the side or top surface of the probing portion.

44. A probing device as set forth in claim 1, further comprising an electrode connected to the probe, the electrode being provided on a substrate of the cantilever and connected via a switching means to an external voltage control means.

45. A system for testing an integrated circuit, comprising:
a minute probe in which at least an end portion is formed by conductive material;
a cantilever having one end to which the probe is attached, and another end fixed to a moving member movable relatively to a sample in each direction of X, Y and Z;
means for moving the moving member relatively to the sample;
a transducing means for generating information of voltage or current by means of light;
a connecting means having a low electric resistance, for connecting the transducing means and the end portion of the probe;
a detecting means for detecting a change in a physical amount occurring in the cantilever by a force caused between the probe and the sample by a relative proximity of the moving member to the sample;
a voltage measuring means for measuring a voltage at a measurement point on the sample, which is determined based on an output of the detecting means, by way of the transducing means when the probe is contacted with the measurement point;
means for searching a detailed position of the measurement point on the sample; and
means for ensuring an electric connection between the measurement point on the sample and the minute probe.

46. A system for testing an integrated circuit, comprising:
a minute probe in which at least an end portion is formed by conductive material;
a cantilever having one end to which the probe is attached, and another end fixed to a moving member movable relatively to a sample in each direction of X, Y and Z;
a transducing means for generating information of voltage or current by means of light;
a connecting means having a low electric resistance, for connecting the transducing means and the end portion of the probe;
a detecting means for detecting a change in a physical amount occurring in the cantilever by a force caused between the probe and the sample by a relative proximity of the moving member to the sample;
a voltage measuring means for measuring a voltage at a measurement point on the sample, which is determined based on an output of the detecting means, by way of the transducing means when the probe is contacted with the measurement point;
means for determining a relationship between an output of the transducing means obtained when a known voltage is applied to an electrode connected to the probe, and the known voltage; and
means for converting the output of the transducing means into a corresponding voltage value by means of the determined relationship.

47. A system as set forth in claim 46, further comprising:
means for applying a predetermined voltage to an electrode connected to the transducing means and different from the electrode connected to the probe, to thereby keep the output of the transducing means to a constant value;
means for measuring a voltage applied to the electrode connected to the probe, based on the predetermined voltage; and
means for determining a relationship between the measured voltage and the output of the transducing means.

48. A probing device comprising:
a minute probe in which at least an end portion is formed by conductive material;
a cantilever having one end to which the probe is attached, and another end fixed to a moving member movable relatively to a sample in each direction of X, Y and Z;
a transducing means for generating information of voltage or current by means of light;
a connecting means having a low electric resistance, for connecting the transducing means and the end portion of the probe;
a detecting means for detecting a change in a physical amount occurring in the cantilever by a force caused between the probe and the sample by a relative proximity of the moving member to the sample; and
a voltage measuring means for measuring a voltage at a measurement point on the sample, which is determined based on an output of the detecting means, by way of the transducing means when the probe is contacted with the measurement point, wherein a first substrate including the moving member and the transducing means is provided with a second substrate for light transmission thereon, and the entire probing device is held by holding the second substrate.

49. A probing device comprising:
a minute probe in which at least an end portion is formed by conductive material;
a cantilever having one end to which the probe is attached, and another end fixed to a moving member movable relatively to a sample in each direction of X, Y and Z;
a transducing means for generating information of voltage or current by means of light;
a connecting means having a low electric resistance, for connecting the transducing means and the end portion of the probe;
a detecting means for detecting a change in a physical amount occurring in the cantilever by a force caused between the probe and the sample by a relative proximity of the moving member to the sample; and
a voltage measuring means for measuring a voltage at a measurement point on the sample, which is determined based on an output of the detecting means, by way of the transducing means when the probe is contacted with the measurement point, wherein
a portion of the cantilever is bent such that it has a convex form relatively to a surface of the sample, the another end of the cantilever being fixed to a probing substrate constituting part of the moving member, and respective bottom surfaces of the cantilever and the probing substrate are greatly inclined with respect to the surface of the sample such that the probe is applied substantially perpendicularly to the surface of the sample.

50. A system for testing an integrated circuit, comprising:
a minute probe in which at least an end portion is formed by conductive material;
a cantilever having one end to which the probe is attached, and another end fixed to a moving member movable relatively to a sample in each direction of X, Y and Z;
a transducing means for generating information of voltage or current by means of light;
a connecting means having a low electric resistance, for connecting the transducing means and the end portion of the probe;
means for measuring a displacement caused in the cantilever by a relative proximity of the moving member to the sample, by means of light;
a voltage measuring means for measuring a voltage at a measurement point on the sample, which is determined based on the measured displacement, by way of the transducing means when the probe is contacted with the measurement point; and
a monitor means for observing the surface of the sample, wherein
the cantilever has such a characteristic that it transmits therethrough most of or all of the observation light in the monitor means and reflects thereon part of or all of the laser light for displacement measurement.

51. A system for testing an integrated circuit, comprising:
a minute probe in which at least an end portion is formed by conductive material;
a cantilever having one end to which the probe is attached, and another end fixed to a moving member movable relatively to a sample in each direction of X, Y and Z;
a transducing means for generating information of voltage or current by means of light;
a connecting means having a low electric resistance, for connecting the transducing means and the end portion of the probe;
means for measuring a displacement caused in the cantilever by a relative proximity of the moving member to the sample, by means of light;
a voltage measuring means for measuring a voltage at a measurement point on the sample, which is determined based on the measured displacement, by way of the transducing means when the probe is contacted with the measurement point; and
means for determining a wear amount of the probe by utilizing a change in a control voltage of a fine-moving mechanism required for applying a constant very small displacement to the cantilever.

* * * * *